United States Patent [19]

Rostoker et al.

[11] Patent Number: 5,801,432

[45] Date of Patent: *Sep. 1, 1998

[54] ELECTRONIC SYSTEM USING MULTI-LAYER TAB TAPE SEMICONDUCTOR DEVICE HAVING DISTINCT SIGNAL, POWER AND GROUND PLANES

[75] Inventors: Michael D. Rostoker, Boulder Creek; Kurt Raymond Raab, San Jose; John McCormick, Redwood City, all of Calif.

[73] Assignee: LSI Logic Corporation, Milpitas, Calif.

[*] Notice: The term of this patent shall not extend beyond the expiration date of Pat. No. 5,552,631.

[21] Appl. No.: 632,962

[22] Filed: Apr. 16, 1996

Related U.S. Application Data

[63] Continuation-in-part of Ser. No. 470,741, Jun. 6, 1995, Pat. No. 5,639,385, and Ser. No. 299,022, Aug. 31, 1994, which is a continuation-in-part of Ser. No. 894,031, Jun. 4, 1992, abandoned.

[51] Int. Cl.⁶ .................................................. H01L 23/495
[52] U.S. Cl. ............................. 257/666; 257/737; 257/738
[58] Field of Search ................................. 257/666, 668, 257/670, 676, 734, 735, 736, 737, 738, 774

[56] References Cited

U.S. PATENT DOCUMENTS

| | | | |
|---|---|---|---|
| 4,523,144 | 6/1985 | Okubo et al. | 324/158 |
| 4,771,330 | 9/1988 | Long | 357/70 |
| 4,800,419 | 1/1989 | Long et al. | 357/70 |
| 4,842,662 | 6/1989 | Jacobi | 156/633 |
| 4,933,741 | 6/1990 | Schroeder | 357/70 |
| 4,965,702 | 10/1990 | Lott et al. | 361/401 |
| 4,965,865 | 10/1990 | Trenary | 324/158 |
| 4,968,589 | 11/1990 | Perry | 430/314 |
| 4,972,253 | 11/1990 | Palino et al. | 357/74 |
| 5,036,380 | 7/1991 | Chase | 357/70 |
| 5,051,813 | 9/1991 | Schneider et al. | 357/72 |
| 5,552,631 | 9/1996 | McCormick | 257/666 |
| 5,602,422 | 2/1997 | Schueller et al. | 257/737 |

*Primary Examiner*—Carl W. Whitehead
*Attorney, Agent, or Firm*—Katz & Cotton, LLP

[57] ABSTRACT

Electronic systems using separate and distinct conductive layers for power and ground are insulated from one another and a patterned signal conductive layer to form a flexible substrate for mounting a semiconductor die in a semiconductor device assembly of the system. TAB technology is utilized to produce an assembly that has superior electrical characteristics because power and ground is conducted on separate low impedance conductive layers. The power and ground leads connecting the semiconductor die and external circuits are selected from the signal trace layer, cut bent downward and attached by bonding to the respective power or ground layer. A tool is disclosed for cutting the selected leads. The present invention further provides a system utilizing a wafer probe card which includes a multi-layer, relatively flexible tape-like substrate having a first conductive layer patterned to have a number of probe leads thereon. The first conductive layer of probe leads are formed on an insulating layer having an inner peripheral edge defining a central opening in which an IC die is placed for testing. The insulating layer further includes inner and outer peripheral openings therethrough and a second conductive layer is provided on a side of the insulating layer opposite the probe leads. Inner and outer edge portions of the second conductive layer are exposed through the inner and outer peripheral openings, respectively. Selected probe leads are cut at an edge of the inner and outer peripheral openings in the insulating layer, bent past the insulating layer and bonded to the exposed inner and outer edge portions of the second conductive layer.

27 Claims, 44 Drawing Sheets

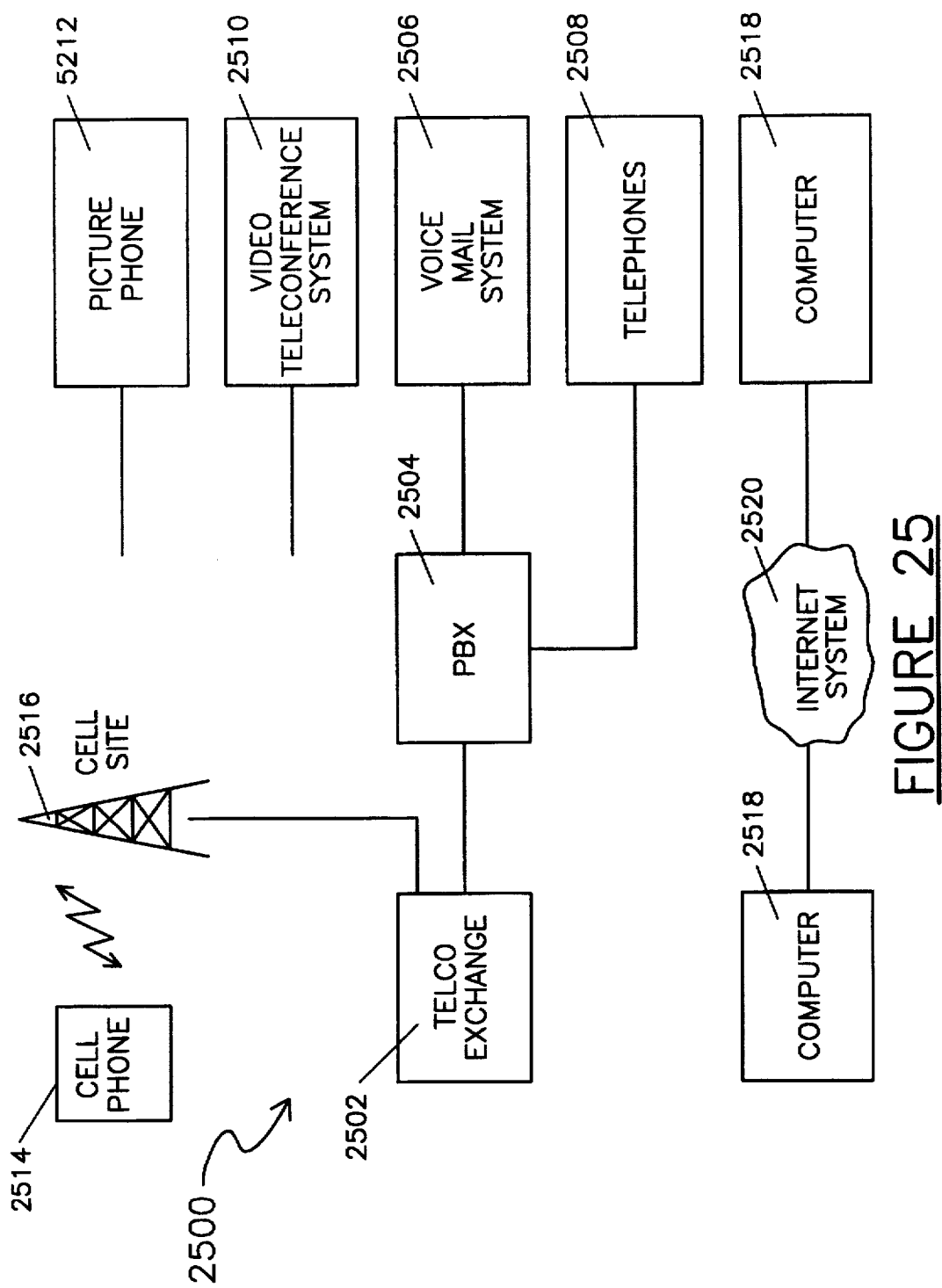

ELECTRONIC SYSTEM USING MULTI-LAYER TAB TAPE SEMICONDUCTOR DEVICE HAVING DISTINCT SIGNAL, POWER AND GROUND PLANES

CROSS REFERENCE TO RELATED PATENT APPLICATION

This patent application is a continuation-in-part of commonly owned U.S. patent application Ser. No. 08/299,022, filed Aug. 31, 1994, entitled "MULTI-LAYER TAB TAPE HAVING DISTINCT SIGNAL, POWER AND GROUND PLANES, SEMICONDUCTOR DEVICE ASSEMBLY EMPLOYING SAME, APPARATUS FOR AND METHOD OF ASSEMBLING SAME," which is a Continuation-In-Part of application Ser. No. 07/894,031, filed Jun. 4, 1992 now abandoned, entitled "MULTI-LAYER TAB TAPE HAVING DISTINCT SIGNAL, POWER AND GROUND PLANES, SEMICONDUCTOR DEVICE ASSEMBLY EMPLOYING SAME, APPARATUS FOR AND METHOD OF ASSEMBLING SAME," and commonly owned co-pending U.S. patent application Ser. No. 08/470,741, filed Jun. 6, 1995 now U.S. Pat. No. 5,639,385, entitled "MULTI-LAYER TAB TAPE HAVING DISTINCT SIGNAL, POWER AND GROUND PLANES AND WAFER PROBE CARD WITH MULTI-LAYER SUBSTRATE," all incorporated by reference herein.

BACKGROUND OF THE INVENTION

1. Field of the Invention

The present invention relates to electronic systems utilizing packaged semiconductor devices, and more particularly to electronic systems utilizing multi-layer TAB tape semiconductor devices having distinct signal, power and ground planes.

2. Description of the Related Technology

Electronic systems utilizing semiconductor devices such as integrated circuits have revolutionized the way modern society works and lives by making possible a level of technological sophistication unknown in the days of vacuum tubes and even discrete transistors. These electronic systems, which are building blocks for ever larger and more complex systems such as machines used in manufacture, transportation and the like. The sophistication of these electronic systems is the result of the complex functions handled by semiconductor devices, such as integrated circuits, making up the electronic system. An integrated circuit may comprise, on a small silicon chip, many thousand or even a million or more transistors, including associated diodes, resistors and capacitors, interconnected together to form complex electronic functions.

Generally speaking, there are three distinct techniques of packaging a semiconductor device or "die", in any case the semiconductor packages have leads or the like exiting the package for electrically connecting the packaged die to other components, either by mounting directly to a printed circuit board or by plugging the package into a socket which, in turn is mounted to a printed circuit board. These packages are: (1) plastic molded; (2) ceramic package; and (3) flat package.

U.S. Pat. No. 5,015,813 (Schneider, et al.), incorporated by reference herein, illustrates a plastic-packaged semiconductor device. Present plastic packaging techniques involve molding a plastic "body" around a semiconductor die. Prior to molding, the die is attached to a lead frame having a plurality of leads that exit the package and connect the semiconductor device to external circuits, i.e., a printed circuit board system. Plastic packages include DIP (Dual In-line Package), PQFP (Plastic Quad Flat Pack) and PLCC (plastic leaded chip carrier). The lead frame generally is formed from a single thin layer (foil) of conductive material, which is punched or etched to form individual leads. The inner ends of the leads are usually wire bonded to the active side (components, bond pads) of the die. When handling the lead frame, prior to encapsulation, it is exceptionally important to avoid damaging the closely-spaced, delicate leads of the lead frame.

U.S. Pat. No. 4,972,253, incorporated by reference herein, illustrates multi-layer ceramic packages which are laminated structures of alternate conducting and non-conducting layers, formed of thick conductive film and nonconductive ceramic, respectively. Generally, the conductive layers carry signals, power and ground on different layers. This approach, particularly separating the signal plane (layer) from the ground and power planes, has distinct electrical advantages, which are well known to those skilled in the art. In this type of package, the conductive layers are screened or otherwise disposed between the nonconductive ceramic layers, and a very rigid, stable package is thereby formed. For the signal-carrying layers, lead traces are typically screened onto an underlying ceramic layer. A die is placed into an opening in the package and connected to inner (exposed) ends of the lead traces. Generally, there is little problem in damaging the lead traces, since they are well supported by an underlying ceramic layer. Generally, vias are formed in the package to connect power and ground planes to particular leads in the signal plane.

U.S. Pat. No. 4,965,702, incorporated by reference herein, provides another example of a multi-layer package, using polymeric materials for the insulating layers and copper foil for the conductive layers. An object of such a multi-layer package is to provide for an electrical multilayer conductive package which partitions (separates) the power and ground system of the package from the signal transmission system as much as practical in order to optimize the performance of the package.

These two multi-layer ceramic and polymer packages are also known as "chip carriers". Both are preferably completely formed prior to mounting the semiconductor die within an opening in the chip carrier, and in both, the inner leads are well-supported. Hence, both of these chip carriers inherently avoid the problem of lead damage during handling and mounting of the semiconductor die.

FIGS. 1A and 1B illustrate an example of tape-based flat packing. As illustrated herein, a semiconductor device assembly 10 includes an upper, segmented plastic film layer 14 (formed of segments 14A, 14B, 14C and 14D), a lower plastic film layer 16, metallic leads 18 sandwiched between the two plastic layers 14 and 16, a metallic (preferably copper) die attach pad 20 supported between the two plastic layers 14 and 16, a semiconductor device 22 mounted on the die attach pad 20 and bond leads 24 connecting the semiconductor device 22 to the leads 18. It is also known to employ conductive "bumps" on the inner ends of the leads 18, rather than bond wires, to connect the leads to the semiconductor die 22, in a tape automated bonding (TAB) process. The upper and lower plastic layers may be, for example, polyimide and form a thin insulating supportive structure for the leads 18. A square, insulating ring ("body frame" or "dam") 26 may be disposed atop the leads 18 between portions 14B and 14C of the upper plastic film layer, outside the die area. A layer-like quantity of silicone gel 28 is disposed over the die 22 and bond wires 24, and acts as anionic contamination barrier for the die and as a stress relief for the leads 24 during assembly of the semiconductor device assembly, and further prevents an ultimate encapsulation epoxy 30 from contacting the semiconductor die. The inner ends of the leads 18 are very fragile, and extreme care must be exercised when assembling the die 22 to the leads 18. In this respect, tape mounting a semiconductor die requires a similar degree of extreme care when mounting the die to the fine-pitch conductive leads.

Further examples of mounting semiconductor devices to a tape structure are illustrated in U.S. Pat. Nos. 4,800,419 and 4,771,330, incorporated by reference herein.

As used herein, the term "semiconductor device" refers to a silicon chip or die containing circuitry and bond sites on one face, and the term "semiconductor device assembly" refers to the semiconductor chip and associated packaging containing the chip, including external package leads or pins for connecting the semiconductor device assembly to a socket or a circuit board, and including internal connections (such as bond wires, TAB, or the like) of the chip to inner ends of the leads.

The aforementioned patents relate to semiconductor device assemblies having a high lead count, which is "de rigueur" in modern semiconductor devices. The plastic packaging and tape mounting techniques are generally indicative of methods of mounting semiconductor devices to preformed lead frames having a plurality of extremely delicate conductors connected to the die.

As mentioned above, there are generally two techniques for connecting a die to inner ends of lead frame conductors, namely wire bonding and tape-automated bonding (TAB). In TAB, "bumps" typically formed of gold, are located on either the die ("bumped die") or on the inner ends of the lead fingers ("bumped tape"). See, e.g., U.S. Pat. No. 4,842,662, FIGS. 5 and 6, respectively.

U.S. Pat. No. 4,842,662, incorporated by reference herein, illustrates bonding integrated circuit components directly to a TAB tape, without the gold bump, by use of a process employing ultrasonic energy, pressure, time, heat and relative dimensions of the TAB tape. Generally, the end of a lead is "downset" (urged down) onto a die (See column 6, lines 5–8). This may be though of as a "bumpless" TAB process.

While the above-referenced patents illustrate various techniques of forming lead frames, TAB tapes, and the like, and various techniques for connecting semiconductor dies to same, these techniques generally involve only one layer, or plane, of patterned metal conductors (lead fingers), the single conductive layer comprising a single plane of signals, power and ground to the semiconductor die.

As mentioned hereinabove, it is electrically desirable to provide distinct and separate conductive planes for carrying signal, power and ground from leads (or pins) exiting the package to the die within the package.

U.S. Pat. No. 4,933,741, incorporated by reference herein, illustrates a multilayer package for integrated circuits having a ground plane (20) electrically isolated from a plane of conductors (14) by means of an insulating layer (16) formed of polyimide. The ground plane (20) is connected to selected conductors (14) by means of vias (18) extending through the insulating layer (16). The remaining (non-grounded conductors) carry signals and power to/from the integrated circuit device (11). As disclosed therein,

[b]ecause of the small physical size of the electrical conductors 14, they represent a significant impedance to operating potential and current 15 applied to the integrated circuit 11 causing an undesirable voltage drop along the length of the conductors 14.

Additionally, capacitive coupling between the conductors 14 causes cross talk on the conductors 14 which apply signals to and/or derive signals from the integrated circuit 11. Further, the impedance of the conductors 14 create switching noise when the DC operating current 15 applied to the integrated circuit varies. In addition, "the capacitive cross coupling between the conductors 14 can be reduced by a [separate] ground plane 20 which also surrounds the integrated circuit 11 and is located adjacent the plurality of conductors." (See, column 2, lines 31–46).

Despite the generally accepted notion that providing a separate ground plane has desirable electrical characteristics, the examples set forth above are limited to rigid, multi-layer ceramic or polyimide or polymer chip carriers. In both of these multi-layer approaches, it is relatively feasible to provide vias between separate metal layers and the intervening insulating layers.

On the other hand, in a tape-mounted, flexible substrate, semiconductor device assembly, it has generally not been very practical to consider or implement incorporating a distinct ground plane, since this type of "flexible" packaging does not lend itself readily to such a multi-layer approach employing vias spanning insulating layers.

For example, commonly-owned, copending Ser. No. 07/829,977, entitled RIGID BACKPLANE FOR SEMICONDUCTOR DEVICE ASSEMBLY, filed on Jan. 31, 1992, by Michael D. Rostoker, discloses an integrated circuit device package (semiconductor device assembly) having a flexible substrate including an upper patterned insulative layer, and a lower patterned conductive layer including a plurality of package leads (lead fingers). The assembly further includes a rigid or semi-rigid lower protective layer, formed of ceramic, glass, plastic, and combinations thereof, which provides enhanced protection from mechanical and electrical degradation of the packaged device, and which may also serve as a heat sink.

Prior to packaging integrated circuit ("IC") dies or other semiconductor devices in accordance with the above-described techniques, it is often desirable to test individual dies before separating them from a semiconductor wafer. On-wafer testing significantly improves manufacturing efficiency and product quality by detecting IC defects at the earliest possible stages in the manufacturing and assembly process. Wafer probe cards are commonly used to perform this type of in-process IC testing. A wafer probe card typically includes a printed circuit board and a number of probe leads capable of making electrical contact with power, ground and signal bond sites or test pads on the IC surface. The printed circuit board includes a pattern of traces which make electrical contact with the probe leads to carry signals or voltages from external test equipment through the probe leads to the IC. Individual ICs can thus be powered up and tested without separating them from the wafer.

One known technique of wafer probe card construction uses manual alignment and attachment of discrete probe leads to the printed circuit board. The probe leads are usually long, thin and constructed of either tungsten or beryllium-copper alloys. Each IC probe is typically individually soldered to the printed circuit board. The soldering process is particularly difficult in the case of complex ICs given the large number of probe leads which must be attached to the printed circuit board within a limited area. Manual wafer probe card assembly under current practice is therefore time-consuming and expensive. Manual assembly limits the density of probe leads which can be accurately aligned and soldered to about 300 probe leads per printed circuit board.

A center-to-center spacing between adjacent probe leads is generally referred to as "pitch". Manual assembly also requires that adjacent probe leads have a pitch of greater than about 80 micrometers.

FIG. 13 illustrates a side sectional view of an exemplary prior art wafer probe card assembly. A wafer probe card illustrated generally at 1300 includes a printed circuit board 1312 with an inner peripheral edge 1313 defining a central opening. An anodized aluminum insulating ring 1314 is disposed within the central opening 1313. Wafer probe card 1300 is used to test an IC die 1318 formed on a semiconductor wafer 1317. The portion of the wafer including the die 1318 under test is positioned under the insulating ring 1314 and central opening 1313. A number of wafer probe leads 1320 are manually soldered at an outer end 1328 to printed circuit traces 1321 formed on a lower surface 1322 of printed circuit board 1312. A via hole 1323 plated through with a conductive material connects each lower surface trace 1321 to a respective overlying upper surface trace 1324. The probe leads 1320 are secured to insulating ring 1314 with epoxy 1325. Epoxy 1325 holds the probe leads in place a suitable distance apart such that a probe tip of each probe lead is properly positioned for contacting IC die 1318. An external tester board 1326 includes a number of pins 1327 for making electrical contact with upper traces 1324 along the outer periphery of printed circuit board 1312. The external tester board 1326 applies appropriate test signals to probe leads 1320 by plated through via holes 1323 and lower surface traces 1321 and thereby to IC die 1318.

In order to test a typical IC, a relatively large number of probe leads 1320 are required to interface with the die 1318. As the complexity of the IC increases the required number of probe leads also increases. Each of the probe leads 1320 must be connected to traces 1321 in order to interface the IC to external test equipment. Since the connection typically involves manual soldering it can be seen that the difficulty of connecting probe leads 1320 with traces 1321 is a function of the density and pitch of the probe leads required on the wafer probe card to test a given IC.

A number of techniques have been developed which use TAB tape or other types of flexible substrates with etched leads to avoid the problems associated with the manual alignment and assembly process described above. U.S. Pat. No. 5,189,363 discloses a technique for improving probe lead density and pitch by using etched TAB tape leads as wafer probe leads. The TAB tape leads are brought into contact with the die under test by applying downward pressure to the inner ends of the leads with a pressure anvil. U.S. Pat. No. 5,036,380 discloses a technique of using TAB tape etched leads for die probing and connecting certain of the etched leads to burn-in testing pads on the tape to provide improved IC burn-in testing. U.S. Pat. No. 4,968,589 discloses a probe card having a number of etched leads on a dielectric substrate. A ground plane is formed on the opposite surface of the substrate. The etched leads are used as probes to connect pads on an IC chip to leads on a printed circuit board.

None of the above techniques includes a suitable means for attaching certain of the etched leads to a ground plane layer. Attachment is therefore normally performed in a manner similar to that illustrated in FIGS. 2A and 2B of the present invention. U.S. Pat. No. 5,036,380 specifically provides that "the ground plane is connected to the ground conductors on the first surface by way of vias formed through the TAB tape." See column 3, lines 41–44. Furthermore, none of the TAB tapes presently used for wafer probe cards include an efficient means for attaching certain probe leads to one of several metallized reference planes. A wafer probe card incorporating presently available TAB tapes such as these will therefore suffer from drawbacks similar to those discussed above and in conjunction with FIGS. 1A, 1B, 2A and 2B in the context of IC packages.

The above described techniques for utilizing TAB tape in wafer probe cards suffer from additional drawbacks. These techniques generally involve using an etched lead to probe an IC die. In many cases the etched lead material is not optimal for wafer probing. When a TAB tape is used in a packaging application, the desirable physical properties of the etched lead material include tensile strength and elongation. In a typical TAB tape these properties are optimized for bonding to the IC die. When the TAB tape is used for wafer probing, a different set of properties are desirable for the probe tips of the probe leads in order to provide repetitive contacts to the IC bond sites with adequate lead deflection and form retention. These properties include stiffness and hardness of the probe tip. The probe tip should be designed such that it deflects under pressure during probing and yet is able to return to its original position when pressure is removed. The probe tip should also maintain its formed shape despite repeated probing. It may be difficult to meet these conflicting requirements in many applications by simply using the end of an etched lead. U.S. Pat. No. 5,189,363 suggests forming or coining the ends of the etched leads into various shapes. See column 8, lines 46–54. The use of alternative materials for the etched leads are also suggested. See column 8, line 55 to column 9, line 42. These suggestions all involve using the same material for the entire etched lead. It is therefore not possible to optimize the probing properties of the probe tip end of the lead while simultaneously optimizing the desirable properties of those portions of the probe lead which do not contact the die. The TAB tape within the wafer probe card will therefore have to be replaced frequently, resulting in additional expense and delay.

Presently available wafer probe cards therefore limit the efficiency and capacity of IC testing. The density and pitch of wafer probe leads is unduly restricted since the TAB tape used in the wafer probe card presently requires vias or other inefficient means of interconnecting specific probe leads to one or more reference planes. Connections to ground or power planes will continue to take up excessive space on the tape which could otherwise be used to provide more signal line interconnections to the IC. It may therefore not be possible to detect a desirable level of circuit defects in a particular IC using present techniques. Furthermore, the probe tip portion of the TAB tape probe lead wears out frequently thereby requiring replacement of the TAB tape and resulting in additional delay and expense. The limited test capabilities of existing wafer probe cards will become an even greater problem as more complex and densely packed ICs are developed.

What is needed is an electronic system utilizing a simple, reliable, cost effective, and easy to design and manufacture tape-mounted, flexible substrate semiconductor device assembly having distinct signal, power and ground planes with low signal cross talk and voltage drop. It can also be seen from the foregoing that there is a need for an improved wafer probe card with a higher density of fine pitch probe leads in testing the semiconductor devices of the system.

OBJECTS OF THE INVENTION

It is therefore an object of the present invention to provide an electronic system which utilizes an improved semiconductor device assembly.

It is a further object of the present invention to provide an electronic system which utilizes a multi-layer, relatively-flexible, tape-like substrate for mounting a semiconductor device, said substrate having at least a signal layer distinct from at least a ground plane.

It is a further object of the present invention to provide an electronic system which utilizes a semiconductor device incorporating at least one additional electrically conductive plane into the semiconductor device assembly using tape automated bonding (TAB) assembly techniques.

It is a further object of the present invention to provide an electronic system which utilizes a semiconductor device having a rigid supportive structure in a TAB package.

It is a further object of the present invention to provide an electronic system which utilizes a semiconductor device manufactured with an improved technique.

It is a further object to establish selective and assignable downbond locations for power and ground within TBGA, TAB or COT packages used in an electronic system that utilize a more manufacturable downbond process not dependent on lead forming.

It is a further object to reduce the number of TAB-tape conductors/leads which must be routed through a ball grid array, to reduce the overall circuit density, and to improve electrical performance of the semiconductor package used in an electronic system.

It is a further object to attach solder balls to a TBGA grid array using solder reflow that is restricted to a defined wettable area for the solder ball collapse to the contact pad.

It is a further object to reduce the overall size of a TBGA package in an electronic systems by utilizing the lid/heatsink of the TBGA package as an outer downbond slot and perimeter dam for encapsulant.

It is a further object of the present invention to prevent copper migration and electrical shorting or leakage that may cause semiconductor device malfunction in an electronic system.

It is a further object of the present invention to provide an electronic system utilizing a wafer probe card which includes a multi-layer, relatively flexible tape-like substrate having a number of conductive probe leads thereon, several of which are connected to one or more additional conductive layers.

It is a further object of the present invention to provide an electronic system utilizing a wafer probe card having attached probe tips with desirable probing properties.

SUMMARY OF THE INVENTION

The above and other objects of the present invention are satisfied, at least in part, by providing an electronic system that utilizes semiconductor devices that have a relatively-flexible, tape-like substrate for mounting a semiconductor device. The substrate has a patterned, conductive layer of fine-pitch leads extending into a central area in which a semiconductor die may be connected to the inner end portions of the leads. The substrate includes an underlying insulating (e.g., plastic film) layer supporting the leads, within the central area there being an opening larger than the area defined by the inner end portions of the leads so that inner end portions of the leads remain exposed past the opening in the insulating layer for the purpose of connecting the leads to the semiconductor device. Preferably, all of the leads are connected to the semiconductor device by tape-automated bonding (TAB).

A second, additional conductive layer on the opposite face of the insulating layer from the patterned conductive layer is not patterned to form distinct leads, but rather forms a planar ring-like layer, the inner edge of which may extend past the opening in the central area of the insulating layer, and is larger than the die. Hence, the substrate can be viewed as a sandwich of two conductive layers, one of which is patterned into discrete conductors (traces), the other of which is not patterned and an insulating layer interposed between these two conductive layers.

According to the invention, a first group (portion) of the total number of lead traces in the patterned conductive layer are connected to the die, preferably by TAB bonding or similar process (i.e., rather than by wire bonding). A remaining, selected portion of the lead traces in the patterned conductive layer are also connected at their inner ends to the die, and are then: (1) broken off at or just within the edge of the central area opening in the insulating layer, leaving an inner end portion of the selected lead traces disconnected from the remaining portion of the selected lead traces, one end of the inner end portion bonded to the die and the other end of the inner end portion being a "free" end, (2) this free end is bent downwards past the insulating layer so that the free ends of the inner end portions of the traces contact an inner edge portion of the additional conductive layer extending into the central area opening of the insulating layer, and (3) the free ends of the conductive traces are bonded to the inner edge portion of the ring. In this manner, the additional conductive layer may act as a ground plane connected to the die.

The additional conductive layer also extends under window-like slots near the outer edges of the insulating layer, where a similar process of cutting, bending and bonding outer portions of the selected lead traces to the additional conductive layer is performed. In this manner, external portions of the selected lead traces, beyond the outer portions, exit the ultimate semiconductor device assembly, and are connected to the external circuit ground (or power).

Hence, the additional conductive layer can be used to conduct ground (or power) from external portions of the selected lead traces to inner end portions of the lead traces, to the die, bypassing, on a different plane, the remaining intermediate portions of the lead traces which are intended (primarily) to carry signals to and from the die. In this manner, a distinct ground (or power) plane is established which is isolated from the patterned conductive layer (primarily signal paths). The beneficial electrical characteristics discussed above are available in a flexible, easily manufactured, tape-mounted semiconductor device assembly.

Further according to the invention, two additional conductive layers are formed, one for ground and one for power. In a manner similar to that set forth with respect to one additional conductive layer, selected leads are cut, bent and connected to the one additional conductive layer, and selected other leads are cut, bent and connected to the second additional conductive layer.

Further according to the invention, the selected and other selected lead traces are cut at an edge of the insulating (plastic) layer between the patterned conductive layer and the first additional (or simply "additional" if only one) conductive layer by urging downward on the selected and selected other lead traces with a cutting tool.

Further according to the invention, the selected lead traces are cut and bonded to the conductive layer with a cutting/bonding tool that cuts and then bonds the cut selected leads to the conductive layer. In similar fashion, selected other leads may be cut and bonded to an additional conductive layer.

Further according to the invention, various methods of TAB bonding a conductive trace to an additional conductive layer may be utilized, thus avoiding the use of vias.

Further according to the invention, the TAB tape carrier insulating film is patterned having an opening with the conductive lead traces passing thereover. The power plane is patterned with a sub-opening that lines up with the opening of the insulating film. The ground plane/stiffener is continuous and unbroken. The insulating film, power plane and ground plane/stiffener thereby form windows alternating between the power and ground planes. Selected lead traces for power are downbonded within the continuous bounds of the power plane. Selected other lead traces for ground are downbonded within the sub-openings of the power plane to the underlying exposed ground plane/stiffener. Groups of selected and selected other lead traces (conductors) may be sub-grouped and routed accordingly, thus allowing greater space between the endmost lead traces of adjacent windows according to the requirements for the overall pitch, alignment and other manufacturing tolerances.

The insulating carrier film may also have alternating wide and narrow portions forming the elongated slot or opening. The power plane has only a narrow elongated slot, and the ground plane/stiffener is continuous and unbroken. The insulating film, power plane and ground plane/stiffener thereby form a narrow ground plane window and alternating wide portions of the elongated slot allowing access to the power plane. Selected lead traces for power are downbonded within the wide portions of the elongated slot and continuous bounds of the power plane. Selected other lead traces for ground are downbonded within the narrow portion of the elongated slot to the underlying exposed ground plane/stiffener.

Further according to the invention, the elongated slots for donwbonding selected lead traces may be located just inside the innermost row of ball pads, or within or between the rows of the ball grid array.

Further according to the invention, selected lead traces that will be downbonded are connected to lead traces proximate thereto that are not downbonded. The selected lead traces connect to and terminate at signal lead traces on the insulating film. Both the selected and non-selected lead traces bridge over the elongated downbond slot, however, the selected lead traces to be downbonded do not continue over the insulating film. In this way, the number of TAB-tape conductor/leads which must be routed through the ball grid array is reduced, thus reducing the overall circuit density and improving the electrical performance of the package.

Further according to the invention, attachment of solder balls to the TBGA grid array is enhanced by restricting the solder flow to a predefined solder wettable area when the solder ball collapses to the contact pad during reflow heating. This is accomplished by creating TAB tape pads on the conductor layer for solderably connecting to the solder balls, and defining a desired ball connection area over these pads by application of, for example, patterned photoimageable solder resist developed with a desired dimensional tolerance.

Solder flux may be placed on the ball pad areas of the tape side exposed through the patterned solder resist. The solder flux may be applied by dispensing syringe, screen print, stencil, or other methods known to those skilled in the art. The solder balls are aligned over the ball pad areas of the tape and brought into contact with the previously dispensed solder flux with sufficient force to allow their retention to the pads by the flux. The TBGA tape and flux attached solder balls are then heated to reflow the solder balls sufficiently so as to form a reliable, conformal electro-mechanical connection.

Further according to the invention, a lid/heatsink is utilized as a downbond conductive plane and perimeter dam for encapsulant. The lid/heatspreader of the present invention forms outer downbond slots outside of the ball grid array. This replaces outer downbond slots that would normally be formed in the TAB tape film. Thus, by eliminating the outer downbond slots the overall package body size may be reduced.

A raised outer rim is formed preferably by stamping during the fabrication of the lid/heatspreader. The height of the heatspreader rim is above the height of the TAB tape lamination and sufficient to restrict the meniscus of encapsulant during cure. The TAB tape is laminated to the lid/heatspreader after the outer edge of what would have been the outermost downbond slot has been excised. The excised perimeter is trimmed short enough to avoid inadvertent shorting of the leads not selected for downbonding to the lid/heatspreader. The selected leads are downbonded to the lid/heatspreader. Encapsulant is placed in the channel between the heatspreader rim and TAB tape so as to cover the selected downbonded and nonselected leads, then the encapsulate is cured.

Further according to the invention, the selected lead is cut a short distance, preferably about 2 to 5 mils, from the edge of the downbond slot in the insulating layer. During formation of the selected cut-lead for connection to the conductive layer heatspreader, the short end of the selected cut-lead is urged downward into the slot. During subsequent slot encapsulation, both the free short end and the downbond-selected cut-lead that is connected to the downbond conductive plane are covered with encapsulant. This encapsulant helps prevent copper migration and the possibility of electrical shorting or leakage of the leads that may cause semiconductor device failure.

Further according to the invention, various bonding tools for effecting TAB bonding of lead traces to an additional conductive layer are disclosed.

Further according to the invention, a tool (die pedestal) for aiding in the assembly of the die to the tape substrate, and for aiding in cutting, bending and bonding the selected and selected other lead traces to the additional conductive layer (s) is disclosed.

Further according to the invention, a bonding tool for cutting the selected conductive lead traces and TAB bonding the cut lead traces to an additional conductive layer is disclosed. This bonding tool helps to ensure the location of the lead break and to provide optimum lead bonding to the conductive substrate. The bonding tool of the present invention has a cutting tip with a sharp front radius that causes the lead to break at the point of contact of the front radius of the tool.

Further according to the invention a multi-layer, relatively flexible tape-like substrate having a first conductive layer patterned to have a number of probe leads thereon is incorporated into a wafer probe card. The first conductive layer of probe leads are formed on an insulating layer having an inner peripheral edge defining a central opening in which an IC die is placed for testing. The inner ends of the probe leads extend toward the die in the central opening in order to apply test signals to the die during testing. The insulating layer further includes an inner peripheral opening near its inner peripheral edge and a second conductive layer on a side of the insulating layer opposite the probe leads. An inner edge portion of the second conductive layer is also exposed through the inner peripheral opening in the insulating layer. In accordance with this further aspect of the present invention, selected probe leads are cut substantially at an outer edge of the first inner peripheral opening in the insulating layer, bent past the insulating layer and bonded to the exposed inner edge portion of the second conductive layer. An inner edge of the inner peripheral opening provides additional support for the inner end portion of the probe lead after it is broken and attached to the conductive layer.

Further according to the invention, an outer peripheral opening is provided in the insulating layer near an outer peripheral edge of the insulating layer and an outer edge portion of the second conductive layer is also exposed through the outer peripheral opening. The selected probe leads are cut substantially at an inner edge of the outer peripheral opening in the insulating layer, bent past the insulating layer and bonded to the outer edge portion of the second conductive layer. The second conductive layer thereby provides a path for power or ground signals from outer ends of the probe leads to the inner ends of the probe leads and thus to an IC bond site during IC testing. The outer ends of the probe leads may further be attached to traces on a printed circuit board in order to facilitate electrical interconnection of the outer ends of the probe leads to external test equipment.

Further according to the invention the inner ends or inner end portions of the probe leads may have a distinct probe tip attached thereto such that the material of the probe tip may be selected to provide desirable probe tip properties. The probe tip material may be selected such that the properties of the probe tip are substantially different than the properties of the probe lead formed on the insulating layer.

It is contemplated that the present invention may utilize system level products comprising single chip modules (SCM) often including other electrical components (such as capacitors, resistors, inductors, etc.); multi-chip modules (MCM) having at least two integrated circuit dice in the same or separate ceramic, resin, or substrate board packages, with or without other electrical components; board level products (BLP) such as those having multiple integrated circuits on printed wiring board(s) (PWB); and box level products (Boxes) which may include a combination of elements from the list of SCM, MCM, BLP and the like. One or more of such SCM, MCM, PWB or BLP's may act as, or be integrated into a functional system or subsystem. The system level products contemplated include digital (or other) data storage systems; security and surveillance systems, general purpose computers (such as personal computers, work stations, servers, mini computers, mainframe computers and super computers); digital audio and video compression and transmission systems; transportation vehicles (such as airplanes, trains, automobiles, helicopters, rockets, missiles, boats, submarines, and the like); subsystems utilized in such vehicles (such as navigational positioning, i.e., Global Positioning System (GPS), navigational displays and controllers, hazard avoidance such as radar and sonar, fly by wire control, and digital engine control and monitoring); entertainment systems (such as digital television and radio, digital cameras, audio and video recorders, compact disc players, digital tape, or the like); and communications systems (such as PBX, telephone switching, voice mail, auto attendant, network controllers, video teleconferencing, digital data transmission (such as token ring, ethernet, ATM, or the like), and including subsystems or subassemblies for inclusion or attachment to more complex system level products.

Other and further objects, features and advantages will be apparent from the following description of presently preferred embodiments of the invention, given for the purpose of disclosure and taken in conjunction with the accompanying drawings.

BRIEF DESCRIPTION OF THE DRAWINGS

FIG. 25 is a schematic block diagram of a plurality of communications and information transmission systems.

DETAILED DESCRIPTION OF THE PREFERRED EMBODIMENTS

The present invention is an electronic system utilizing semiconductor devices such as integrated circuits in packages comprising multi-layer TAB tape having distinct signal, power and ground planes. In addition, novel heat sinks are used to effectively dissipate heat from the semicondcutor devices and also may serve as package stiffeners. A wafer probe card with a multi-layer substrate is disclosed which may also be utilized during the fabrication, testing and maintenance of the system of the present invention.

Figure 1A:
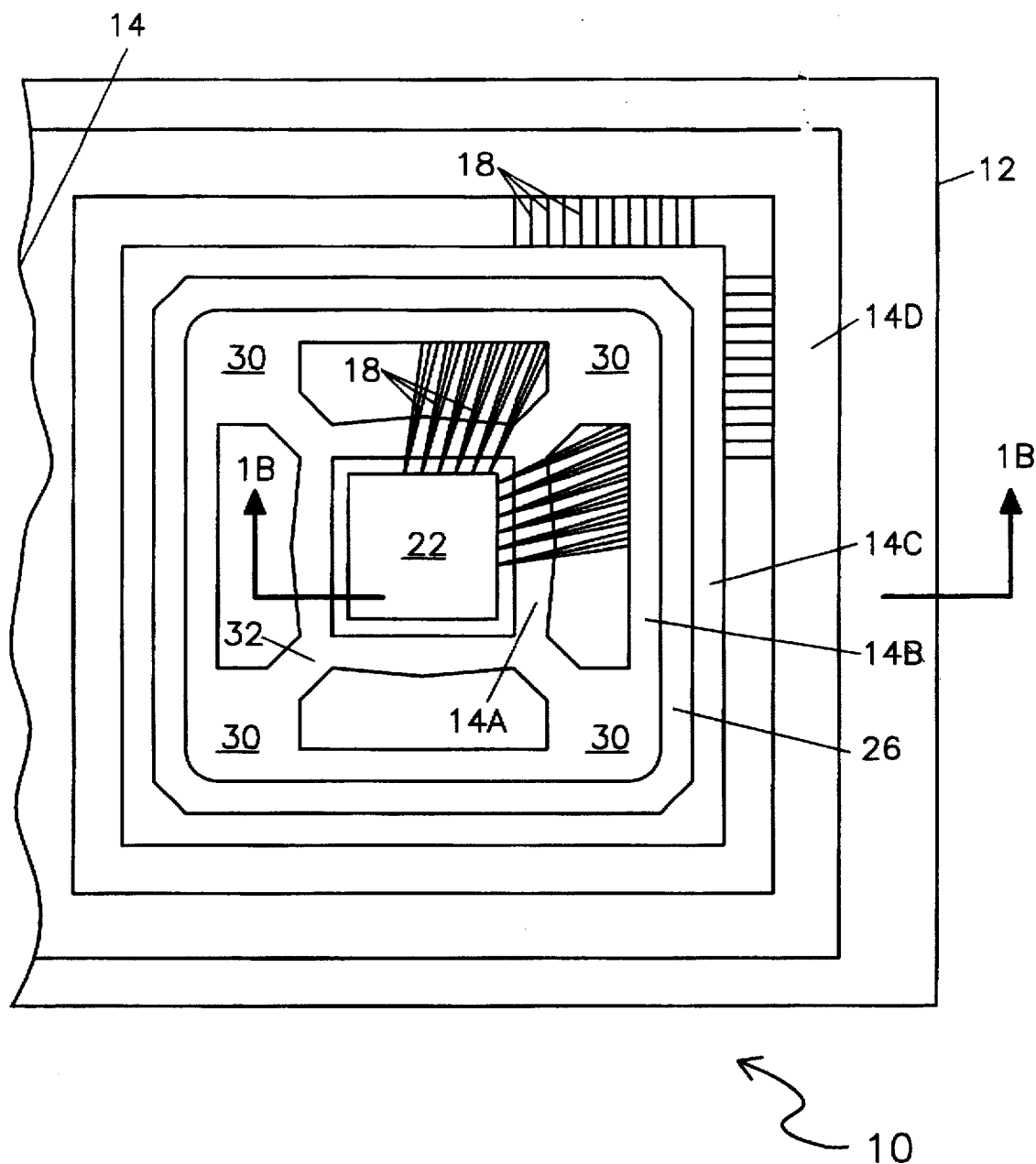
FIG. 1A is a plan view of a prior art technique of tape-mounting a semiconductor device to a flexible substrate.
Figure 1B:
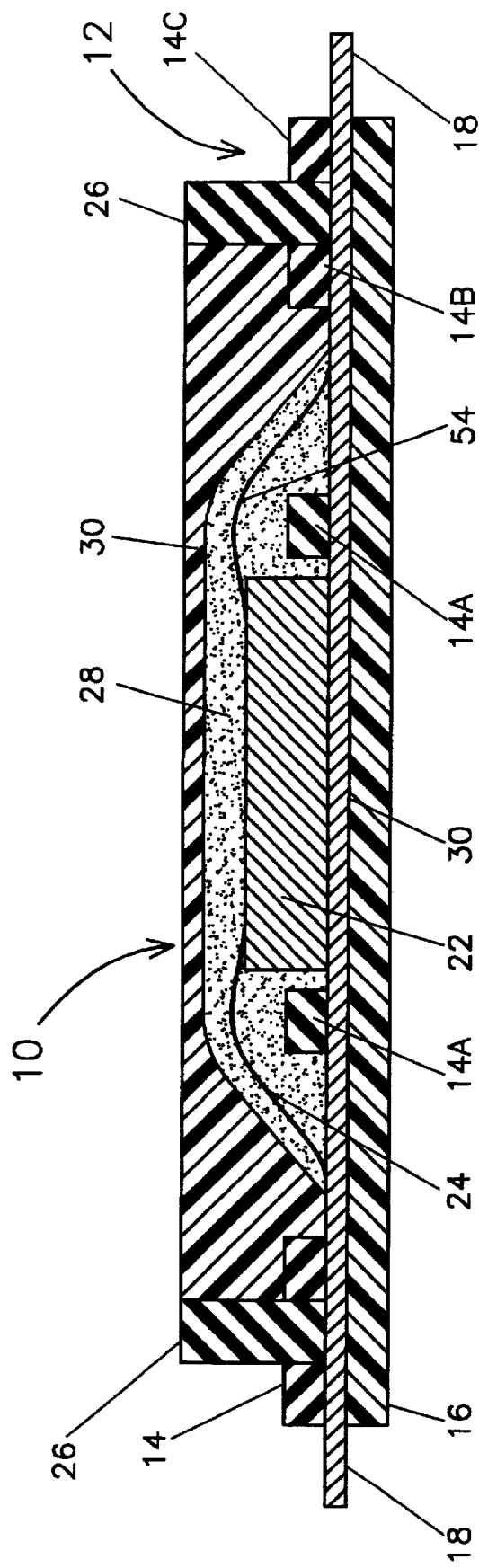
FIG. 1B is a cross-sectional view of the prior art technique of FIG. 1A, taken on a line 1B—1B through FIG. 1A.

FIGS. 1A and 1B illustrate a prior art technique of tape-mounting a semiconductor device to a flexible substrate. As discussed above, a semiconductor die can be wire bonded, or TAB mounted to the inner ends of the conductive leads (traces).

Figure 2A:
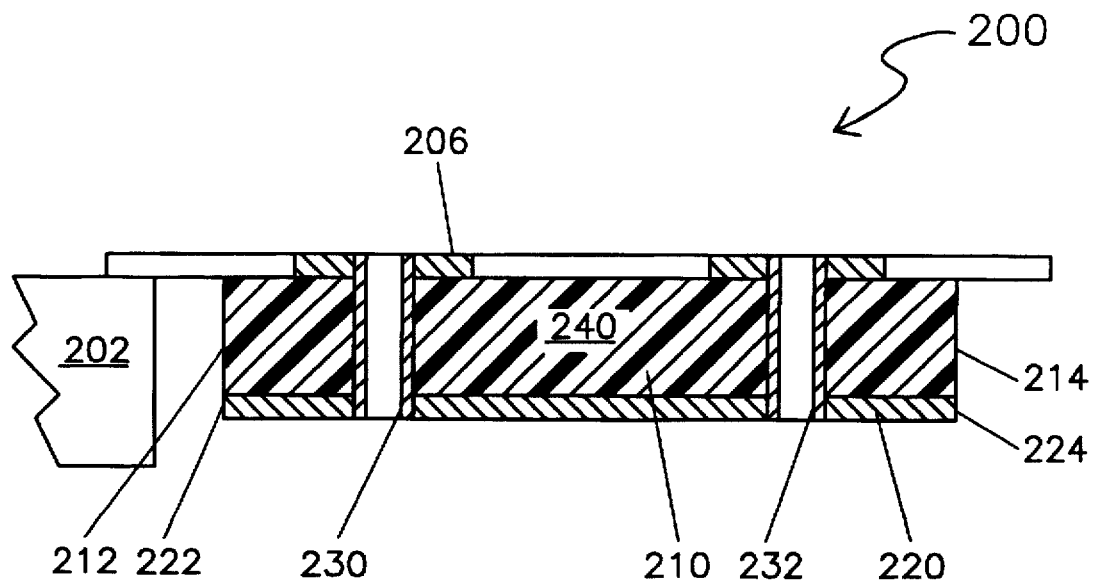
FIG. 2A is a cross-sectional view of a prior art technique of forming a two-metal-layer, TAB-type semiconductor device assembly, using vias to connect the two metal layers together.
Figure 2B:
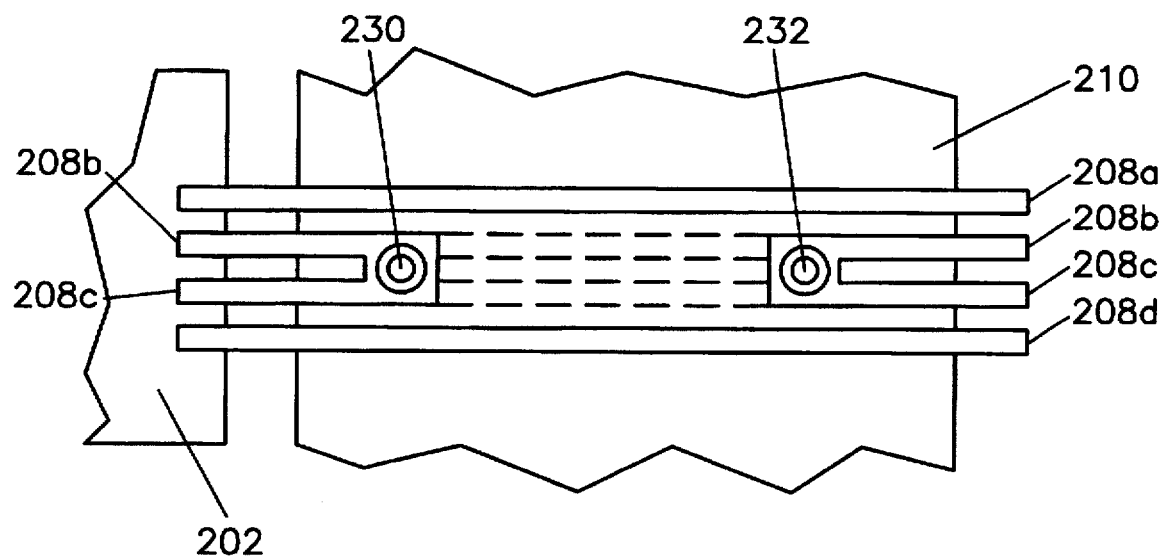
FIG. 2B is a top plan view of a portion of the assembly of FIG. 2A.

FIGS. 2A and 2B illustrate another prior art technique 200 of tape-mounting a semiconductor die 202 to a flexible substrate 204. In this example, the substrate has first metal layer 206, such as copper foil, patterned with conductive lines (traces) 208. These traces 208 are very fine pitch to meet the signal input/output (I/O) demands of modern, complex semiconductor devices. Only four traces 208a, 208b, 208c and 208d are illustrated (see FIGS. 2B), as representative of the hundreds of such traces typically required. These traces 208 extend from an outer end (right, as viewed in the Figures) where they will connect to external source and circuitry, to an inner end (left, as illustrated) where they are bonded to the die, and usually each trace (e.g., 208a, 208b, 208c and 208d) carries a distinct I/O signal, or power or ground.

As is known in the art, the first metal layer 206 of traces 208 is suitably supported by an underlying layer 210 of an insulating material, such as polyimide film. The insulating layer 210 is provided with a central opening 212, formed by an inner peripheral edge thereof. The first metal layer traces 208 extend into the opening, a suitable distance for bonding to the die. The first metal layer traces 208 also extend beyond the outer edge 214 of the insulating layer for connection to external circuits and systems.

The substrate 204 is also provided with a second metal layer 220, on an opposite side of the insulating layer 210 from the first metal layer 206. The second metal layer 220 is not patterned to form traces, but is rather a planar ring-like structure having an inner edge 222 aligned with the inner edge 212 of the insulating layer 210, and an outer edge 224 aligned with the outer edge 214 of the insulating layer.

In this semiconductor device assembly 200, the lower conductive layer 220 is intended to be a ground plane. In order to effect this function, vias 230 are formed near the inner edge 222 of the lower conductive layer 220, which vias 230 extend through the layer 220, through the layer 210, and through the layer 206, and the vias are usually plated through so that individual traces 208 may be electrically connected to the ground plane 220 near the semiconductor device 202. However, as is readily apparent from FIG. 2B, in order to accommodate such vias 230, which are on the order of 0.004 inches (100 mm) in diameter, it is necessary to dedicate two adjacent conductive traces, in this case the traces 208b and 208c, to making the connection to the ground plane. Because of the modern drive to very high lead count packages, the individual traces 208 are preferably on the order of 0.002 inches (50 mm) wide and spaced at a 0.002 inch pitch. And, as illustrated in FIG. 2B, this requires that the two conductive traces 208b and 208c are tied together in the area of the via, and hence cannot carry two separate signals. This, of course, wastes valuable traces (leads 208), in an environment where the number of distinct traces carrying distinct signals is a major design criteria.

In a similar manner, vias 232 are formed near the outer edge 224 of the lower conductive layer 220, which vias 232 extend through the layer 220, through the layer 210, and through the layer 206. Again, it will typically take at least two adjacent traces (e.g., 208b, 208c) to accommodate such a via, due to sizing restrictions. Nevertheless, the ground plane 220 can be connected to conductive lines 208b and 208c near the outer edge 214 of the insulating layer 210. In this manner, using vias 230 near the inner edge 212 of the insulating layer 210 and using vias 232 near the outer edge 214 of the insulating layer 210, a ground connection can be made to an external lead (right hand portion of the leads 208), connected by the via 232 to another plane 220, and brought back up to the original layer 206 near the die 202. Electrical benefits will accrue by virtue of the low impedance separate ground plane 220.

FIG. 2B also illustrates that intermediate portions of the traces 208b and 208c are preferably excised (or simply not formed), and these intermediate portions of the traces 208b and 208c are depicted by dashed lines. This ensures that the electrical path from one end of the leads 208b and 208c to the other ends thereof is largely in the second, offset from the first 20 and parallel with the plane 220.

Hence, the technique 200 is illustrative of prior art techniques of forming a two-metal-layer, TAB-type semiconductor device assembly, using vias to connect the two metal layers together. This is commonly called "two metal layer TAB tape". As discussed above, using vias to connect one plane to another will unavoidably reduce the number of distinct leads available for inputting and outputting signals to/from the die.

A further problem with two metal layer TAB tape is that the bottom layer 220 is a thin foil, much like the top layer 206 (but not patterned into traces). Hence, the bottom layer 220 does not provide significant additional mechanical support for the substrate 204, nor does the bottom layer 220 provide much in the way of enhanced thermal performance. Further, even if the intermediate portions (dashed lines, FIG. 2B) of the conductors 208b and 208c are removed, there is still a significant portion of these conductors in the signal layer 206, therefore allowing parallel paths for ground. Further each tape (substrate) design is specific to a particular application, i.e., must be customized for the particular "pin-outs" of a particular semiconductor device. (The term "pin-outs" is used to indicate which bond site on the die is used for signals, which is used for power and which is used for ground. Pin-outs typically vary widely from device-to-device.) Further, the manufacture of such two metal layer TAB tapes is relatively expensive (i.e., as compared with the inventive techniques disclosed below).

MULTI-LAYER FLEXIBLE SUBSTRATE HAVING A SECOND CONDUCTIVE PLANE

According to the system of the present invention, an electronic system utilzies a flexible substrate, such as a TAB tape, which is provided with a first conductive layer having patterned lines (traces) primarily for carrying signals to and from the die, and is provided with a second conductive layer for providing power and/or ground connections on a plane offset from and insulated from the first conductive layer. Inasmuch as the first conductive layer carries all of the signals (versus power and ground), it is sometimes referred to herein as a "signal layer". The layer 206 of FIGS. 2A and 2B is such a signal layer. The flexible TAB tape substrate, a semiconductor device assembly employing same, tools for manufacturing same, and methods of manufacturing same are disclosed herein.

Figure 3A:
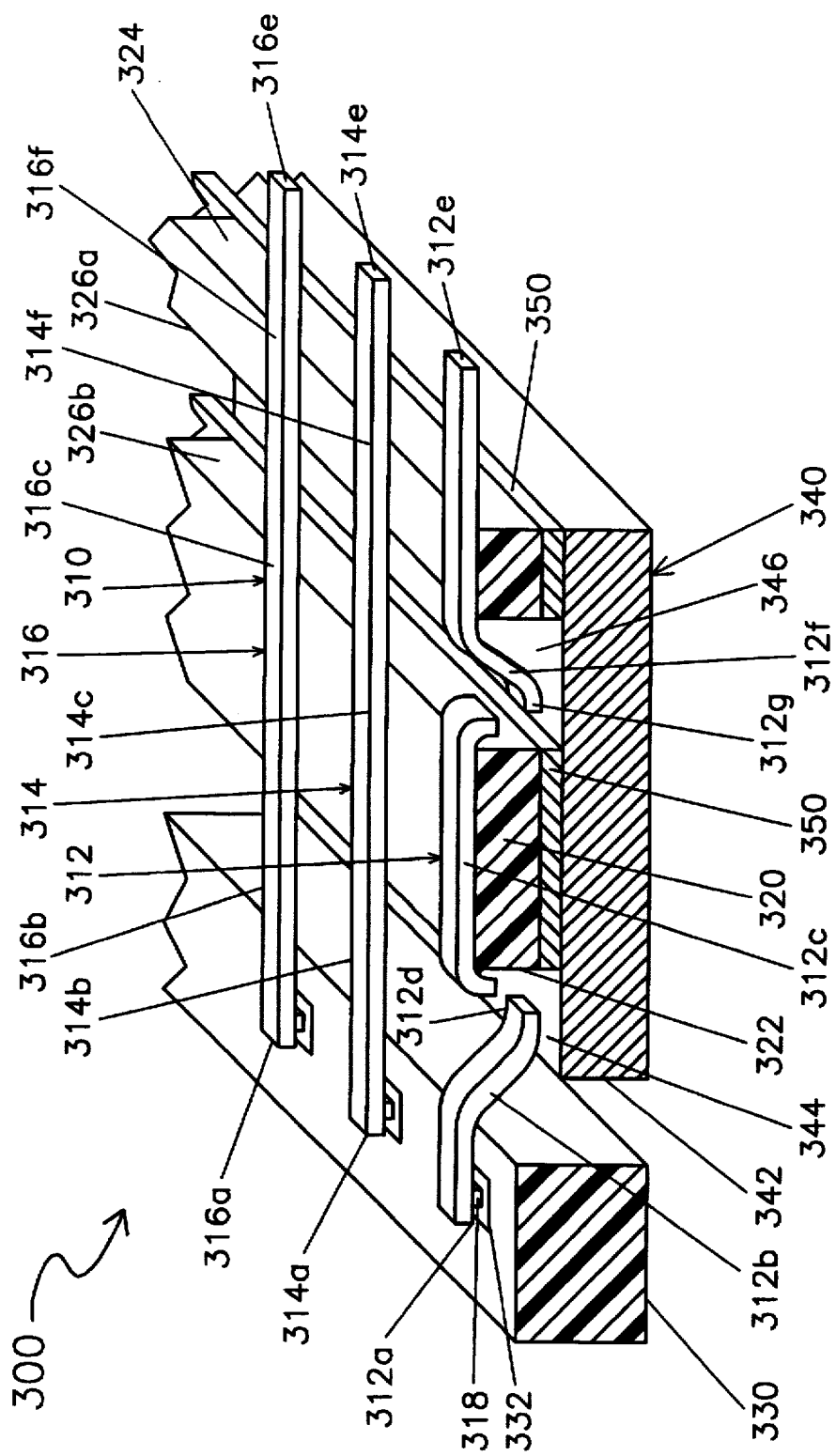
FIG. 3A is a perspective view, partially in cross-section, of a multi-layer flexible substrate mounting a semiconductor die, with one additional conductive layer, according to the semiconductor device of the present invention.

FIG. 3A illustrates a relevant portion of a semiconductor device assembly 300, partially assembled (not encapsulated or lidded), employing the inventive technique of breaking, bending and bonding selected leads to a second conductive layer using a TAB process.

A first conductive layer 310 is patterned to have a plurality of fine-pitch conductive leads (traces) 312, 314 and 316 (only three of what may be hundreds of these leads are depicted for illustrative clarity). The first conductive layer 310 is supported by an underlying insulating layer 320. The first conductive layer 310 may be formed of a thin cooper foil, on the order of one mil thick. The insulative layer 320 may be formed of a thin plastic layer, such as polyimide, on the order of five mils thick. This is standard for TAB tape semiconductor device assembly fabrication.

The polyimide layer 320 has a central opening formed by its inner peripheral edge 322, and the opening is sufficiently large to accommodate a semiconductor die 330. This central opening may be preferably about 0.3 to 1.5 millimeter (mm) on a side larger than the die 330.

Inner ends 312a, 314a and 316a of the leads 312, 314 and 316, respectively, are each TAB bonded with bumps 318, preferably gold bumps, to "bond sites" 332 on the top circuit-containing surface (circuits not illustrated) of the die 330. This is a well known procedure. The bumps may be on the leads, on the die, or the inner ends of the leads may be TAB bonded to the die without using bumps (See U.S. Pat. No. 4,842,662).

Inner end portions 312b, 314b and 316b of the leads 312, 314 and 316, respectively, span the gap between the outer edge of the die 330 and the inner edge 322 of the polyimide layer 320. As indicated hereinbefore, the distance between the die and the inner edge 322 of the polyimide layer 320 is approximately 1.0 mm. Generally, this is according to established TAB procedures.

As will be seen, the inner end portion of selected leads, in this example the lead 312, are broken and bent downward past the polyimide layer 320 to contact a second conductive plane. This is a marked departure from established TAB procedures.

Intermediate portions 312c, 314c and 316c of the leads 312, 314 and 316, respectively, are supported by the polyimide layer 320. This is according to established TAB procedures.

According to the invention, a second conductive layer 340 is affixed to the underside of the polyimide layer 320 (opposite the first conductive layer 310) using a suitable adhesive 350, such as a 2 mil thick layer of epoxy. The second conductive layer 340 is formed as a square, relatively (vis-a-vis the layer 310) rigid ring, having an inner peripheral edge 342 forming an opening slightly (on the order of 0.5 mm) smaller than the opening formed by the inner edge 322 in the polyimide layer 320, and slightly (on the order of 0.5 mm) larger than the die 330. Hence, an inner edge portion 344 of the second conductive layer 340 is exposed within the opening formed by the inner edge 322 in the polyimide layer 320, on the order of 0.5 mm all around the inner edge 322 of the polyimide layer 320.

According to the invention, the inner end portion 312b of the selected leads 312 is severed (cut) at the inner edge 322 of the polyimide layer 320. Hence, the inner end portion 312b has one end 312a bonded to the die 330, and another "free" end 312d. The free end 312d is bent downward, past the polyimide layer 320, and using a TAB bonding technique, either with bumps or without (U.S. Pat. No. 4,842,662 illustrates bonding without bumps), or other suitable TAB bonding technique, the free end 312d of the selected lead 312 is bonded to the exposed inner edge portion 344 of the second conductive layer 340. In this manner, a connection is made from selected bond sites 332 on the die, via the very short inner end portions 312b of selected traces 312, to a second conductive layer 340 which is discrete and offset from the first conductive (signal) layer 310.

In a similar manner, the selected leads 312 are connected to an outer edge portion 346 of the second conductive layer 340, as follows. The polyimide layer 320 has an outer edge 324. The leads 312, 314 and 316 extend beyond this edge 324 a suitable distance for allowing connection of the outer ends 312e, 314e and 316e of the leads 312, 314 and 316, respectively, to external systems and components, such as on a printed circuit board, or via the intermediary of a socket.

Slightly, on the order of 1.0 mm within the outer edge 324 (i.e., within the four outer edges) of the polyimide layer 320, there is provided an elongated slot 326 through the polyimide layer, paralleling the respective edge 324. The slot 326 has an outer edge 326a and an inner edge 326b, and is on the order of 0.5 mm wide (width determined from outer edge 326a to inner edge 326b).

The second conductive layer 340 extends outward beyond and underneath the slot 326, so that the outer edge portion 346 of the second conductive layer 340 is exposed within a "window" formed by the slot 326.

Outer end portions 312f, 314f and 316f of the leads 312, 314, and 316, respectively, span the slot 326. The outer end portion 312f of selected leads 312 (one illustrated) are severed (cut) at the inner edge 326b of the slot 326. Hence, the outer end portion 312f has one end 312e extending beyond the outer edge 324 of the polyimide layer 320, and partially supported thereby (by the portion of the polyimide layer between the slot and the outer edge of the polyimide layer), and another "free" end 312g. The free end 312g is bent downward, through the slot 326, past the polyimide layer 320, and using a TAB bonding technique such as is disclosed in the aforementioned U.S. Pat. No. 4,842,662, or other suitable TAB bonding technique, the free end 312g is bonded to the exposed outer edge portion 346 of the second conductive layer 340, in a manner similar to the bonding of the free inner end 312d to the exposed inner edge portion 344 of the second conductive layer 340. In this manner, a connection is made from selected outer lead ends 312e which are external to the semiconductor device assembly, via relatively short outer end portions 312f, to the second conductive layer 340.

Figure 3B:
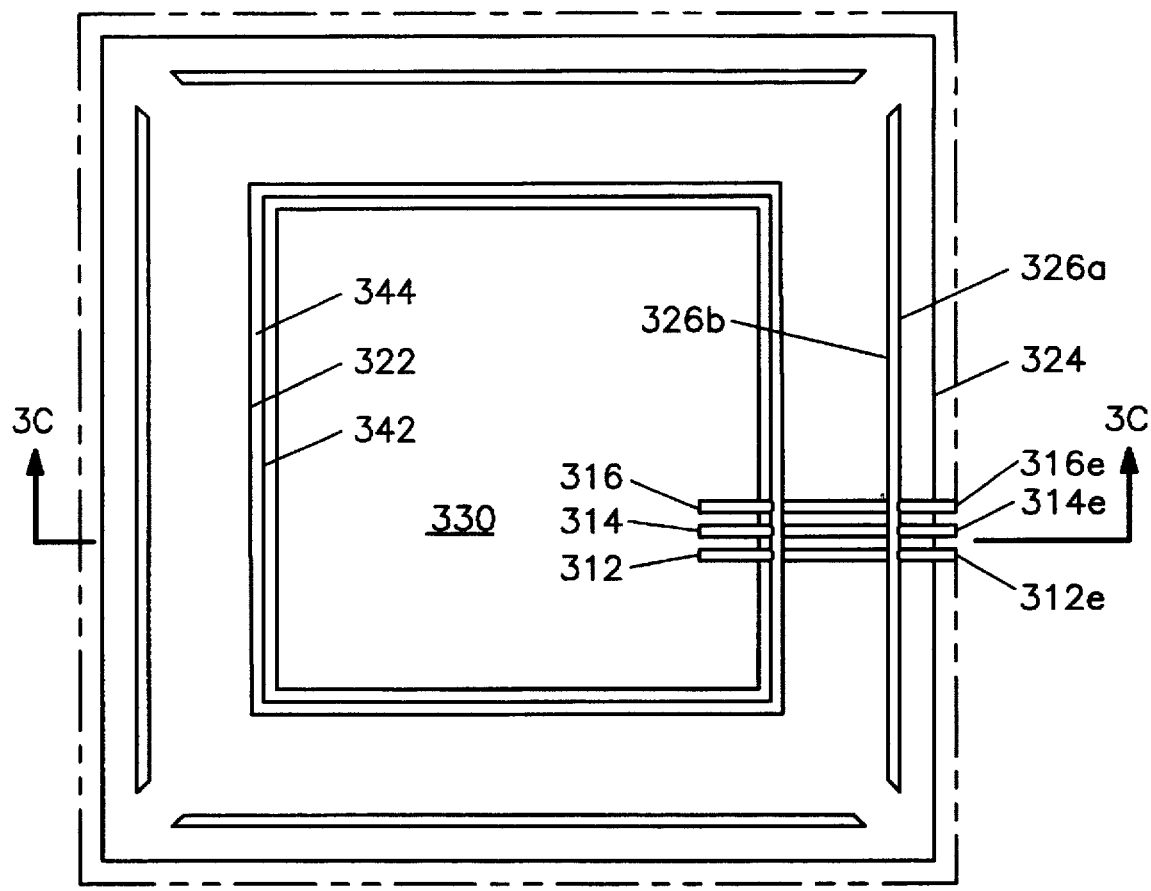
FIG. 3B is a top plan view of a semiconductor device assembly of the system of the present invention formed according to the technique of FIG. 3A.
Figure 3C:
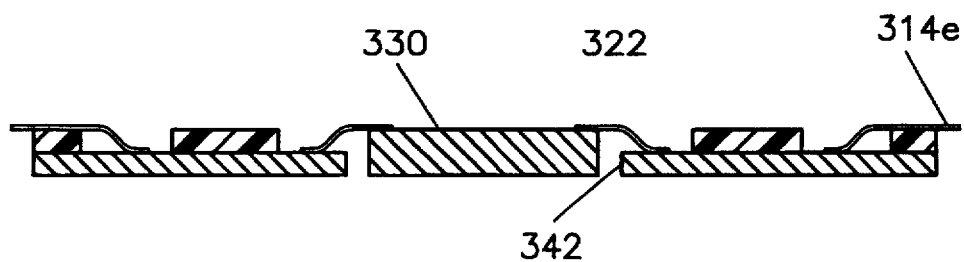
FIG. 3C is a cross-sectional view of the semiconductor device assembly of FIG. 3B.

FIGS. 3B and 3C illustrate more complete views of the entire semiconductor device assembly 300 than is illustrated in FIG. 3A. However, only three leads 312, 314 and 316 are illustrated, for clarity. The polyimide layer 320 is formed as a square ring. As mentioned hereinbefore, the polyimide layer 320 is provided with a central opening formed by its inner peripheral edge 322, which opening 322 may be preferably about 0.3 to 1.5 millimeter (mm) on a side larger than the die 330. The inner edge portion 344 of the second conductive layer 340, which is also formed as a square ring, extends from under the polyimide layer 320 to about midway between the inner edge 322 of the polyimide layer and the outer periphery of the die 330.

The "second conductive plane" established by the second conductive layer 340 provides either ground or power from external ground or power sources to the die, while the first conductive layer having individual lead traces is employed preferably for signals entering and exiting the semiconductor device from external sources. Preferably, the second conductive plane is connected to ground, for the electrical benefits that will accrue, as discussed hereinabove.

The second conductive layer may be used for all ground connections to the die. Ground connections typically number about 10 to 20 percent of the total number of leads, or about 40 to 80 leads (e.g., 312) out of about 400 total leads (312 plus 314 plus 316) on the TAB tape substrate. In addition, another about 10 to 20 percent of the total number of leads, or about 40 to 80 leads (non-ground) leads in the signal layer (310) may be suitably employed for power, leaving the majority of the leads available for signals.

Hence, as illustrated in FIGS. 3A–3C, a separate, second conductive plane is established for ground (or power) connections to a semiconductor device, and the second conductive plane is offset and insulated from a first conductive plane having signal traces. Significantly (considering an area defined by the polyimide, within the slots 326), there are no traces (e.g., 312) or portions thereof (namely 312c) providing a ground (or power) connection for the semiconductor device. In other words, in the first conductive plane (e.g., 310) the conductive traces carry only signals (and power) to and from the semiconductor device, and none of the intermediate portions (312c) of the traces are connected to ground (or power)—i.e., there are no "parallel" paths in the signal layer as there are in the two metal layer TAB tape illustrated in FIGS. 2A and 2B.

By way of definition, the term "substrate" is used to refer to the assembled layers 310, 320 and 340. The term "partial substrate" is used to refer to only some of those layers.

Preferably, the epoxy layer 350 does not extend completely to the edges 322 and 326b of the polyimide layer, but may be recessed about 0.05 mm inward of those edges.

In FIG. 3A, it is evident that the inner and outer ends of the intermediate portions 312c may become "stretched" over the respective polyimide edges 322 and 326b when the respective inner and outer end portions 312b and 312f of the traces 312 are cut and bent downward. It is evident from FIG. 3A, that the inner end portions 312b are connected to the inner edge portion 344 of the second conductive layer in an "opposite" orientation than the outer end portions 312f are connected to the outer edge portion 346. However, in both cases, the free ends 312d and 312g are oriented towards each other and toward the disconnected intermediate portions 312c underneath which the second conductive layer 340 is disposed.

Although discussed in greater detail hereinbelow, it is important to note that the present technique differs from that disclosed in the aforementioned U.S. Pat. No. 4,842,662 in at least one very significant way. Generally, in the aforementioned patent, an already free end of a lead (24) is simply "downset" and bonded to a die (10). In the present invention, free ends (312d and 312g) are created by the action of forcing the lead down past the respective edge (322 and 326b) of the polyimide layer 320. In other words, the selected leads 312 are cut along their length in order to create the free ends 312d and 312g. These free ends 312d and 312g are not the "normal" free end 312a that the aforementioned patent is intending to bond to a die.

The preferred sequence of assembly is:

(a) provide a tape (partial substrate) having only signal traces (e.g., the first conductive layer 310) and the plastic support layer (e.g., the polyimide layer 320);

(b) locate the die (330) in the central opening (formed by edges 322) in the plastic support layer;

(c) connect the die to the inner ends of the signal traces (e.g., 312 and 314) using a TAB process (either bumped or bumpless);

(d) affix a second conductive plane (e.g., 340), having a smaller central opening (formed by inner edge 342) than the central opening in the plastic support layer, using a suitable adhesive (350), to the plastic support layer opposite the first conductive layer, so that an inner edge portion (344) of the second conductive layer is exposed in the opening of the plastic support layer;

(e) break, bend and bond free ends (312d) of inner end portions (312b) of selected traces (312) to the exposed inner edge portion (344) of the second conductive layer;

(f) break, bend and bond free ends (312g) of outer end portions (312f) of the same selected traces to an outer edge portion (346) of the second conductive layer exposed by a slot (326) near the outer edge of the plastic support layer; and (g) complete assembly of the semiconductor device assembly using normal TAB process flow, i.e., encapsulating the die, etc.

The steps (e) and (f) are preferably performed with a thermosonic TAB bonding process, discussed hereinbelow. However, such bonding may be bumpless, or may be reflow or thermocompression bonding, or may employ reflow solder bumps. Reflow bonding usually involves tin-on-tape, and gold bumps. Thermocompression bonding usually employs gold bumps, combined with force and high temperature.

The advantages of the present inventive technique over the two metal layer TAB tape (FIGS. 2A and 2B) include reduced cost, design flexibility, added mechanical support for the substrate and the finished semiconductor device assembly, no limitations on inner lead via hole pitches (compare FIG. 2B), better electrical performance by avoiding parallel ground paths, and better thermal performance.

Regarding design flexibility, it is evident that a "generic" TAB tape can be formed for a variety of semiconductor devices with various "pin-outs" (which pins are designated for signal, power and ground), and then (later) certain leads (312) can be selected for connection to the second (ground) plane. This is not possible with the two-metal-layer TAB tape of FIGS. 2A and 2B, which must be customized for each semiconductor device having a different pin-out.

Further, with the addition of a second electrically unique plane into a TAB package, the semiconductor device assembly will perform better, the ratio of input/output connections versus ground connections will be reduced, and mechanical support will be added to a relatively flexible package. Obtaining these advantages at the relatively low cost afforded by the present inventive technique makes for an attractive semiconductor packaging technique to be used with the system of the present invention.

The second conductive layer 340 can be made of any electrically conductive material. The thickness of the second conductive layer can range from very thin, on the order of one mil, to very thick, on the order of one inch. In any case, it is evident that the thickness of the second conductive layer 340 can be established as thick as desired, to provide additional support for the substrate and to provide enhanced thermal characteristics for the substrate, much more so than the second conductive foil layer employed in the two-metal-layer TAB tape illustratedn in FIGS. 2A and 2B.

Figure 3D:
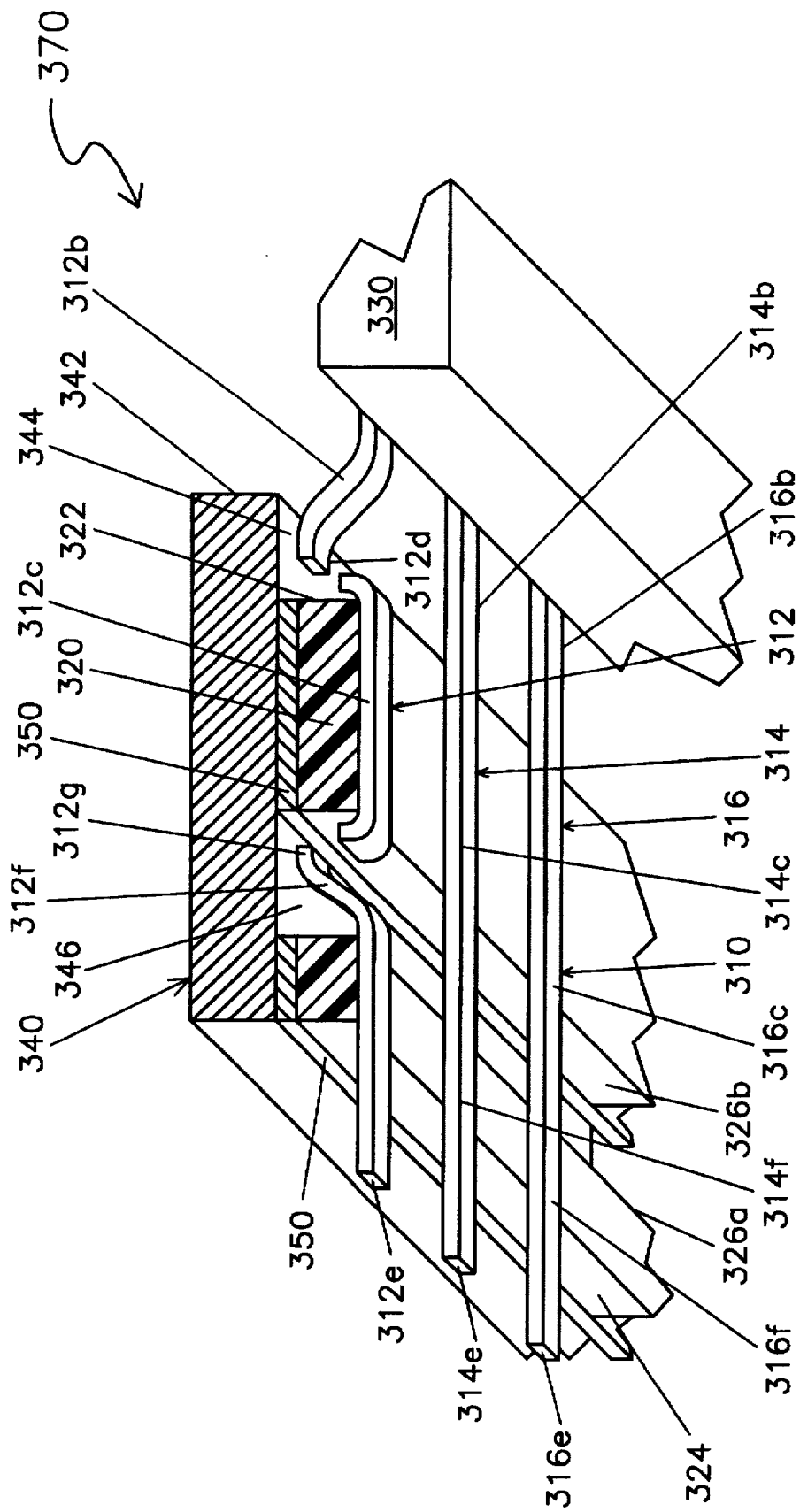
FIG. 3D is a perspective view, partially in cross-section, of an alternate embodiment of the multi-layer flexible substrate mounting a semiconductor die, with one additional conductive layer, according to the present invention.

FIG. 3D illustrates an alternate embodiment of a substrate 370, using the same components as the substrate 300 of FIG. 3A, but with the second conductive layer on top rather than below the first conductive layer. In this embodiment, the plastic layer 320 is disposed atop (on the other side of) the lead layer 310, and the second conductive layer 340 is disposed atop (rather than underneath) the plastic layer 320.

MULTI-LAYER FLEXIBLE SUBSTRATE HAVING SECOND AND THIRD CONDUCTIVE PLANES

FIGS. 2A and 2B illustrated a prior art technique of "two-metal-layer TAB tape", wherein an additional (second) foil layer was added and connected by vias through an insulating layer to the first, patterned, conductor layer. The disadvantages and limitations of such a technique have been discussed above.

It is also known to provide a "three-metal-layer TAB tape" by adding yet another foil layer to the two-metal-layer TAB tape. Evidently, this will create the need for yet more vias, thereby even more significantly reducing the number of lead traces available for I/O, and will suffer from the same limitations and disadvantages, discussed above, that apply to two-metal-layer TAB tape.

According to the present invention, a second and a third conductive layer are added to a TAB substrate, for carrying ground and power, so that the power and ground currents are isolated from the first signal layer. The disclosed technique is similar in many regards to that disclosed with respect to FIGS. 3A–3C.

Figure 4A:
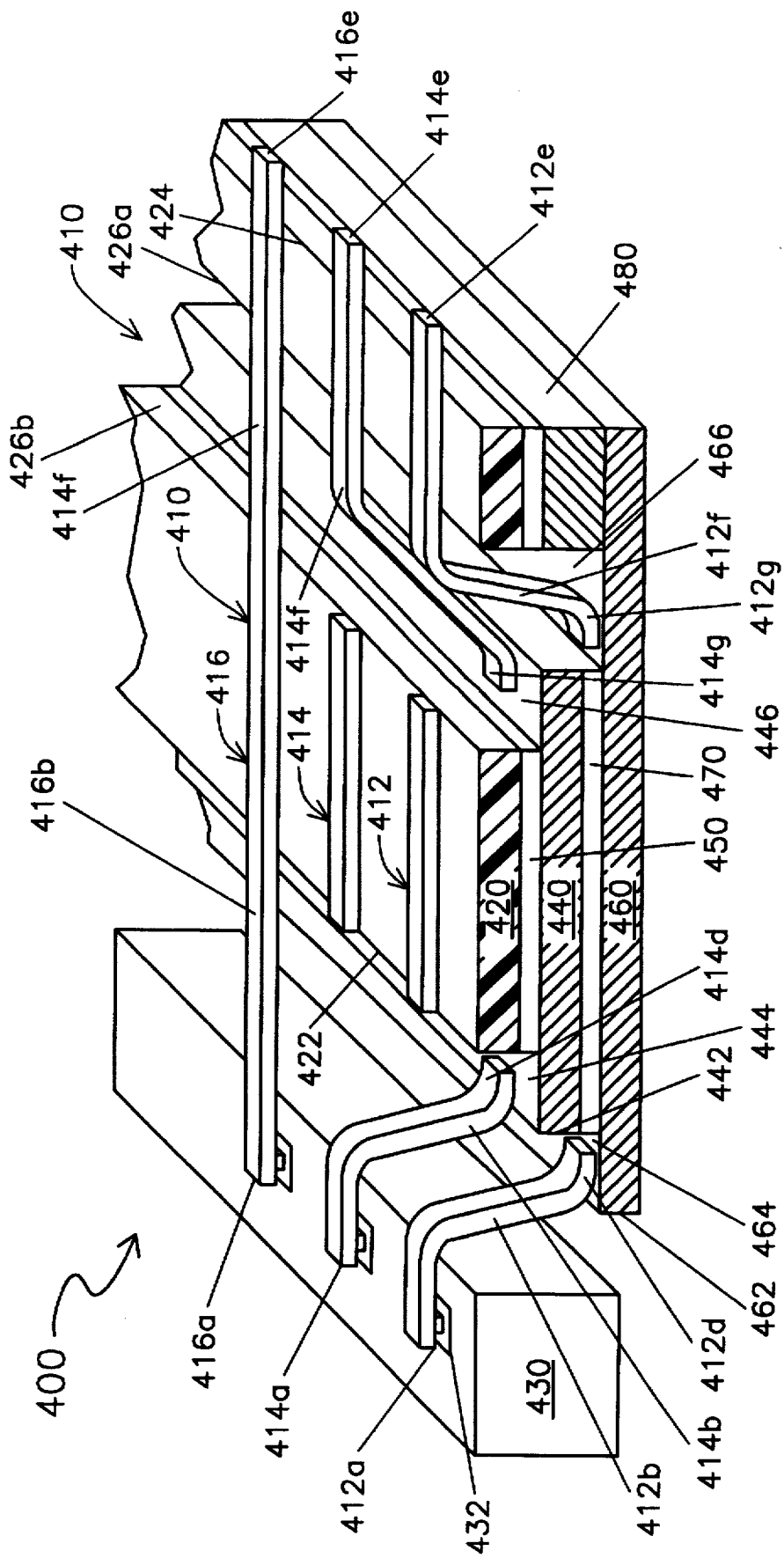
FIG. 4A is a perspective view, partially in cross-section, of a multi-layer flexible substrate mounting a semiconductor die, with two additional conductive layers, as used in the system of the present invention.
Figure 4B:
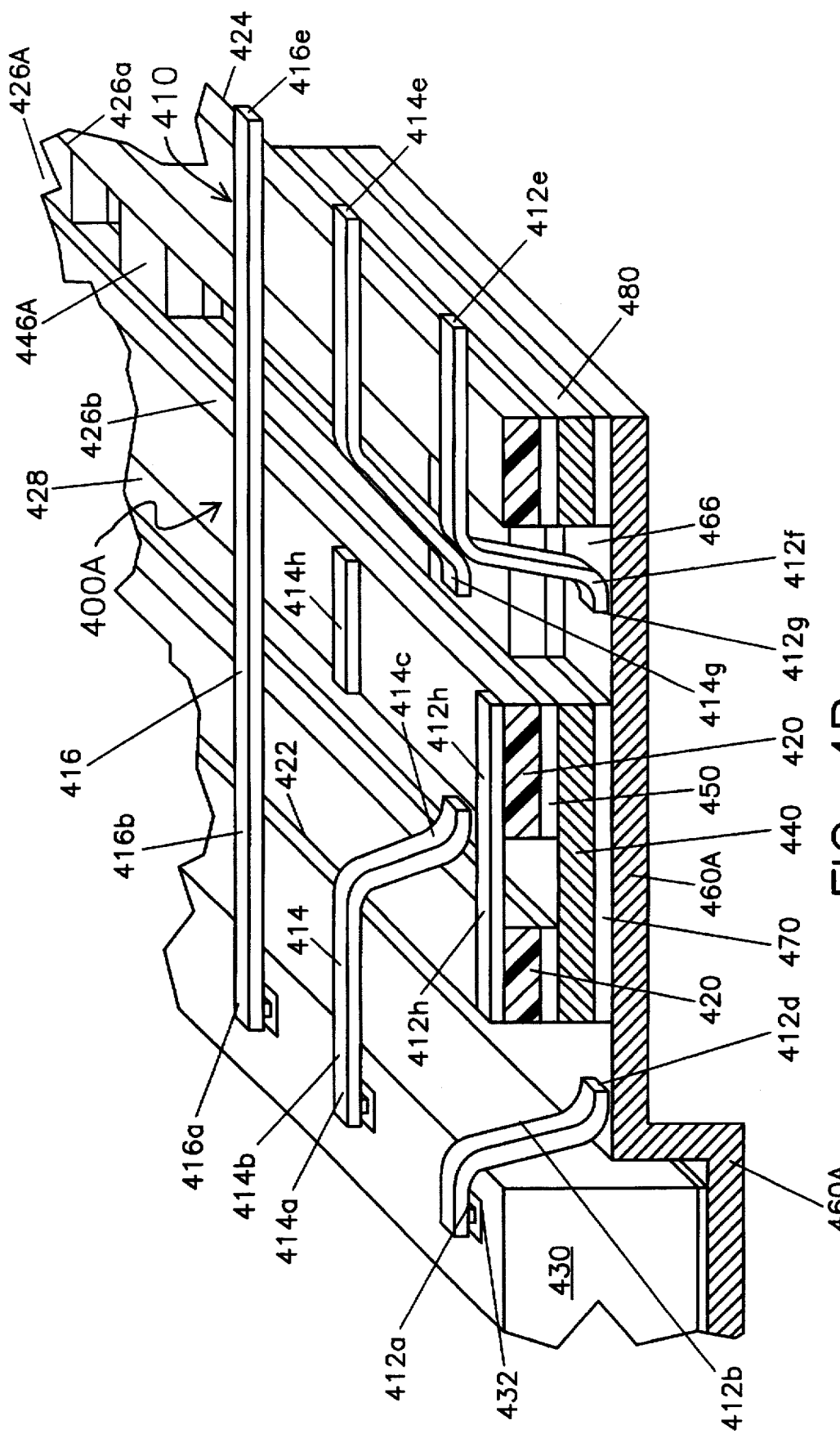
FIG. 4B is a perspective view, partially in cross-section, of a multi-layer flexible substrate having three conductive layers that additionally mounts a semiconductor die to the third conductive layer of the system of the present invention.

FIGS. 4A and 4B illustrate relevant portions of semiconductor device assemblies 400 and 400A, respectively, partially assembled (not encapsulated or lidded) and employing the inventive technique of breaking, bending and bonding selected and other selected leads to second and third conductive layers, respectively, using a TAB process. It will be appreciated, from the description that follows, that selected and other selected leads may be bent and bonded to one additional conductive layer, and may be connected by vias to another conductive layer. However, using vias is contrary to the general purpose of the present invention, which is to efficiently utilize all of the conductive traces without having to sacrifice lead traces (e.g., FIGS. 2B) for the purpose of connecting power or ground.

A first conductive layer 410 is patterned to have a plurality of fine-pitch conductive leads (traces) 412, 414 and 416 (only three illustrated, for illustrative clarity). The first conductive layer 410 is supported by an underlying insulating layer 420. The first conductive layer 410 may be formed of a thin copper foil, on the order of one mil thick. The insulative layer 420 may be formed of a thin plastic layer, such as polyimide, preferably 3 to 5 mils thick.

The polyimide layer 420 has a central opening formed by its inner peripheral edge 422, and the opening is sufficiently large to accommodate a semiconductor die 430. The opening 422 is larger than the die 430. Generally as illustrated in FIG. 4A, the opening formed by the inner edge 422 of the polyimide layer 420 must be twice as large as the corresponding opening 322 of the FIG. 3A embodiment. In FIG. 4B, the opening formed by the inner edge 422 may be the same size as the opening 322 since only one level of bonding is contemplated in the central opening.

Inner ends 412a, 414a and 416a of the leads 412, 414 and 416, respectively, are each connected to "bond sites" 432 on the top of the die 430, preferably using bumped or bumpless TAB techniques. Inner end portions 412b, 414b and 416b of the leads 412, 414 and 416, respectively, span the gap between the outer edge of the die 430 and the inner edge 422 of the polyimide layer 420. Referring to FIG. 4A, the inner end portions of selected leads, in this example the leads 412 and 414 are broken and bent downward past the polyimide layer 420 to contact second and third conductive planes, respectively, in the central opening (FIG. 4A). Referring to FIG. 4B, only leads 412 are broken and bent downward past the polyimide layer 420 to contact the third conductive (ground) plane/heat-spreader 460A. The embodiment illustrated in FIG. 4B allows a smaller central opening than that of FIG. 4A.

The lead pitch (spacing of the leads) is smallest at the die 430. Therefore, when only selected other leads 412b (ground) are downbonded to the ground plane 460A, which is also in electrical communication with the substrate of the die 430, there is less risk of the selected leads 414b (power) shorting to an edge of the die 430. A downbond slot 428 positionally biased toward the edge 422 of the insulating layer 420 may be utilized to downbond selected leads 414c to the second conductive plane (power) 440. Intermediate portions 412h, 414h and 416h of the leads 412, 414 and 416, respectively, are supported by the polyimide layer 420 but are not connected.

According to the invention, a second conductive layer 440 is affixed to the underside of the polyimide layer 420 (opposite the first conductive layer 410) using a suitable adhesive 450, such as a layer of epoxy. The second conductive layer 440 is formed as a square, relatively (vis-a-vis the layer 410) rigid ring, having an inner peripheral edge 442 forming an opening slightly (on the order of 0.5 mm) smaller than the opening formed by the inner edge 422 in the polyimide layer 420 (FIG. 4A). Hence, an inner edge portion 444 of the second conductive layer 440 is exposed within the opening formed by the inner edge 422 in the polyimide layer 420.

According to the invention, the inner end portion 414b of the selected lead 414 is severed (cut) at the inner edge 422 of the polyimide layer 420. Hence, the inner end portion 414b has one end 414a bonded to the die 430, and another "free" end 414d. The free end 414d is bent downward, past the polyimide layer 420 and, preferably using a bumpless TAB bonding technique, the free end 414d of the selected lead 414 is bonded to the exposed inner edge portion 444 of the second conductive layer 440. In this manner, a connection is made from selected bond sites 432 on the die, via the very short inner end portions 414b of selected traces 414, to a second conductive layer 440 which is discrete and offset from the first conductive (signal) layer 410. This is similar to the second conductive plane 340 of FIG. 3A.

In this embodiment 400, a third conductive plane 460 is provided beneath the second conductive plane 440, and is electrically isolated therefrom by an insulating layer 470. The insulating layer is preferably a polyimide layer, but can be an adhesive (e.g., epoxy). In practice, a sub-assembly comprising the second conductive layer 440, the insulating layer 470 and the third conductive layer 460 may be formed separately from the remainder of the substrate (i.e., the layers 410 and 420), and then bonded thereto with the adhesive 450. Ultimately, as will become evident, the second conductive layer can be used for connecting power from an external source to the die, and the third conductive layer 460 can be used for connecting the die to ground. In this manner, the layers 440 and 460, separated by the insulating layer 470 form a built-in (within the ultimate packaged semiconductor device assembly) bypass capacitor for the power and ground connections, which has numerous electrical advantages readily apparent to those skilled in the art. To this end, the layer 470 can be selected from materials of having suitable dielectric constant and thickness to establish a desired built-in capacitance.

The third conductive layer 460 is preferably formed of metal, preferably by stamping, and may be thicker than a foil for the purpose of forming a substantially ridged assembly. The third conductive layer 460 may have a central opening defined by its inner edge 462 which is on the order of 0.5 mm smaller than the opening formed by the edge of the second conductive layer 440. In this manner, an inner edge portion 464 of the third conductive layer 460 is exposed within the openings in both the polyimide layer 420 and the second conductive layer 440 (FIG. 4A). The layers 420 and 440 (FIG. 4B) may also have the same size central openings. In the assembly 400A, illustrated in FIG. 4B, the downbond slot 428 is utilized to downbond the leads 414c to the second conductive plane 440.

According to the invention, the inner end portion 412b of a selected lead 412 is severed (cut) at the inner edge 422 of the polyimide layer 420. Hence, the inner end portion 412b has one end 412a bonded to the die 430, and another "free" end 412d. The free end 412d is bent downward, past the polyimide layer 420 and, preferably using a bumpless TAB bonding technique, the free end 412d of the selected lead 412 is bonded to the exposed inner edge portion 464 of the third conductive layer 460. The die 430 bond sites 432 may be connected by the selected traces 412b to a third layer 460. The third layer 460 is a discrete conductive plane offset from both the first conductive (signal) layer 410 and the second conductive layer 440 (FIG. 4A). The die 430 bond sites 432 may also be connected by selected leads 414d to the second layer 440 at the surface 444 (FIG. 4A) or, alternatively, by selected leads 414c downbonded in slot 428 (FIG. 4B).

Evidently, to implement the breaking and bending down of the leads (412 and 414) to the two additional levels (460 and 440, respectively) it is important that the inner end portions of the leads being bent downward to the third conductive layer 460 be sufficiently long to reach same. Particular dimensions will depend upon particular applications, especially upon the thickness of the layers between the leads of the first conductive plane and the second or third conductive plane that is being downbonded thereto.

In the manner set forth above, it is taught how selected leads connected to the die can be cut, bent and connected to two additional conductive planes (layers), especially for making power and ground connections. In a manner similar to that illustrated in FIG. 3A, the outer ends of the selected leads are also connected to the outer edge portions of the additional two conductive planes.

The selected leads 414 are connected to an outer edge portion 446 of the second conductive layer 440, as follows. The polyimide layer 420 has an outer edge 424. The leads 412, 414 and 416 extend beyond this edge 424 a suitable distance for allowing connection of the outer ends 412e, 414e and 416e of the leads 412, 414 and 416, respectively, to external systems and components, such as on a printed circuit board, or via the intermediary of a socket.

Proximate to the outer edge 424 (i.e., within the four outer edges) of the polyimide layer 420, there is an elongated slot 426 through the polyimide layer, paralleling the respective edge 424. The slot 426 (FIG. 4A) has an outer edge 426a and an inner edge 426b, and may be, for example, 1.0 mm wide (twice the width of the slot 326, FIG. 3A).

The second conductive layer 440 extends outward partially, such as by at least 0.5 mm, underneath the slot 426, so that the outer edge portion 446 of the second conductive layer 440 is exposed within a "window" formed by the slot 426 (FIG. 4A). Outer end portions 412f, 414f and 416f of the leads 412, 414 and 416, respectively, span the slot 426.

The outer end portion 414f of selected leads 414 (one illustrated) are severed (cut) at the inner edge 426b of the slot 426. Hence, the outer end portion 414f has one end 414e extending beyond the outer edge 424 of the polyimide layer 420, and partially supported thereby (by the portion of the polyimide layer between the slot and the outer edge of the polyimide layer), and another "free" end 414g. The free end 412g is bent downward, through the slot 426, past the polyimide layer 420, and is bonded to the inner exposed (through the slot 426) edge 446 of the second conductive layer 440. In this manner, a connection is made from selected outer lead ends 414e which are external to the semiconductor device assembly, via relatively short outer end portions 414f, to the second conductive layer 440.

In contrast to the structure of FIG. 3A, wherein the second conductive layer 340 extended fully past the slot 326, in this embodiment 400, the second conductive layer 440 extends only partially (e.g., halfway) into the slot area. As will be hereinafter discussed, the remaining half of the slot area is required for connecting to an exposed (through the slot 426) outer edge portion 466 of the third conductive layer 460.

The outer end portion 412f of selected leads 412 (one illustrated) are severed (cut) at the inner edge 426b of the slot 426. Hence, the outer end portion 412f has one end 412e extending beyond the outer edge 424 of the polyimide layer 420, and partially supported thereby (by the portion of the polyimide layer between the slot and the outer edge of the polyimide layer), and another "free" end 412g. The free end 412g is bent downward, through the slot 426, past the polyimide layer 420, past the second conductive layer 440, and is bonded to the inner exposed (through the slot 426) portion 466 of the third conductive layer 460. In this manner, a connection is made from selected outer lead ends 412e which are external to the semiconductor device assembly, via relatively short outer end portions 412f, to the third conductive layer 460.

Whereas in FIG. 3A, the second conductive layer 340 extended to the outer edge of the polyimide layer 320, to the edge 324 thereof, we have seen that in this embodiment 400 such is not feasible since it is desired to leave space past the second conductive layer 440 for access to the third conductive layer 460. Hence, as illustrated in FIG. 4A, a suitable spacer block 480 is between the top surface of the third conductive layer 460 and the lower surface of the polyimide layer 420, in an unsupported area of the polyimide layer 420 between its outer edge 424 and the edge 426a of the slot 426. The spacer block 480 can be formed as a separate element, and bonded with the epoxy 450 to the underside of the polyimide layer 420, or it may be a continuation of the layers 420, 450 and 440.

In the example illustrated in FIG. 4A, the ends of the intermediate portions of the cut and bent conductors 412 and 414 are illustrated not stretched over the respective edges 422 and 426b of the polyimide layer for clarity. However, it is desirable to partially stretch and bend the conductors 412 and 414 over the edge 426b as more fully described hereinafter.

Figure 4C:
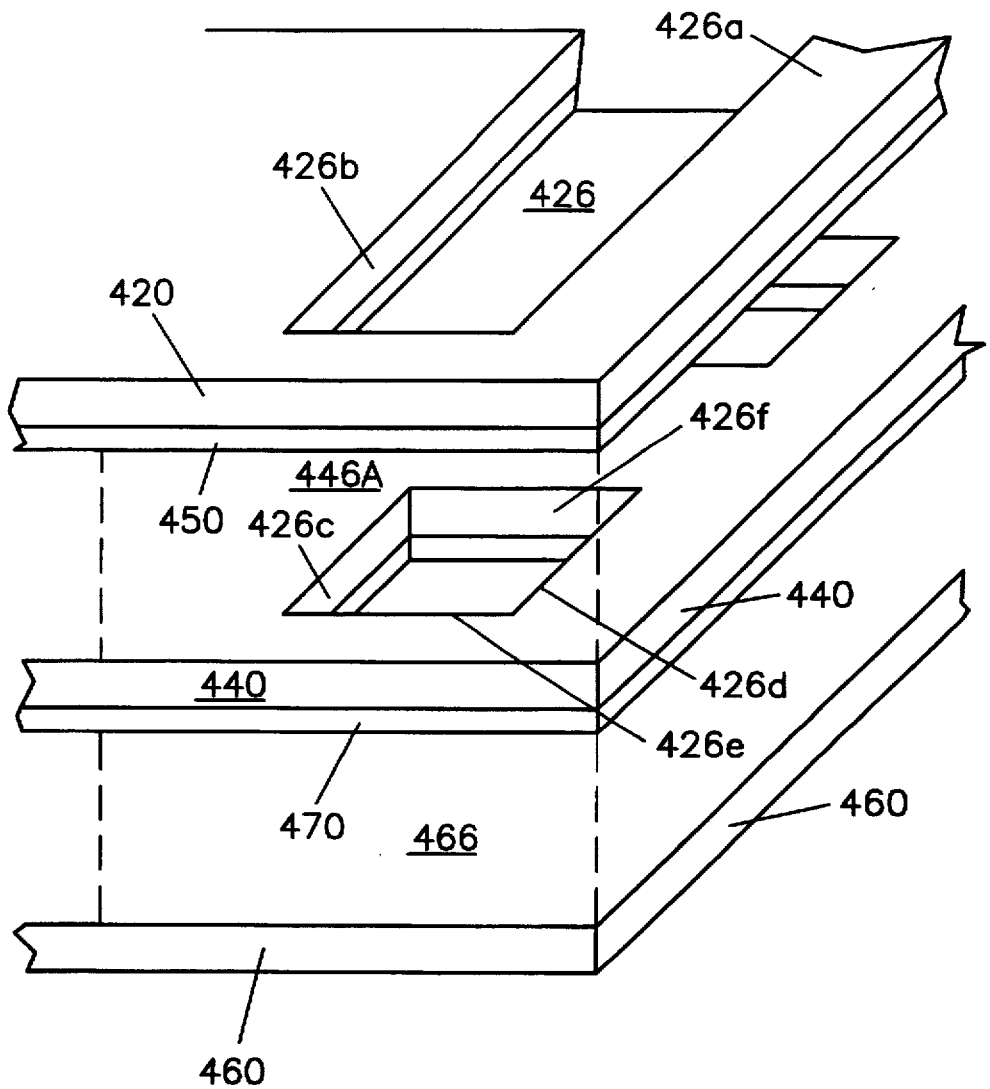
FIG. 4C is perspective exploded view of a partial section of the substrate illustrated in FIG. 4B.
Figure 4D:
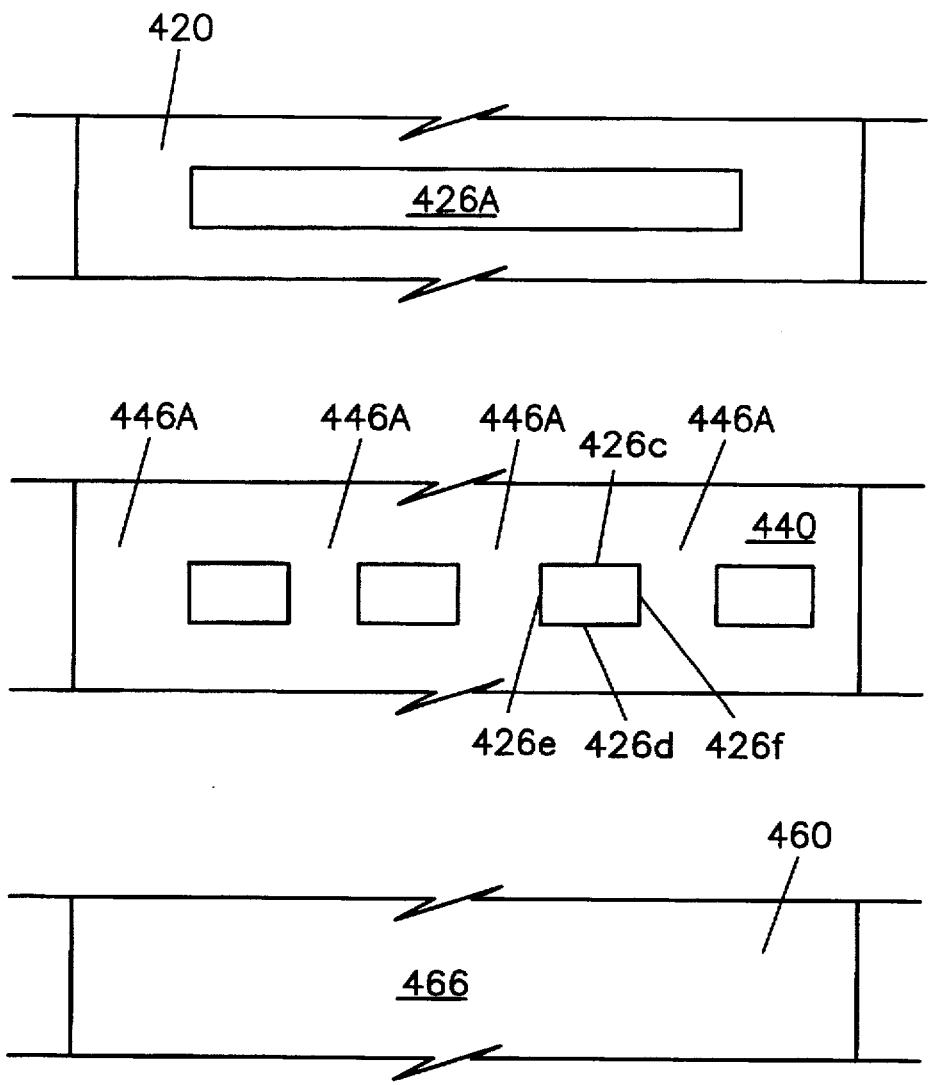
FIG. 4D is a plan view of the substrate layers illustrated in FIGS. 4B and 4C.

Referring to FIGS. 4B–4D, another embodiment of the present invention is illustrated. Contiguous subgroups of leads may be predefined and adapted for downbonding to either the ground or power planes of tape ball grid array ("TBGA") or chip tape heat sink ("CTHS") packages. This embodiment of the present invention utilizes pre-established assignments of downbond locations for ground and power within the TBGA, TAB, or chip on tape ("COT") packages. This allows a more easily manufactured downbond process that is not so dependent on lead forming.

In FIG. 4B, the insulating layer 420 is formed with an elongated slot 426A having an outer elongated edge 426a and an inner elongated edge 426b. The slot 426 forms a window as more clearly illustrated in FIG. 4D. The second conductive layer 440 has a plurality of subwindows defined by edges 426c, 426d, 426e and 426f. These subwindows are arranged in an elongated row that match the elongated slot 426A in the insulating layer 420 (FIG. 4D).

Layers 420, 440 and 460 may be laminated together with insulating adhesives 450 and 470. The adhesives 450 and 470 insulate the conductive layers 440 and 460, respectively, as more fully described above. When the layers 420, 440 and 460 are assembled, they form a first elongated slot 426A through the insulating layer 420, alternating subwindows having ground surfaces 466 and power surfaces 446A. The subgroups of leads 412 are downbonded to the ground surface 466. The subgroup of leads 414 are downbonded to the power surface 466A.

An advantage of the embodiment of FIGS. 4B–4D is that a simpler downbonding process is achieved because forming of the leads 412 and 414 is not as critical as those of FIG. 4A. Shorting of the downbonded lead 412 and 414 to undesired conductive layers (440 or 460) is substantially eliminated compared to the embodiment of FIG. 4A. In addition, the slot 426A of FIG. 4B may be narrower in width than the slot 426 of FIG. 4A (similar to the width of slot 326 of FIG. 3A). Groups of conductors are designated to fall within respective power (surface 466A) or ground (surface 466) subwindows and be bonded thereto. This allows greater spacing between the endmost conductors of adjacent subwindows in accordance with the demands of the overall pitch, alignment and other manufacturing tolerances required.

Figure 4E:
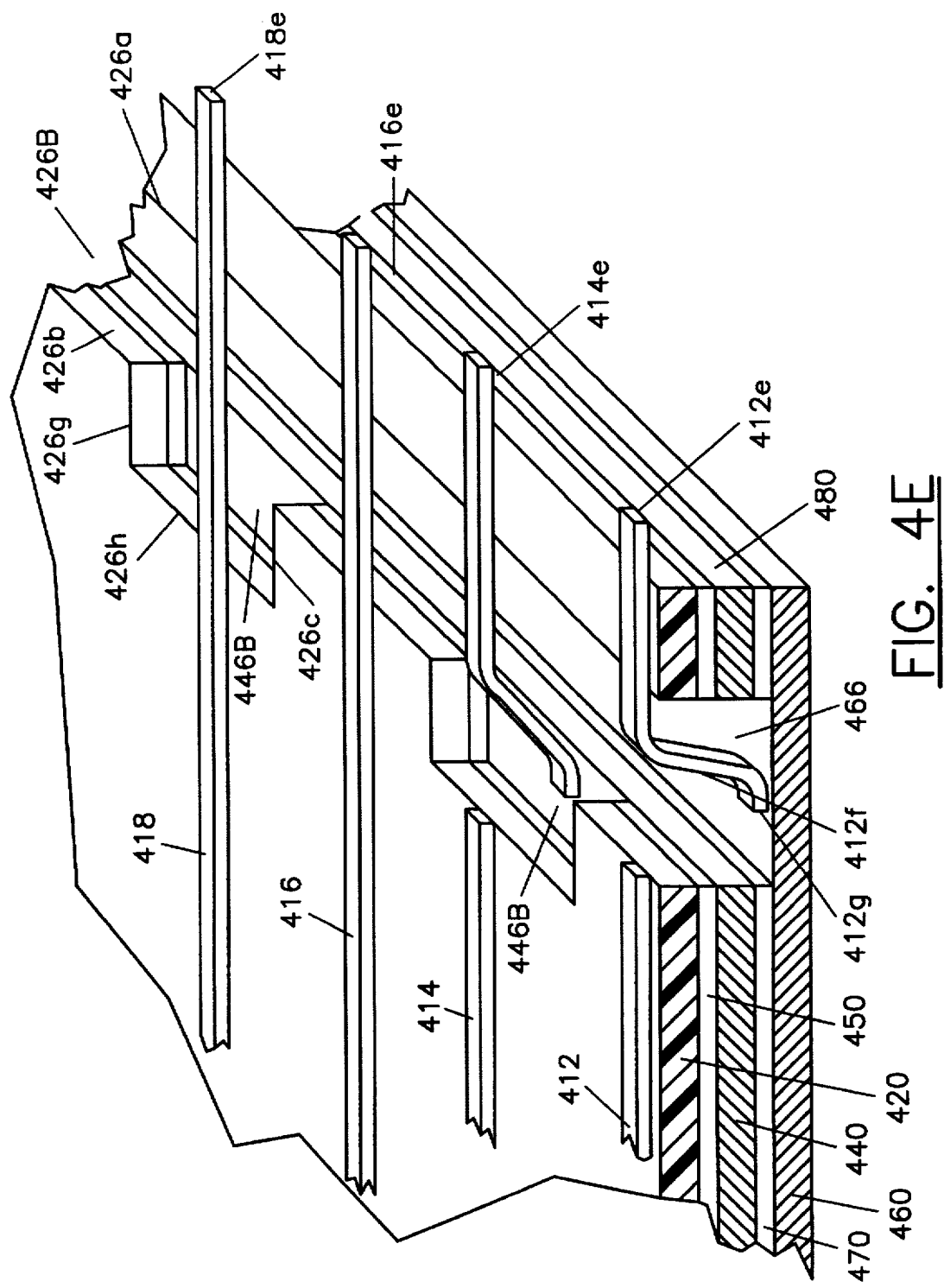
FIG. 4E is a perspective view, partially in cross-section, of yet another multi-layer flexible substrate mounting a semiconductor die, with two additional conductive layers, according to the present invention.
Figure 4F:
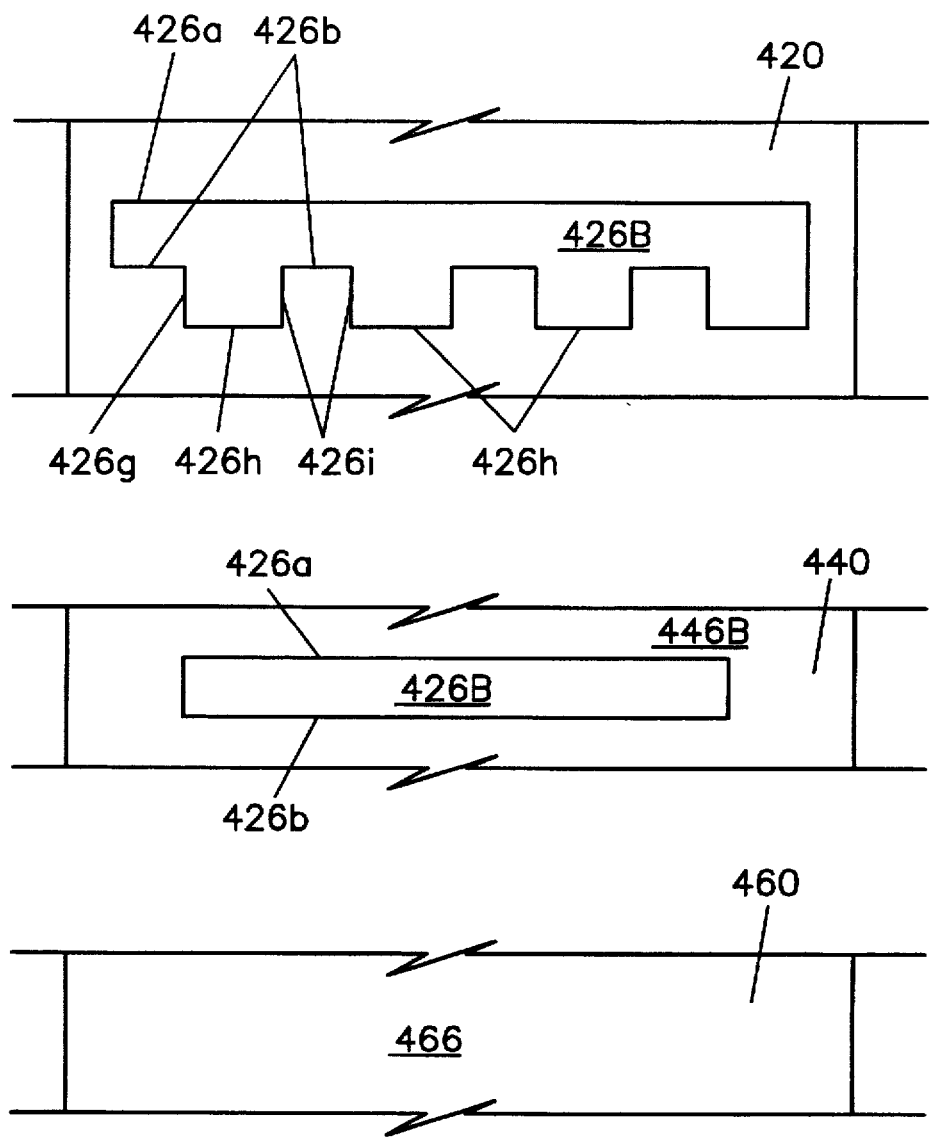
FIG. 4F is a plan view of the substrate layers illustrated in FIG. 4E.

Still another embodiment of the present invention is illustrated in FIGS. 4E and 4F. Subgroups of leads are again defined by having alternate downbonding to the ground and power planes of the TBGA or CTHS packages.

The insulating layer 420 is formed with an elongated slot 426B having alternating narrow and wider portions. An outer elongated edge 426a is on the side of the slot 426B toward the outer ends 412e, 414e, 416e and 418e of leads 412, 414, 416 and 418, respectively. An inner edge comprises alternating narrow (426b) and wide (426h) portions. The wide portions are formed as subwindows having three sides 426g, 426h and 426i. These subwindows are opposite the outer elongated edge 426a and form the wide portions of the slot 426B.

Layers 420, 440 and 460 are laminated together with insulating adhesives 450 and 470. The adhesives 450 and 470 insulate the conductive layers 440 and 460, respectively, as more fully described above. When the layer 420, 440 and 460 are together, they form an elongated slot 426 through the insulating layer 420 having alternating wide and narrow portions giving access to the power surfaces 466B and ground surfaces 446, respectively. The subgroups of leads 412 are downbonded to the ground surface 466. The subgroup of leads 414 are downbonded to the power surface 466B.

An advantage of the embodiment of FIGS. 4E and 4F is that there is superior alignment of the leads with the downbond groups and the bonding of even adjacent ground and power leads to their respective planes may be accomplished in as small as a 250 micrometer pitch.

The preferred sequence of assembling the TAB tape having two additional layers (440 and 460) is:

(a) provide a tape (partial substrate) having only signal traces (e.g., the first conductive layer 410) and the plastic support layer (e.g., the polyimide layer 420);

(b) locate the die (330) in the central opening (formed by edges 422) in the plastic support layer;

(c) connect the die to the inner ends of the signal traces (e.g., 412 and 414);

(d) sub-assembly the second and third conductive layers (440 and 460) together, including an insulating layer (470) therebetween, and a spacer element (480) if required;

(e) affix the sub-assembly (440, 470, 460, 480) to the plastic support layer opposite the first conductive layer, using a suitable adhesive (450);

(f) break, bend and bond free ends (414d) of inner end portions (414b) of selected traces (414) to the exposed inner edge portion (444) of the second conductive layer (440), and break, bend and bond free ends (412d) of inner end portions (412b) of selected other traces (412) to the exposed inner edge portion (464) of the third conductive layer (460);

(g) break, bend and bond free ends (414g and 412g) of outer end portions of the same selected and selected other traces (414 and 412) to outer edge portions (446 and 466) of the second and third conductive layers (440 and 460), through a slot (426) near the outer edge of the plastic support layer; and (h) complete assembly of the semiconductor device assembly using normal TAB process flow, i.e., encapsulating the die, etc.

Steps (f) and (g) are preferably performed with a thermosonic TAB bonding process, discussed hereinbelow. However, such bonding may be bumpless or may employ bumps.

In any of the embodiments described herein, it is clearly possible that the conductors are bonded to the die and to the additional (second and third) conductive layers using bumps, solder balls, or the like, rather than a bumpless TAB process. Nevertheless, the inventive concept of cutting, bending and bonding to underlying additional conductive layers is entirely applicable to non-TAB flexible substrates, however they may be formed.

REDUCED CIRCUIT DENSITY LEAD DESIGN FOR DEBUS BY DOWNBOND METHOD

Figure 5A:
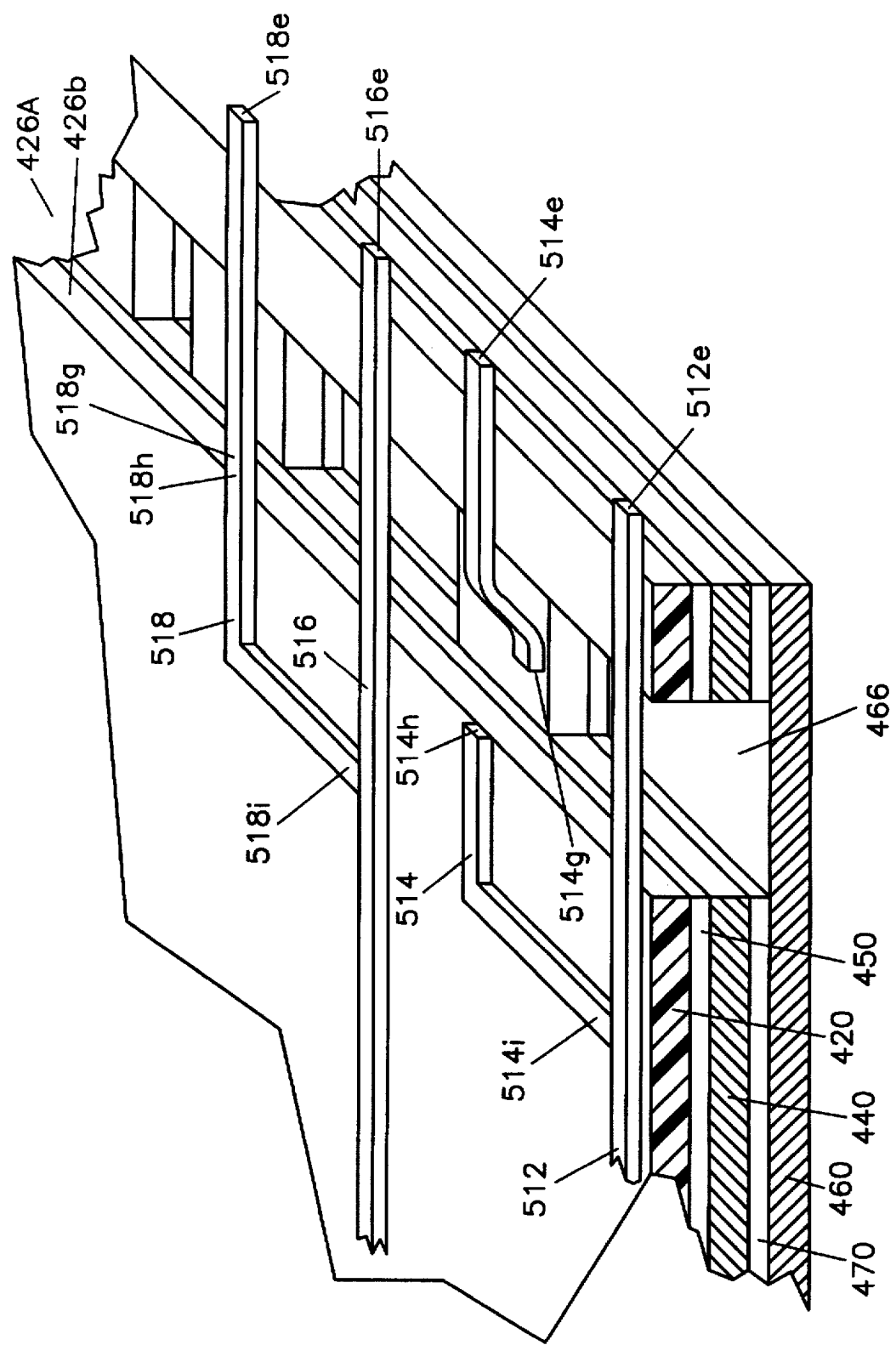
FIG. 5A is a perspective view, partially in cross-section, of a multi-layer flexible substrate having reduced numbers of leads.
Figure 5B:
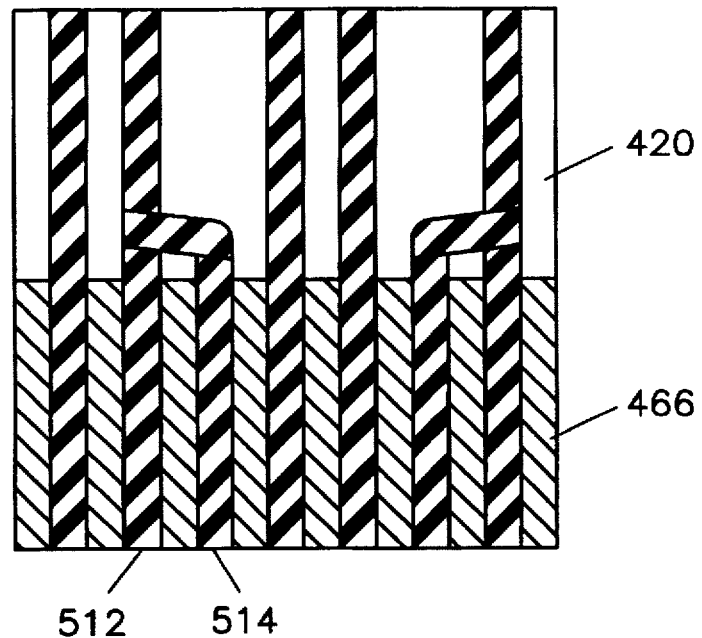
FIGS. 5B and 5C are plan views of the substrate of FIG. 5A.
Figure 5C:
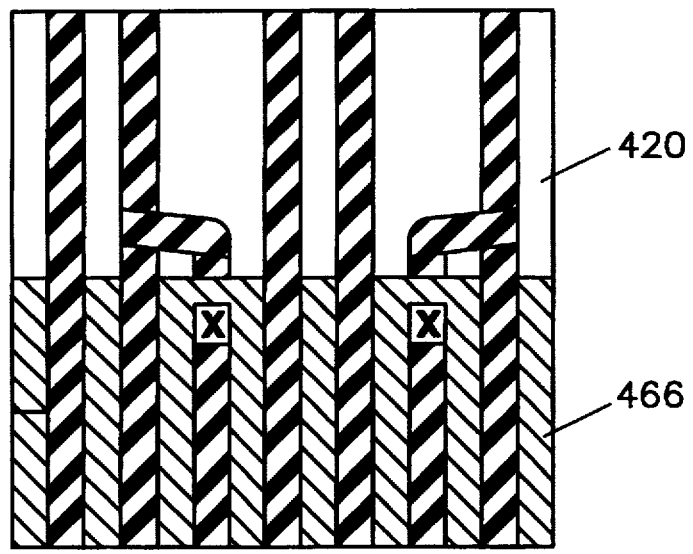

Referring to FIGS. 5A–5C, a reduced circuit density lead design for debus by downbonding is illustrated. Leads 512 and 516 run over the entire surface of the insulating layer 420, whereas leads 514 and 518 do not. Leads 512, 514, 516 and 518 all bridge over the slot 426A. However, the leads 514 and 518 end just after the inner edge 426b of the slot 426A. The inner ends 514i and 518i of leads 514 and 518 are attached to the leads 512 and 516, respectively.

The purpose of attaching leads 514 and 518 to leads 512 and 516 as illustrated is to reduce the number of TAB-tape leads which must be routed through the TAB ball grid array. This embodiment allows reduction of the overall circuit density and improves electrical performance of the semiconductor package. Power and ground leads may be defined for a given semiconductor device in a TAB-tape design having assigned power and ground leads connected to neighboring signal leads. The power and ground leads will be downbonded to the power and ground plans, respectively, whereas the signal leads will not.

As illustrated in FIG. 5A, leads 512 and 516 are signal leads and traverse the entire surface of the insulating layer 420. Leads 514 and 518 are attached to the signal leads 512 and 516, respectively, but do not traverse the surface of the insulating layer 420 any further. Leads 514 are cut at the edge 426b leaving cut ends 514h and 514g. End 514h is left unconnected and end 514g is downbonded to the power layer 440. In similar fashion, lead 518 is cut at the edge 426b and the end 518g downbonded to the ground layer 466.

Not illustrated but similar in application are the inner leads that connect to the die 430 (FIG. 4A). The downbonded leads are cut at the edge 422 and downbonded to either the power inner edge portion 444 or the ground inner edge portion 464. The designated downbonded leads need only extend into the central cavity for connection to the die 430 and may be similarly terminated to neighboring signal leads that traverse the entire surface of the insulating layer 420 before being cut during the downbonding process. In this way, downbonded leads are supported by the insulating layer 420 but need not extend through the ball grid array as do the signal leads. This embodiment reduces the plating of unnecessary power and ground leads and allows the signal leads to be heavier (wider) without increasing manufacturing dimensional tolerances.

ENCAPSULATION OF THE CUT ENDS OF DOWNBONDED LEADS

Figure 6A:
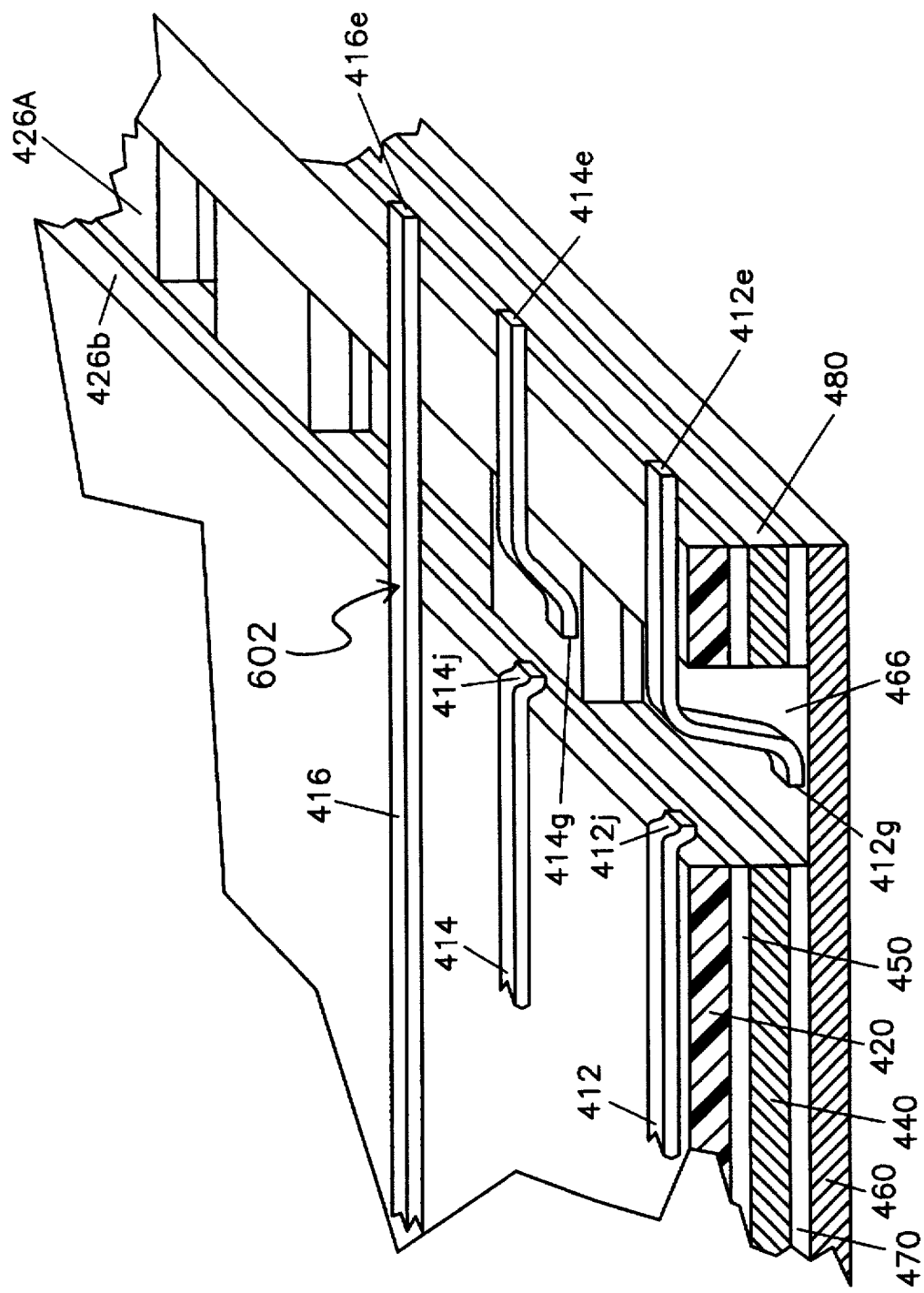
FIG. 6A is a perspective view, partially in cross-section, of a multi-layer flexible substrate illustrating the positioning of cut leads according to the system of the present invention.
Figure 6B:
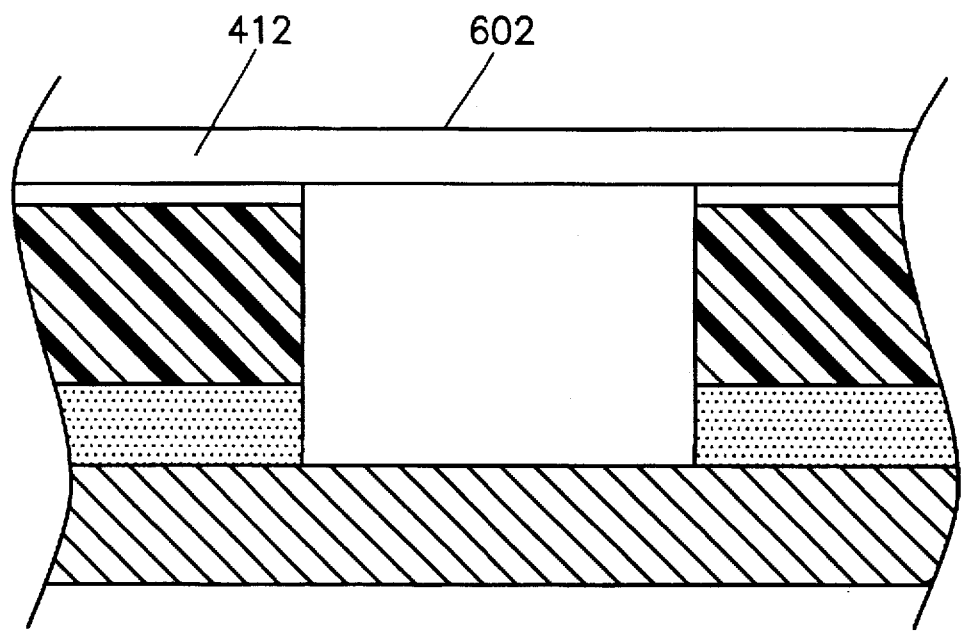
FIGS. 6B and 6C are elevational views of the embodiment of FIG. 6A before and after a lead is cut, respectively.
Figure 6C:
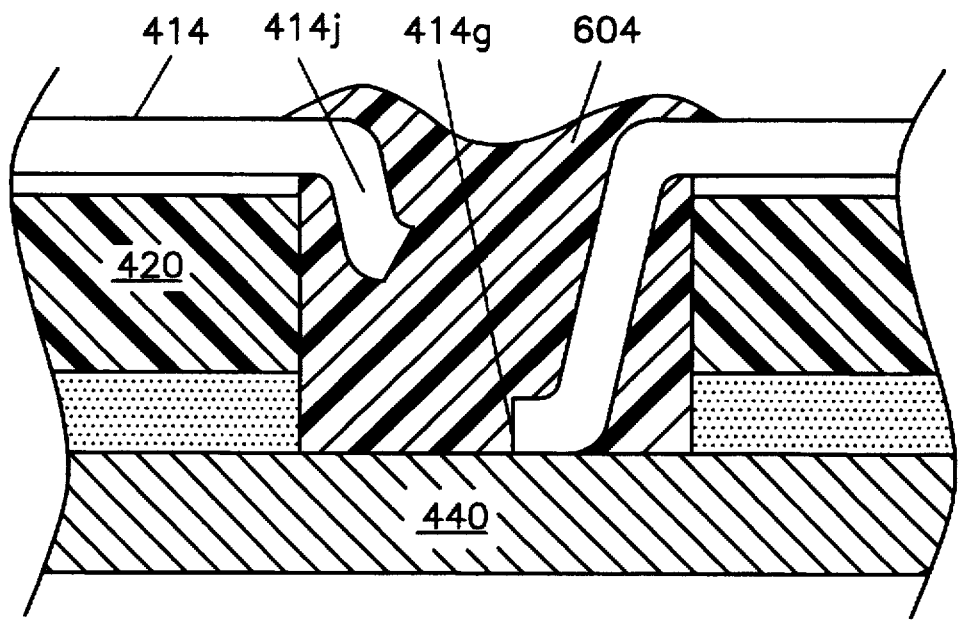

Referring to FIGS. 6A–6C, an embodiment for encapsulation of the cut ends of the downbonded leads is illustrated. Leads 412, 414 and 416 are cut during the downbonding process at point 602. Cutting point 602 is a short distance from the edge 426b, but of sufficient distance to allow short ends 412j, 414j and 416j of the leads 412, 414 and 416, respectively, to be of sufficient length to be bent during the cutting step toward the downbond surface and urged into the elongated slot 426A.

The downbonded ends 412g, 414g and 416g are attached to the power surface (446A) and ground surface (466) as disclosed herein. After bonding the ends 412g, 414g and 416g, encapsulant 604 is placed into the slot 426A and over the ends 412g–416g and 412j–416j. Encapsulating the ends 412j–416j prevents these ends from causing copper migration since these ends are now completely encapsulated and sealed from subsequent processes or contaminates. In addition, the possibility of inadvertently shorting the ends 412j–416j to each other or other conductive parts of the semiconductor package (signal leads) is greatly reduced. Similarly, the possibility of electrical leakage from the ends 412j–416j caused by moisture or contaminates in the package is greatly reduced.

THERMOSONIC BONDING TOOL FOR CUTTING AND DOWNBONDING TAB LEADS

As mentioned previously, U.S. Pat. No. 4,842,662 ('662 patent) is primarily directed to a "downset" operation whereby an already free end of a conductor is bumplessbonded to a die. This technique is suitable for bonding the free ends 312a, 314a and 316a of the conductors 312, 314 and 316, respectively (FIG. 3A) and the free ends 412a, 414a and 416a of the conductors 412, 414 and 416, respectively (FIG. 4A) to a die 330.

Figure 7A:
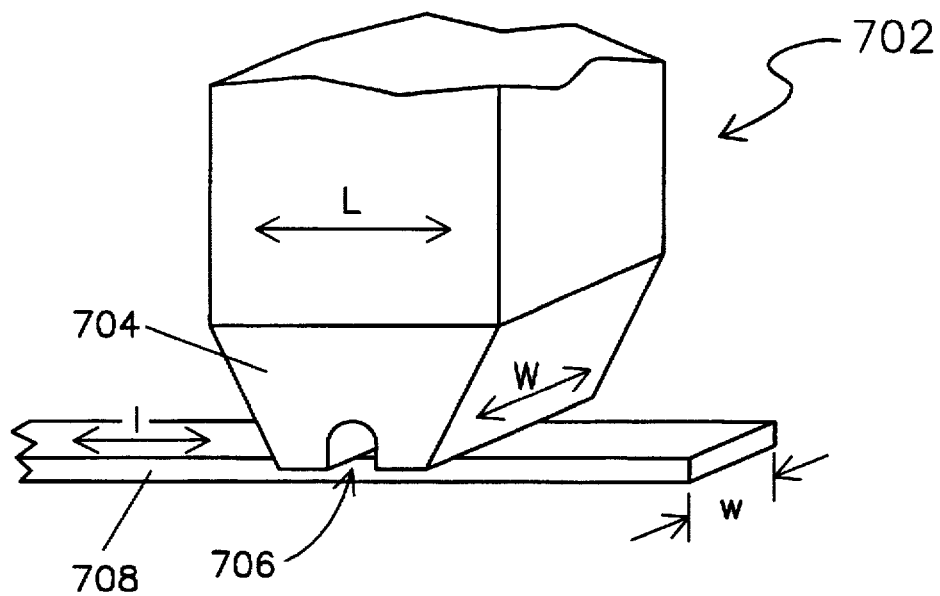
FIG. 7A is a perspective view of a prior art thermosonic bonding technique.

FIG. 7A illustrates a prior art bonding tool 702 having a width "W" larger than the width "w" of the conductor 708 being bonded. A two-headed arrow "L" shows the bonding tool vibrating in the longitudinal axis of the conductor 708, and the coaxial motion "l" (lower case 'el') imparted to the conductor for the stated "wiping". FIG. 8 in the '662 patent illustrates a conductor after bonding, and the raised ridge left by the transverse channel 706 on the conductor 708 (24 in the '662 patent) is evident. This channel 706 would help keep the conductor 708 and the head 704 of the tool 702 moving together as one, longitudinally, to impart the desired wiping action of the conductor against the bond pad (26 in the '662 patent), rather than allowing the tool to vibrate longitudinally with respect to the conductor. In other words, the head 704 of the prior art tool is specifically formed to control longitudinal motion of the conductor.

There is, however, a different and more preferred way to cut and bond the "created" free ends 312d, 312g, 412d, 412g, 414d and 414g to the second and third conductive layers. As mentioned previously, the present method is different from that of the U.S. Pat. No. 4,842,662 in that the free ends to be bent towards and bonded to the second and third conductive layers must first be cut. This cutting operation may be done by the sharp edges (322, 326b, 422, 426b) of the polyimide layer (320, 420).

Figure 7B:
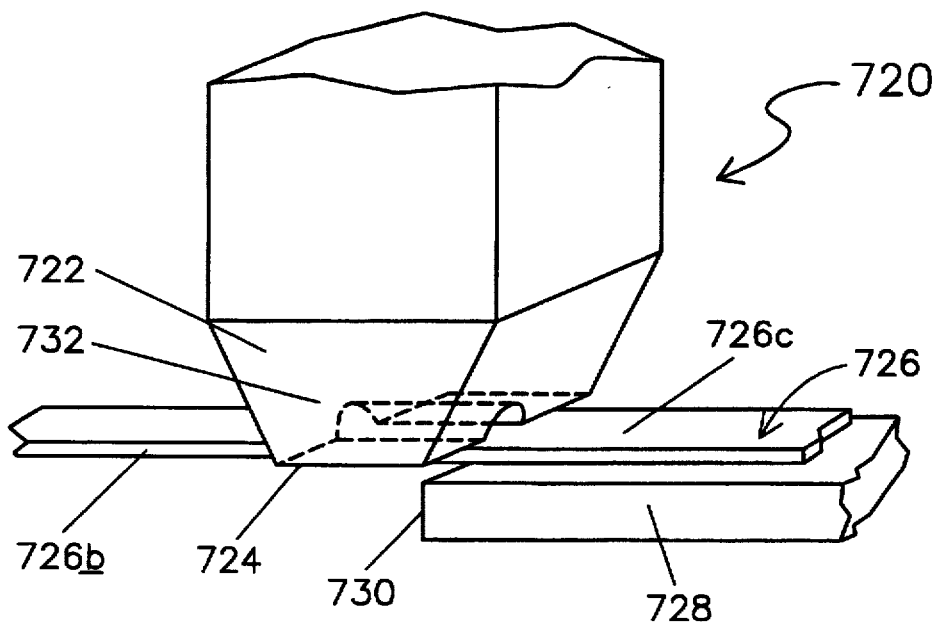
FIG. 7B is a perspective view of a bonding tool and technique, according to the system of the present invention.
Figure 7C:
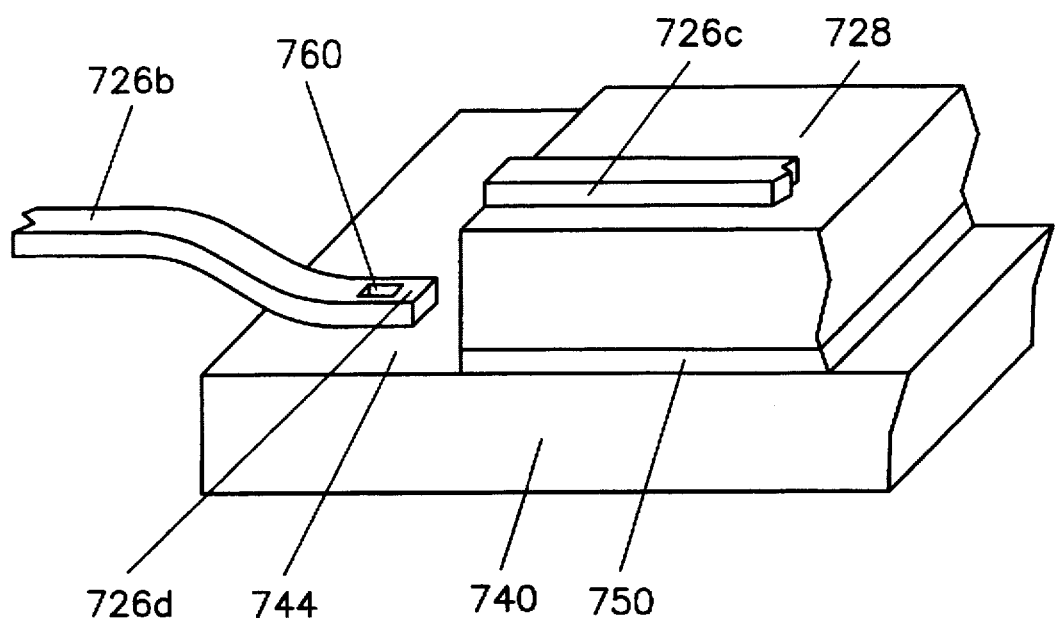
FIG. 7C is a perspective view of a bonding technique, according to the system of the present invention.

A more effective cutting operation may be obtained when a combination cutting and downbonding tool is utilized. Referring to FIGS. 7B and 7C, cutting/downbonding tools are illustrated in schematic elevational views. The bonding tools 710A and 710B both have sharp front radii 712 to ensure lead breakage at the point of contact. Tool 710B has a cutting point 714 having a cutting tip having a depth 716 which ensures the lead being cut breaks at the point of tool contact.

Once the lead is cut, the tool downsets the cut lead to a surface of either the power or ground layer. The tool then bonds the lead to the conductive layer surface by ultrasonic bonding. The bonding process is improved by the large back radius 720 and chamfer 722 that facilitates the use of high bonding forces and ultrasonic energy. It also ensures a gradual transition during the bonding of the lead to the conductive surface which substantially reduces the possibility of cutting the lead during the bonding process.

THERMOSONIC BONDING PROCESS FOR FABRICATING MULTI-LAYER FLEXIBLE SUBSTRATES HAVING SECOND AND THIRD CONDUCTIVE PLANES

As mentioned previously, U.S. Pat. No. 4,842,662 is primarily directed to a "downset" operation whereby an already free end of a conductor is bumpless-bonded to a die.

As further mentioned previously, such a technique is suitable for bonding the free ends 312a, 314a and 316a of the conductors 312, 314 and 316, respectively (FIG. 3A) and the free ends 412a, 414a and 416a of the conductors 412, 414 and 416, respectively (FIG. 4A) to a die 330.

And, as suggested previously, there is a different and more preferred way to bond the "created" free ends 312d, 312g, 412d, 412g, 414d and 414g to second and third conductive layers. As mentioned previously, the present method is different from that of the U.S. Pat. No. 4,842,662 in that the free ends to be bent towards and bonded to the second and third conductive layers must first be cut—and this cutting operation makes use of the sharp edges (322, 326b, 422, 426b) of the polyimide layer (320, 420).

Beyond the cutting operation that creates the free ends to be bonded, the free ends are bonded in a manner different than that of the aforementioned U.S. Pat. No. 4,842,662.

For example, the tool used in the present inventive manufacturing is different than that of the U.S. Pat. No. 4,842,662. A tool is not illustrated in that patent, but a depiction of a bond formed with the tool is illustrated in FIG. 8, therein. And the text describes that "the width of the head of the bonding tool should be greater than the width of the TAB tape (conductor) which the head of the bonding tool presses upon." (Column 6, lines 58–61).

By way of further example, with reference to FIG. 7A herein, it would appear that the bonding tool 702 implied, but not illustrated, in the U.S. Pat. No. 4,842,662 has a head 704 with a widthwise channel 706 extending transversely (widthwise) across the head 704. This is evident from the description of a single stroke of the bonding tool in the patent, as well as from the text describing how it is "highly preferred" that "the ultrasonic energy is applied along the long axis of the TAB tape being attached to the pad. When this is done, the resulting relative motion induced between the tape and the pad produces a rapid longitudinal 'wiping' of the two surfaces along this axis." (see column 7, lines 13–22).

FIG. 7A, herein, illustrates such a bonding tool 702 having a width "W" larger than the width "w" of the conductor 708 being bonded. A two-headed arrow "L" illustrates the bonding tool vibrating in the longitudinal axis of the conductor 708, and the coaxial motion "l" (lower case 'L') imparted to the conductor for the stated "wiping". FIG. 8 in the patent illustrates a conductor after bonding, and the raised ridge left by the transverse channel 706 on the conductor 708 (24 in the patent) is evident. This channel 706 would help keep the conductor 708 and the head 704 of the tool 702 moving together as one, longitudinally, to impart the desired wiping action of the conductor against the bond pad (26 in the patent), rather than allowing the tool to vibrate longitudinally with respect to the conductor. In other words, the head 704 of the prior art tool is specifically formed to control longitudinal motion of the conductor.

In contrast to the bonding tool of the prior art, the bonding tool of the present invention is specifically formed to control transverse (widthwise) motion of the conductor as it is cut and bent, and ultimately bonded to the second or third conductive layer (e.g., 440 or 460).

Particularly with respect to the cutting operation, which occurs as the tool head is pressed down against the inner end portion (e.g., 312b) of the conductive lead (e.g., 312) and is sheared off by the edge (e.g., 322) of the polyimide layer (e.g., 320), it is extremely important that the conductor does not displace itself widthwise. Hence, the bonding tool of the present invention is designed to prevent transverse (widthwise) movement of a conductive lead (trace) being cut, bent and bonded.

FIG. 7B illustrates the bonding tool 720 of the present invention. The head 722 of the tool is wedge shaped, having a straight, partially flat edge 724 extending widthwise across a conductor 726 (e.g., 312) being cut, bent and bonded. A polyimide layer 728 (e.g., 320) is illustrated supporting the conductor along an intermediate portion 726c (e.g., 312c) thereof The tool 720 is illustrated coming down on an inner end portion 726b (e.g., 312b) of the conductor 726, closely adjacent an edge 730 (e.g., 322) of the polyimide layer 728. (The numbers in parentheses are cross references to exemplary FIG. 3A. The tool 720 and process described herein can be applied as well to cutting, bending and bonding the selected conductors 412 and 414 in FIG. 4A.)

According to the invention, in order to prevent relative widthwise motion between the bonding tool head 722 and the conductor 726 being cut, bent and bonded, the head 724 is provided with a longitudinal groove 732 extending into the head 722 from the widthwise edge 724 thereof. Preferably, as in the prior art (FIG. 7A) the width of the bonding tool head is greater than the width of the conductor being bonded. In the case of the bonding tool 720, the longitudinal groove 732 has a width on the order of 20–33% of the width of the conductor 726, so that it can easily be located widthwise in the center of the conductor with allowances for minor misalignments. The vertical depth of the groove 732 is on the order of 10–20% of the thickness of the conductor 726.

FIG. 7C illustrates the inner end portion 726b of the conductor 726 having been bonded to an exposed inner edge portion 744 (e.g., 344 of FIG. 3A). The tool 720 has been lifted away (not visible). There is, however, visible, a raised ridge 760 visible on the center (widthwise) top surface of the inner end portion 726b, running longitudinally (lengthwise) along the conductor 726 and located near the freed (by cutting) end 726d.

It is also possible that a longitudinal groove, such as the groove 732 could be added to the bonding tool 702 of the prior art (FIG. 7A), in which case there would be a transverse channel 706 as well as a longitudinal groove 732 in the head of the tool. This would prevent relative motion between the tool head and the conductor, in both the transverse (by the groove 732) and the longitudinal (by the channel 706) directions, and would leave a telltale cruciform-shaped raised ridge on the conductor. This is illustrated in FIG. 7E.

More importantly, however, is to take into account the demands made by the present invention on the tasks accomplished by the bonding tool. In the first instance, when the tool head bears down on the conductor (526), its job is to cause the conductor to break, or be cut, as nearly as possible to the edge (530) of the polyimide layer (528).

According to the invention, in such a "first" stroke of the tool, the conductor (526) is broken and lightly tacked (partially bonded) to the underlying second (or third) conductive layer (e.g., 340/540 or 760), close to the polyimide edge (530).

Further according to the invention, in order to ensure a good bond between the free end (526d) of the conductor and the underlying additional conductive layer, the tool is then lifted away from the conductor, repositioned, and brought to bear a second time onto the lightly tacked down conductor.

Figure 7D:
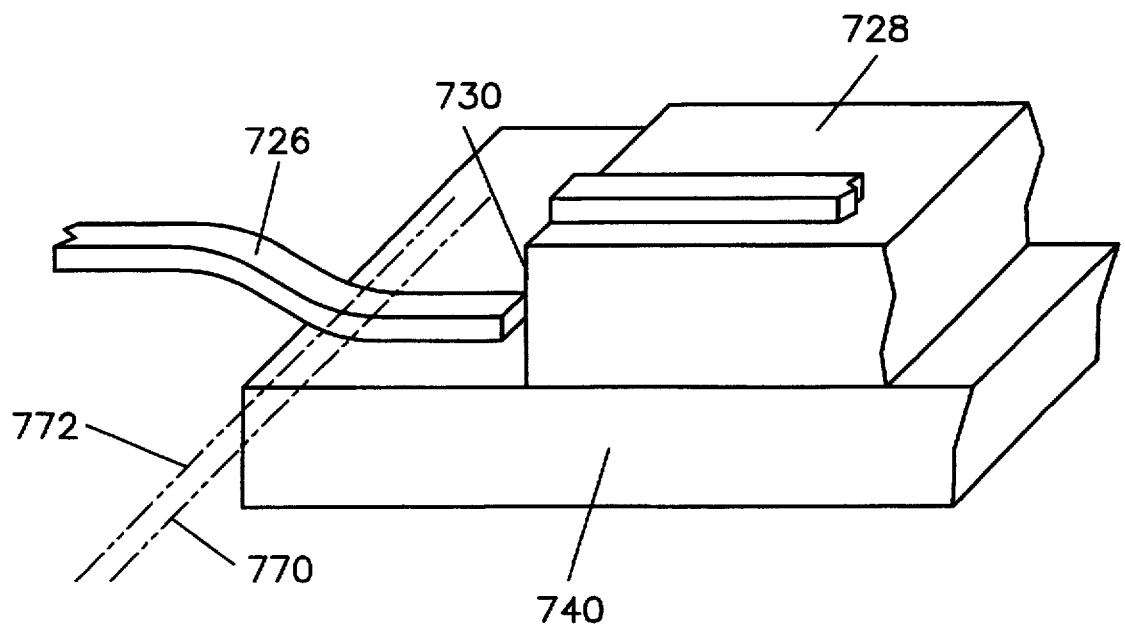
FIG. 7D is a perspective view of a bonding technique, according to the system of the present invention.

FIG. 7D illustrates the results of such a two-stroke bonding process. As illustrated, the conductor 726 is, in a first cutting/tacking stroke of the tool (e.g., 720) lightly tacked to the underlying conductive layer 740 at a position illustrated by the dashed line 770 close to the edge 730 of the polyimide layer helping to cut the conductor. The tool is then lifted and repositioned. Then, in a second bonding stroke, the tool is urged against the already lightly tacked conductor at a position indicated by the dashed line 772 slightly (e.g., 0.01 mils) further away from the polyimide edge 730.

The two-stroke bonding process described and illustrated in FIG. 7D, ensures that the bonding tool is not required to cut, bend and bond, all in one stroke. Nor is the bonding tool required to bend and bond in one stroke, as it is in U.S. Pat. No. 4,842,662. Rather, the bonding tool is required only to cut and bend, and lightly tack, in a first stroke, whereupon the conductor being bonded is already stablely (relatively immovably) placed in contact with the surface to which it is being bonded. Then, the bonding tool can perform bonding, without the possibility of the conductor moving. Taking the stability of the lightly tacked (first stroke) conductor into account, it is possible that the head of the bonding tool is not provided with any grooves or channels at all, but rather is simply wedge shaped to perform efficient, contiguous (non-interrupted by grooves or channels) bonding.

Figure 7F:
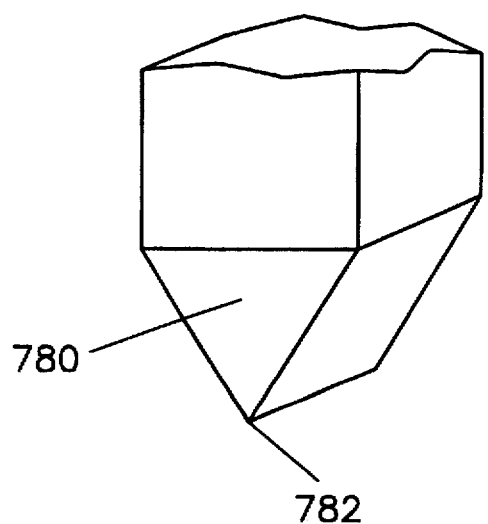
FIG. 7F is a perspective view of another alternate embodiment of a bonding tool, according to the system of the present invention.
Figure 7E:
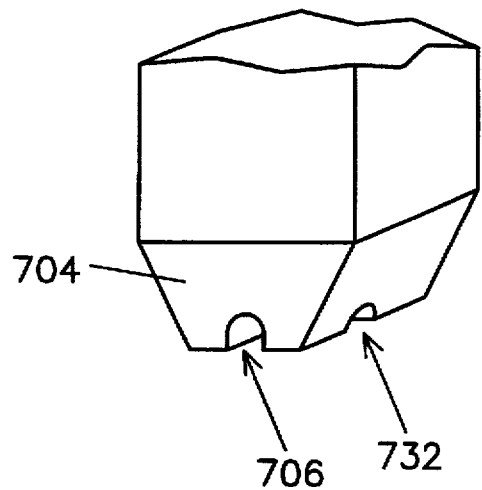
FIG. 7E is a perspective view of an alternate embodiment of a bonding tool, according to the system of the present invention.

It is also possible that the bonding tool could simply be a wedge, as illustrated in FIG. 7F. In this case, the tool head 780 is a simple wedge, with a non-grooved, non-channeled widthwise edge 782 bearing down on the conductor. Inasmuch as the first stroke is not required to effect a good bond, the simple wedge shape of the tool head 780 will provide more uniform pressure across the width of the conductor.

Irrespective of the advantages of using a two-stroke, or two-point cutting/bending/bonding process as described above, it is possible that a single point bonding process, such as is described in U.S. Pat. No. 4,842,662, or the like, will suffice. A single or double stroke thermocompression, versus thermosonic or reflow, process will also work.

DIE PEDESTAL STAGES FOR FABRICATING MULTI-LAYER FLEXIBLE SUBSTRATES HAVING SECOND AND THIRD CONDUCTIVE PLANES

Figure 8A:
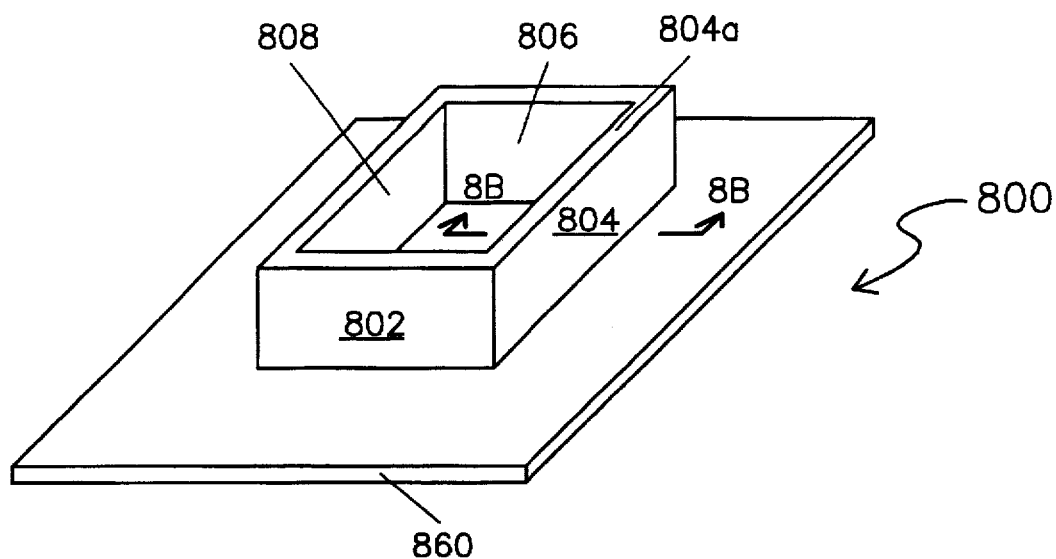
FIG. 8A is a perspective view of a tool (die pedestal) employed in the bonding technique of the present invention.
Figure 8B:
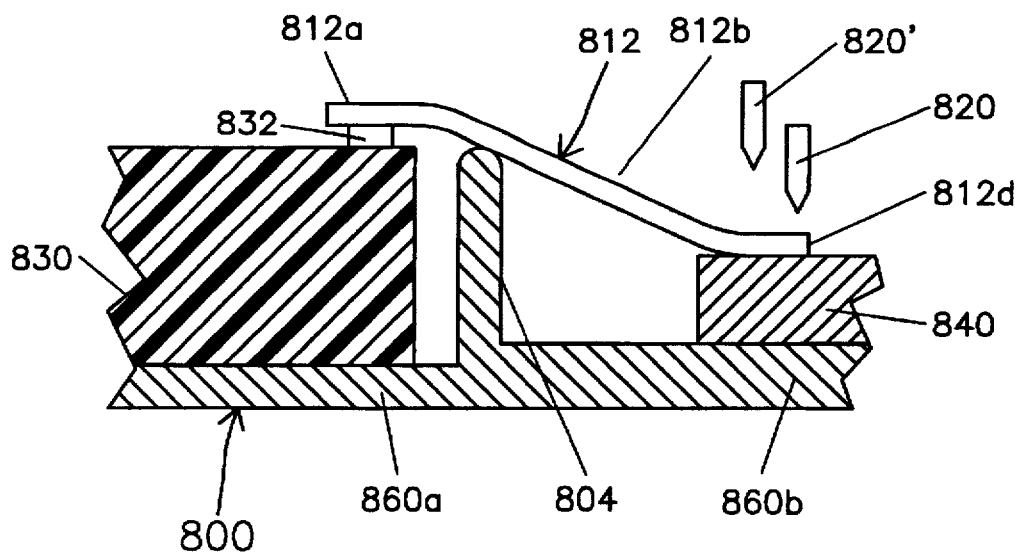
FIG. 8B is a cross-sectional view of the die pedestal of FIG. 8A, in use, and also illustrates the two-point bonding technique of the present invention.

FIG. 8A illustrates a pedestal 800 for use in supporting the die and the substrate when breaking, bending and bonding the leads. Compare FIG. 3A. The pedestal is essentially a "jig" to aid in bending the conductors, while preventing them from contacting the peripheral edge of the die. If the conductors were to contact the edge of the die, they would become shorted thereto. FIG. 8B illustrates the pedestal 800 in use.

As illustrated in FIG. 8A, the pedestal 800 has four walls 802, 804, 806 and 808 forming a square-tubular open structure. Given that most semiconductor dies are square, this is an appropriate shape to surround the peripheral edge of a die.

As mentioned hereinabove, the die is typically brought up to the tape substrate for bonding the bottom surfaces of the inner ends (e.g., 312a, 412a, or 414a) of the conductive traces (e.g., 312, 412 or 414) to the top surface of the die, preferably using a bump-TAB process.

And, as mentioned hereinabove, the inner end portion (e.g., 312b, 412b or 414b) of the conductive trace is urged downward by a bonding tool to cause the inner end portion to sever from an intermediate portion (e.g., 312c, 412c, 414c) which is supported by an insulating layer (e.g., 320, 420), so that a free end (e.g., 312d, 412d, 414d) can be bonded to a second (e.g., 340, 440) or third (e.g., 460) conductive plane.

This is illustrated best in FIG. 8B, which illustrates a die 830, a conductive trace 812 bonded at one end 812a to the top of the die with a bump 832. Inasmuch as this aspect of the invention relates to severing/bending/and bonding to an offset second or third conductive layer 840, the polyimide layer is not illustrated (refer to FIGS. 3A or 7A).

FIG. 8B illustrates a bonding tool (e.g., 720) in a first position 820 bearing down upon the free end 812d of the conductor 812, during a preferred first cut/bend/tack stroke, and illustrates the bonding tool in a second position 820', offset from the first position, coming down onto the conductor 812 during a preferred second bonding stroke.

The pedestal 800 is provided with a base 860 at one end of the tubular opening formed by the walls 802, 804, 806 and 808. In FIG. 8B, it is clearly seen that the base 860 can be thinner in a region within the walls, and thicker in a region without the walls.

The thickness of the base portion 860a within the walls is established so that the walls are slightly, such as 0.05 mils, higher than the thickness of the die. In this manner, the walls extend slightly above the top surface of the die, to prevent the conductor 812 from coming into contact with the edge of the die, especially when it is being cut and bent (620).

The thickness of the base portion 860b is established to support the additional conductive layer 840 and may, as stated above, be thicker than the portion 860a in the event that the bottom surface of the die extends lower than the bottom surface of the additional conductive layer 840. Of course, the opposite could be true, in which case the portion 860a may well be thicker than the portion 860b.

The walls 802, 804, 806 and 808 are spaced apart from the die a small amount, on the order of 0.25 mils, to allow the die to be easily placed yet reasonably accurately retained within the opening formed by the walls. Damaging the die at this stage of the fabrication process, by too tight of a fit, is not a very good idea.

As is best seen in FIG. 8B, the top edges (604a) of the walls are preferably rounded, as well as extending above the top surface of the die. This is to ensure that when the conductor is bent around the top edge, the conductor and/or any plating on the conductor are not damaged during the cutting/bending/bonding process.

A discussion of using the additional conductive layer(s) as a heat sink, spreading heat away from the die, is presented below. It should be appreciated that the pedestal 800 could be left in place to function as a heat sink, in which case it would need to be at least partially non-conductive (namely the top edges of the walls in contact with the leads) to prevent shorting the leads. Anodized aluminum is suitable. Also, a thermally and electrically conductive pedestal, having an electrically non-conductive material (e.g., plastic) formed atop the sidewalls.

DOWNBOND SLOT LOCATIONS FOR FABRICATION OF A TBGA PACKAGE

The outer downbond slots (ground or power plane connections) may be at the perimeter of the TAB or CTHS package body. When the outer downbond slots are placed outside of the ball grid array an increase in the package size is required to accommodate the outer downbond slots, and all circuit traces (leads) must pass through the ball grid array. Having to pass all of the circuit traces through the ball grid array increases circuit density and may reduce the electrical performance of the semiconductor package.

Figure 9:
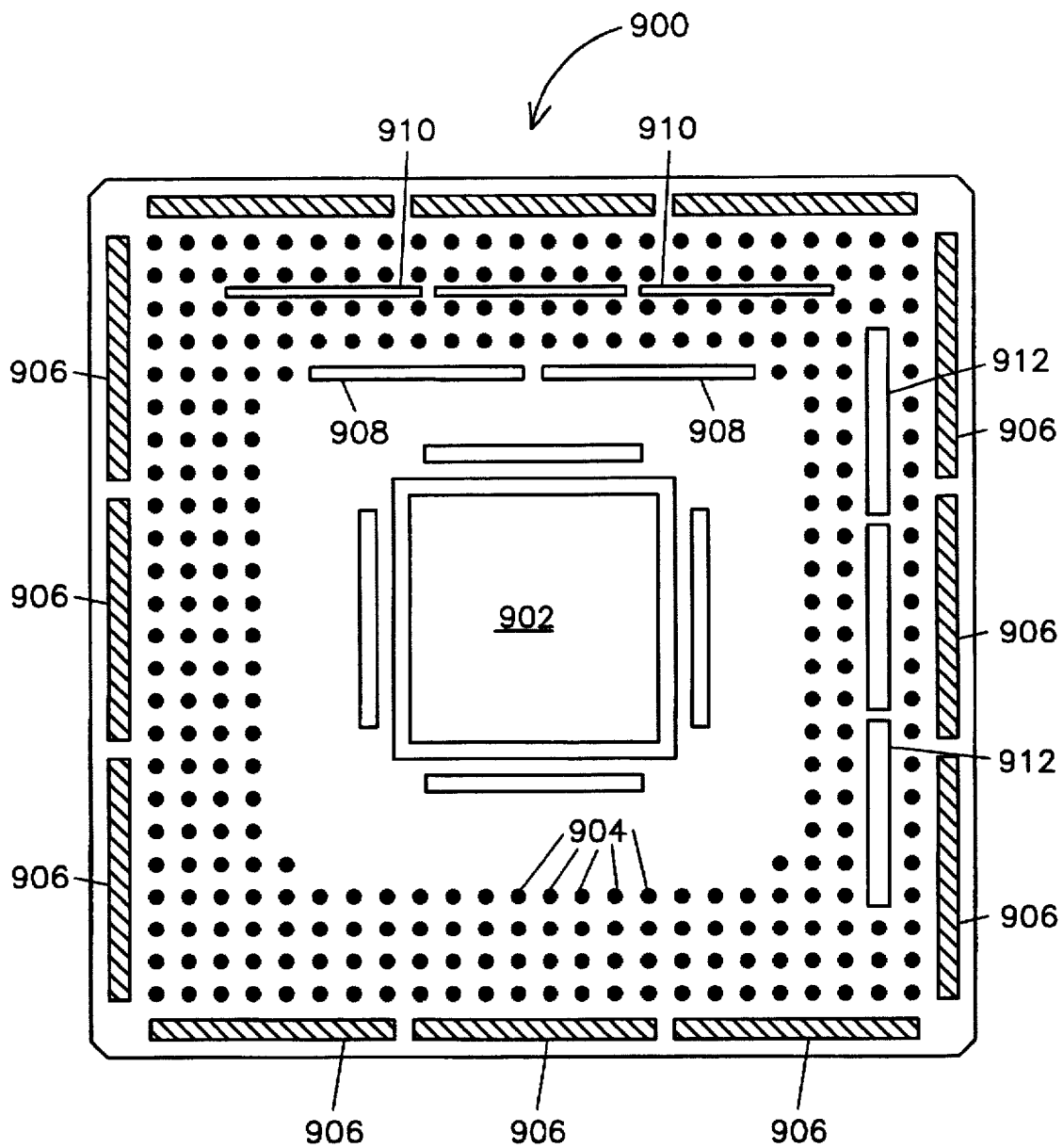
FIG. 9 is a plan view of a semiconductor device package as used in the system of the present invention.

Referring now to FIG. 9, a bottom plan view of a CTHS package is schematically illustrated. A typical CTHS package 900 comprises a TBGA, a semiconductor die 902, solder balls 904, and downbond slots 906. The downbond slots 906 are outside the grid array of the solder balls 904. The slots 906 require that the package 900 size be increased to accommodate the necessary area for the downbond slots 906.

Downbond slots may be placed in different locations in the package 900 in order to reduce the package size. For example, the following locations may be utilized for downbond slots without increasing the size of the package 900: (1) Downbond slots 908 may be placed just inside the innermost row of balls 904, (2) downbond slots 910 may be placed within the array of balls 904 without depopulating the number of ball locations, and (3) downbond slots 912 may be placed within the array of balls 904 with depopulating the number of ball locations.

Placing the downbond slots in any or all of the locations above allows a reduction in the overall package 900 size. It also reduces the number of leads which must pass through the ball grid array to the package perimeter.

CONDUCTIVE LAYER ACTING AS A HEAT SINK AND ENCAPSULANT DAM

As mentioned above, the additional conductive layer (e.g., 340, 460 of FIGS. 3A and 4A, respectively) can be thicker and stiffer than a conventional additional foil layer (e.g., 220 of FIG. 2A). Hence, the additional conductive layer can not only "rigidize" the TAB tape, but it can also act as a heat spreader and encapsulant dam.

Figure 10A:
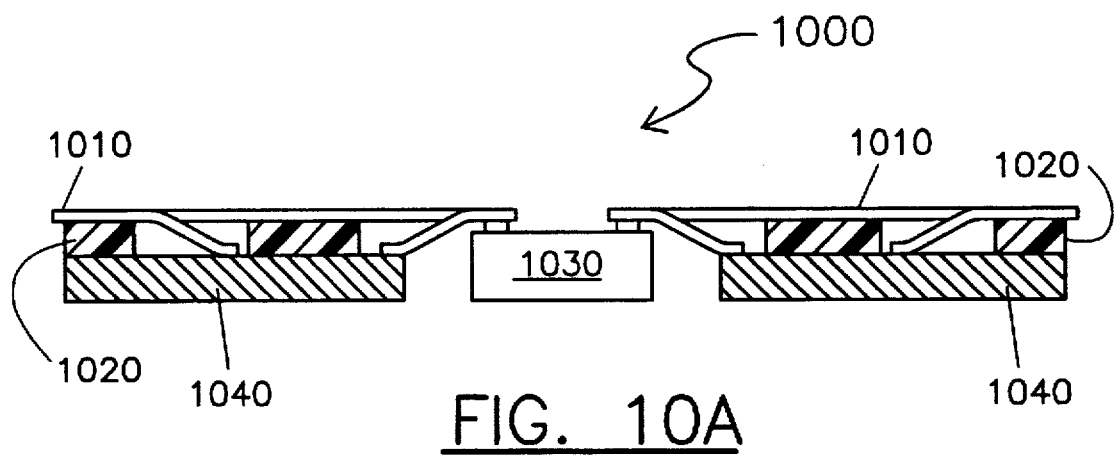
FIGS. 10A–10D are cross-sectional views of heat sink options for the semiconductor device assemblies of the present invention (e.g., as illustrated in FIGS. 3A and 4A)

FIG. 10A illustrates a generalized view of a semiconductor device assembly 1000 having a top patterned layer 1010, a plastic film layer 1020, a semiconductor die 1030 and an additional conductive layer 1040 (similar to 340 or 460), as set forth above, wherein the additional conductive layer 1040 is formed as a square ring. (The adhesive, e.g., 350 is omitted from this view.)

Figure 10B:
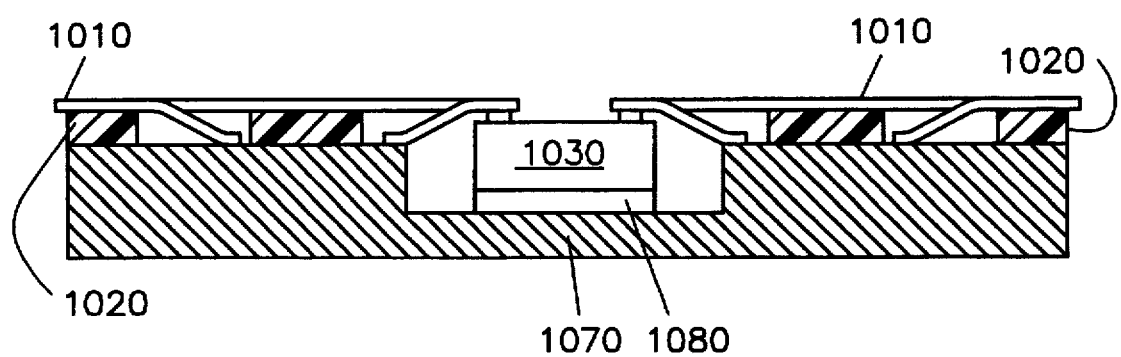

FIG. 10B illustrates a heat sink 1070 formed integrally with the additional conductive layer 1040. In essence, the heat sink is simply a flat base plate formed entirely across the bottom of the additional conductive layer 1040, more particularly spanning an area directly under the die 1030. A suitable thermally conductive paste 1080, such as silver-epoxy or thermal grease, is disposed between the top surface of the heat sink 1070 and the bottom surface of the die 1030.

Figure 10C:
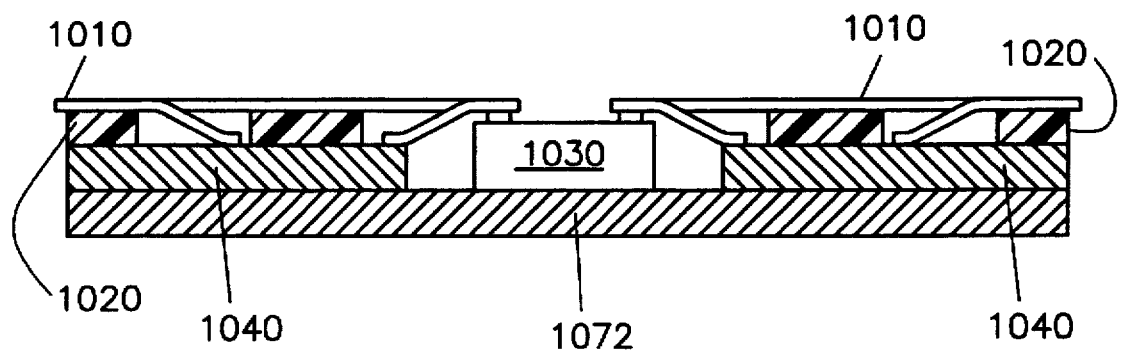

FIG. 10C simply illustrates that the flat base plate of the heat sink 1072 can be formed separately, rather than integrally (FIG. 10B) with the additional conductive layer 1040. A thermal adhesive or grease (not illustrated) is preferably disposed between the heat sink and the die, as in FIG. 10B. A suitable adhesive, such as epoxy, not illustrated, can be used to join the heat sink 1072 to the additional conductive layer 1040.

Figure 10D:
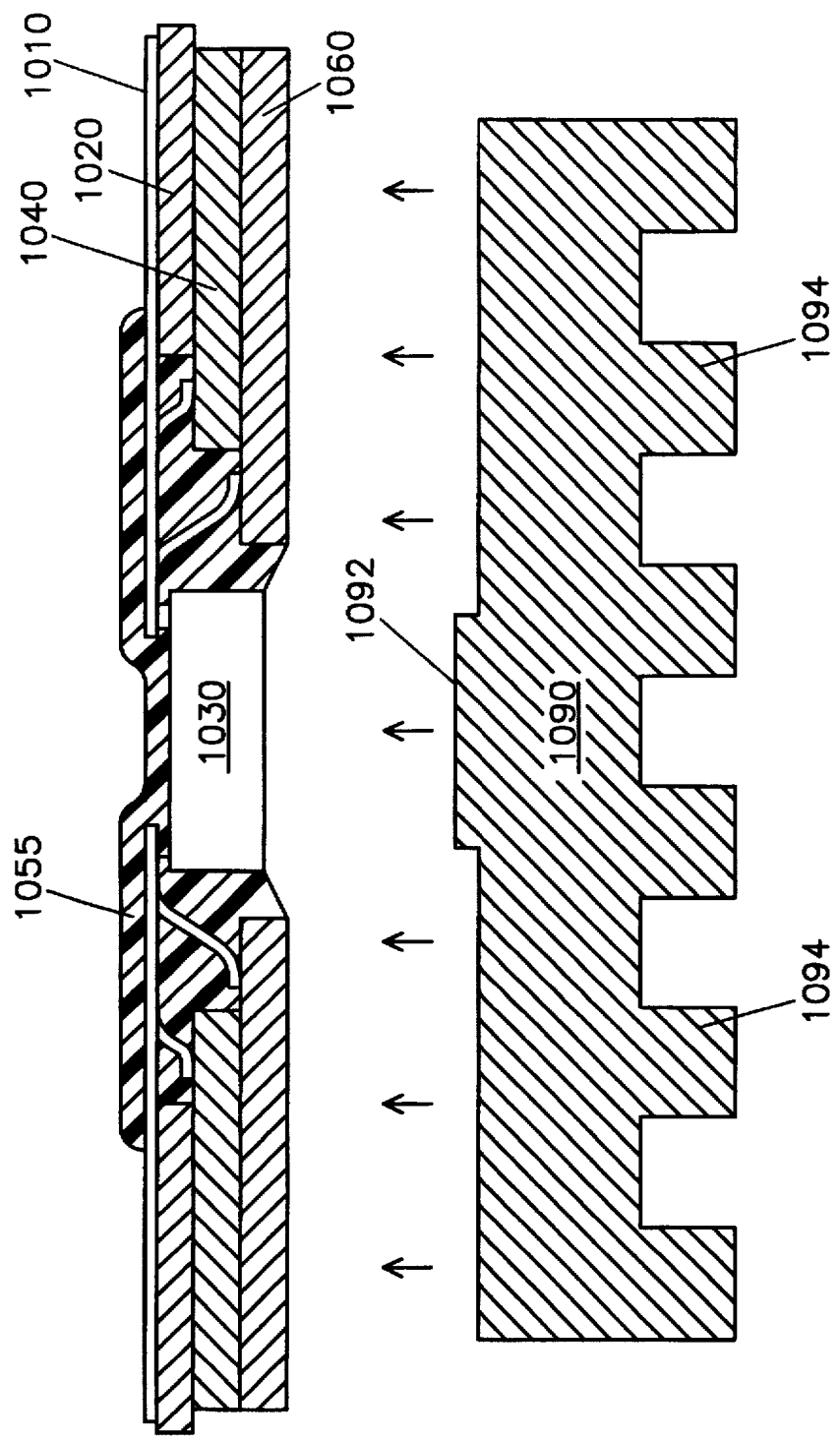

FIG. 10D illustrates a semiconductor device assembly with two additional conductive planes 1040 and 1060 beneath an insulating layer 1020 and a signal layer 1010, and including a die 1030, all similar to FIG. 4A. An insulating layer (e.g., 470) between the two additional conductive layers 1046 and 1060 is omitted, for clarity.

In this case, the heat sink 1090 is a separate base plate (similar, in this regard, to the heat sink 1072 of FIG. 10C). However, the heat sink 1090 is provided with a raised portion 1092 sized and shaped to contact the bottom of the die 1030. Thermal adhesive or grease would be used between the button 1092 and the die 1030. The heat sink 1090 is further provided with a plurality of fins 1094 on a side opposite the button 1092 (away from the die 1030) to aid in convective cooling of the die. The vertical " - - - " arrows indicate that the heat sink 1090 is being brought into contact with the die 1030 and lower underlying additional conductive layer 1060.

FIG. 10D also illustrates how the die 1030 (e.g., 330, 430) is ultimately encapsulated with a glob-top epoxy 1055, or the like.

Figure 11A:
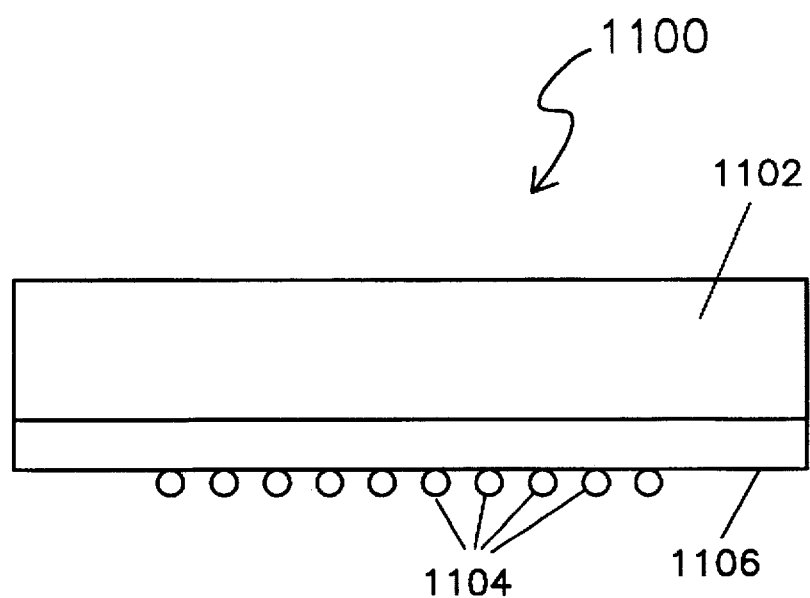
FIG. 11A is an elevational view of a TAB semiconductor package.

FIG. 11A illustrates a schematic elevational view of a CTHS package. The package 1100 is comprised of a heat spreader 1102 and a TBGA assembly 1106. The perimeter area around the solder balls 1104 of the package 1100 is required for outer downbonding slots (see FIG. 8, slots 806).

Figure 11B:
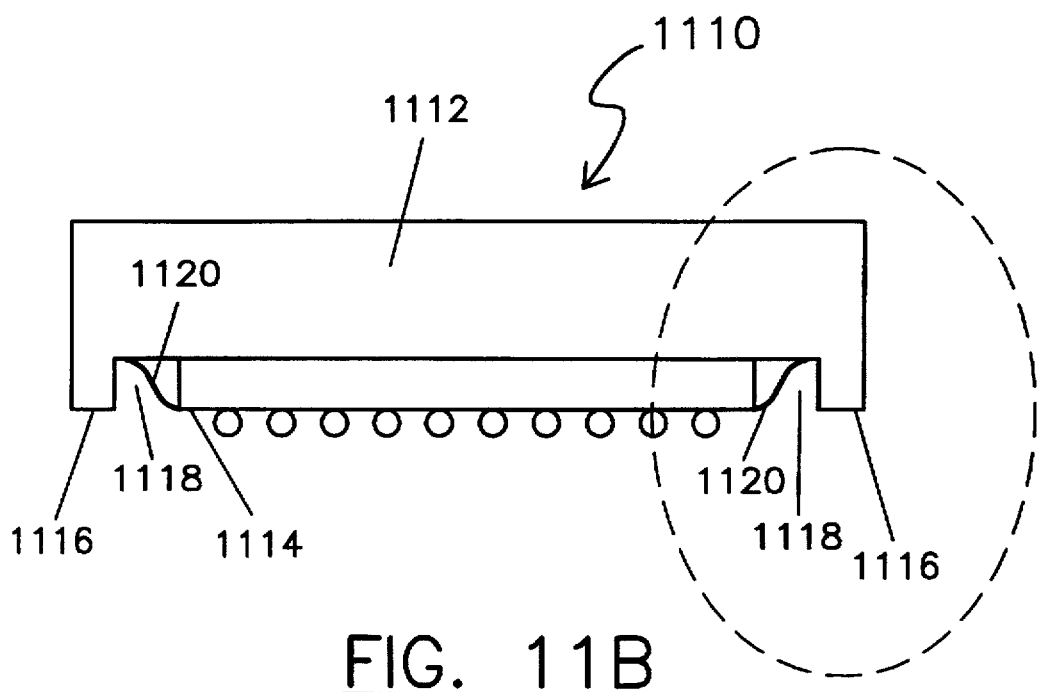
FIG. 11B is an elevational view of a TAB semiconductor package having an integral outer downbond slot and perimeter dam for encapsulant, according to the present invention.
Figure 11C:
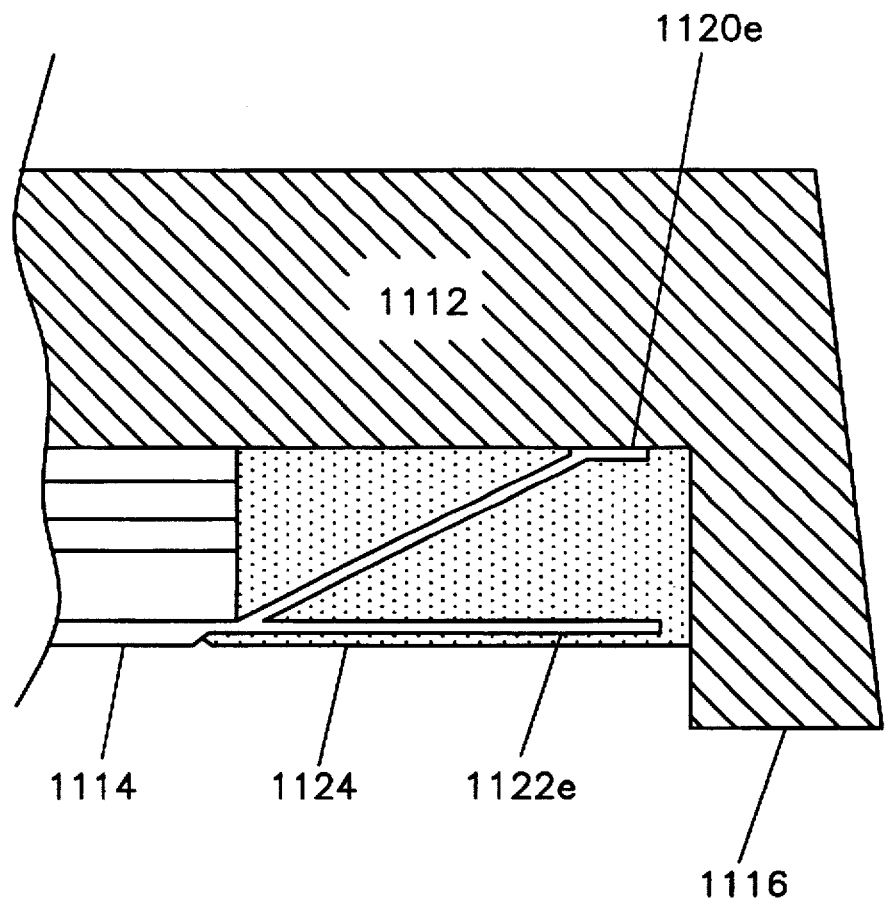
FIG. 11C is a partial expanded elevational view of the package of FIG. 11B.

Referring to FIGS. 11B and 11C, schematic elevational views of an embodiment of the present invention are illustrated. A package 1110 is comprised of a lid/heatsink 1112 and a TBGA assembly 1114. The heatsink 1112 further has a ridges 1116 and spaces 1118 between the ridges 1116 and the outer edges of the assembly 1114. The TBGA assembly 1114 has outer leads 1120 that may be bonded to the heatsink 1112 as described above.

The ridges 1116 may be used as a dam rim when encapsulant 1124 is introduced into the spaces 1118 after the leads 1120e have been downbonded to the heatsink 1112. Not all of the leads need be downbonded, for example, leads 1122e are not connected to the heatsink 1112 but are still encapsulated in the encapsulant 1124 so as not to short to the heatsink 1112, other leads or cause electrical problems as mentioned above.

The ridges 1116 may be formed by preferably by stamping during the fabrication of the heatsink 1112. The height of the ridges 1116 preferably should be greater than the height of the TBGA assembly 1114 lamination and the meniscus of the encapsulant 1124 it is designed to restrict.

Fabrication of the package 1110 may be performed as follows:

(a) Excise the tape-site within the outer edge (326a of FIG. 3A) of the outermost downbond slot (326).

(b) The remaining leads should be trimmed short enough so as to avoid inadvertently shorting the leads not selected for downbonding to the heatsink 1112.

(c) Laminate/assemble the required power (440), ground (1112) and signal planes together.

(d) Downbond the selected leads (1120e) to the heatsink (1112) plane.

(e) Fill the downbond space (1118) with encapsulant (1124).

This embodiment of the present invention thus reduces the package size by omission of the carrier-film and adhesive layers beyond the outermost downbond slot and serves as a dam to contain encapsulant during the package fabrication process.

BALL ATTACH TO TBGA USING SOLDER FLUX AND PHOTOIMAGEABLE SOLDER RESIST DEFINITION

Solder ball attachment to TBGA requires a temperature be applied that is high enough to melt solder to conductor pads on the TBGA-tape. Prior art methods of attaching solder balls to a TBGA-tape is a low throughput process because each ball must be addressed individually. In addition, the known process is restricted to a two-layer tape (chemically milled dielectric) because the required precision alignment of the ball pads and holes is not economically achieved in a three-layer tape.

The present invention achieves an inherently higher throughput at lower cost when attaching solder balls to a TBGA-tape. In addition, the method of the present invention allows utilization of less costly three layer TAB tape. Three layer TAB tape may be effectively utilized by application of photoimageable solder resist that controls the wettable area when the solder collapses during reflow heating.

Figure 12A:
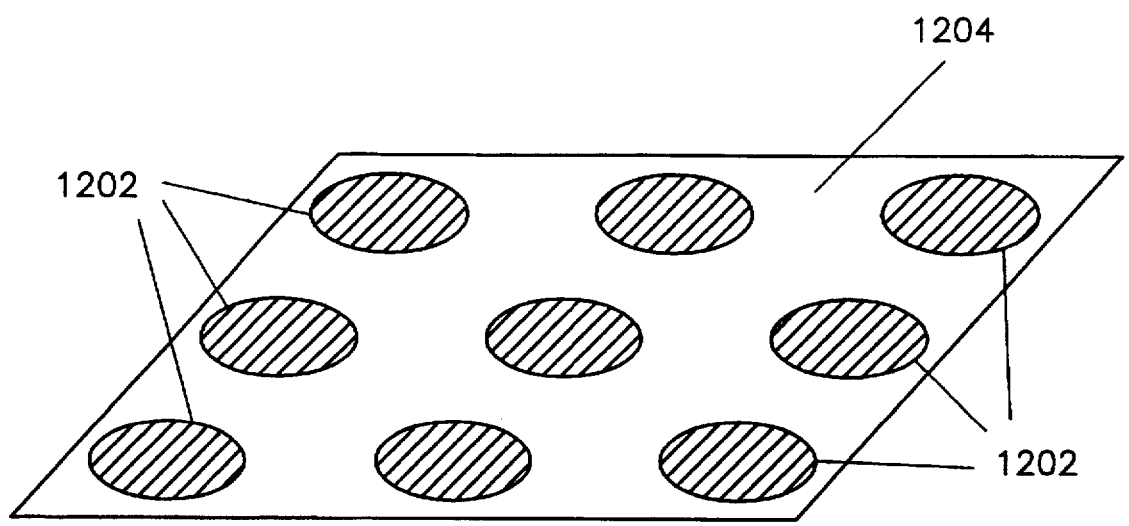
FIGS. 12A–12E are perspective views of the steps in attaching solder balls to a TBGA tape using solder flux and photoimageable solder resist definition, according to the system of the present invention.

Referring now to FIGS. 12A–12E, partial perspective schematic views of the steps in attaching solder balls to a TBGA tape using solder flux and photoimageable solder resist are illustrated. In FIG. 12A, copper pads 1202 are patterned onto a dielectric 1204 (associated circuit traces/leads attached to the pad perimeters and interspersed between the pads are not illustrated for clarity).

Figure 12B:
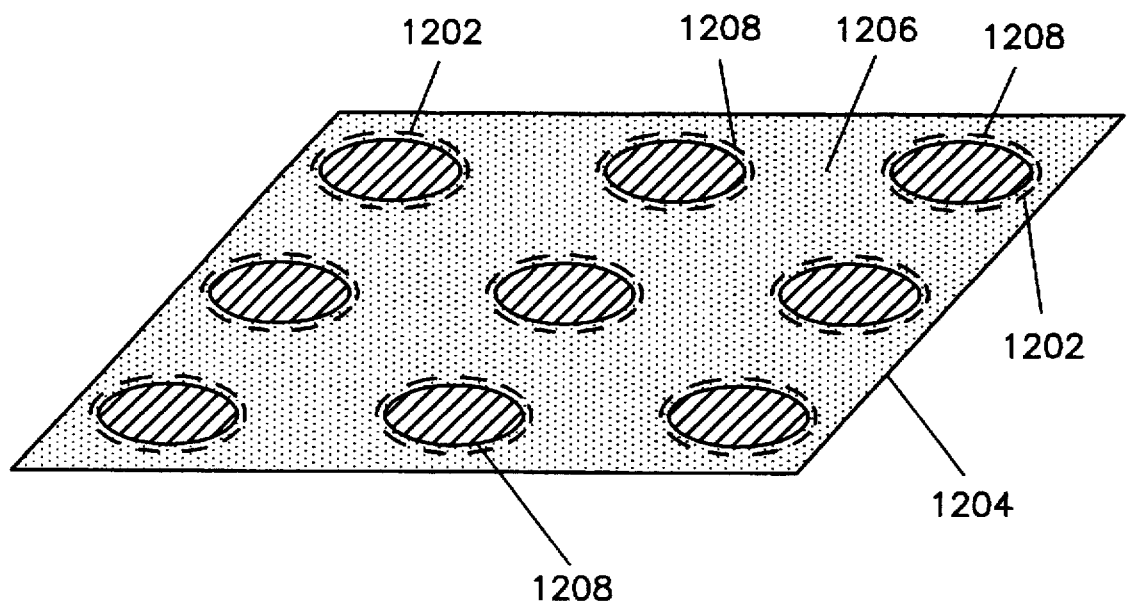

In FIG. 12B, photoimageable solder resist (PSR) is applied to the pads 1202 and dielectric 1204 by spraying, coating, screen printing, or other means known to those skilled in the art. The PSR is photoprinted and developed to reveal access "holes" 1208 to the underlying conductor pads 1202. The access holes 1208 may be smaller, larger or the same size as the underlying conductor pads 1202. After the PSR is applied and patterned, the exposed areas of the access holes 1208 may be plated with solder, nickel, gold, tin or any combination thereof.

Figure 12C:
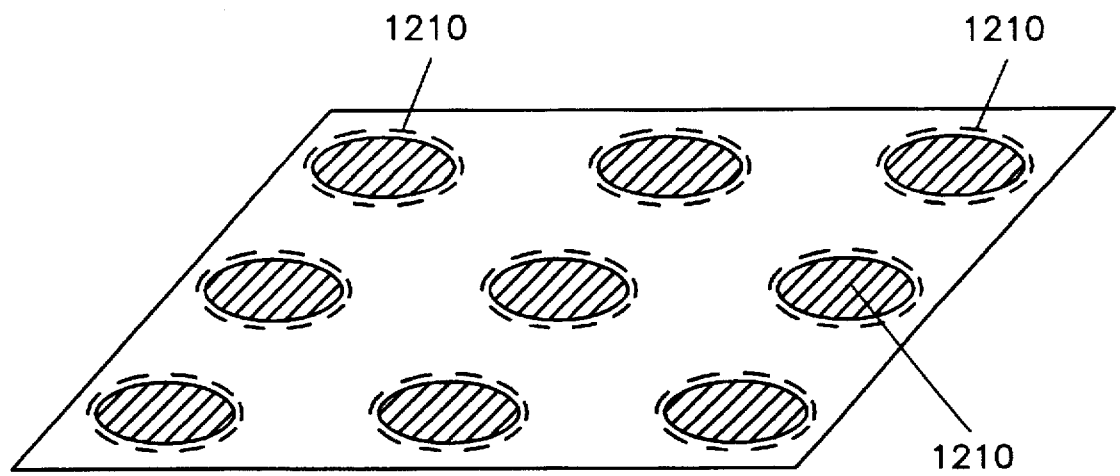
Figure 12D:
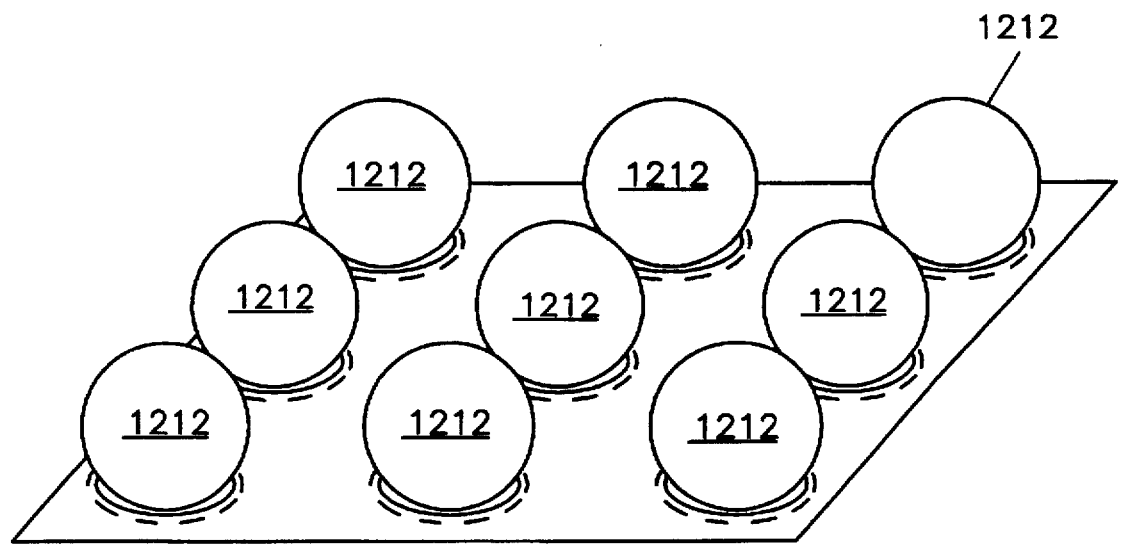

FIG. 12C illustrates solder flux 1210 applied to surfaces of the exposed access holes 1208 for attaching the solder balls 1212 FIG. 12D). The solder flux 1210 may be used to hold the solder balls 1212 in place. The flux also removes any oxides, tarnish, etc. that may detract from the wettability of exposed underlying metal pad 1202 or the surface of the solder balls 1212 during the solder reflow process.

FIG. 12D illustrates the solder balls 1212 in place on the surface of the pads 1202 and being held thereto by the solder flux 1210. This assembly may be passed through a solder reflow oven which reflows the solder balls 1212 by melting them onto the exposed pads 1202, through the underlying access holes 1208. Heat sufficient to reflow the solder balls may also be supplied by a laser heating system or other solder reflow systems known to those skilled in the art of semiconductor package fabrication.

Figure 12E:
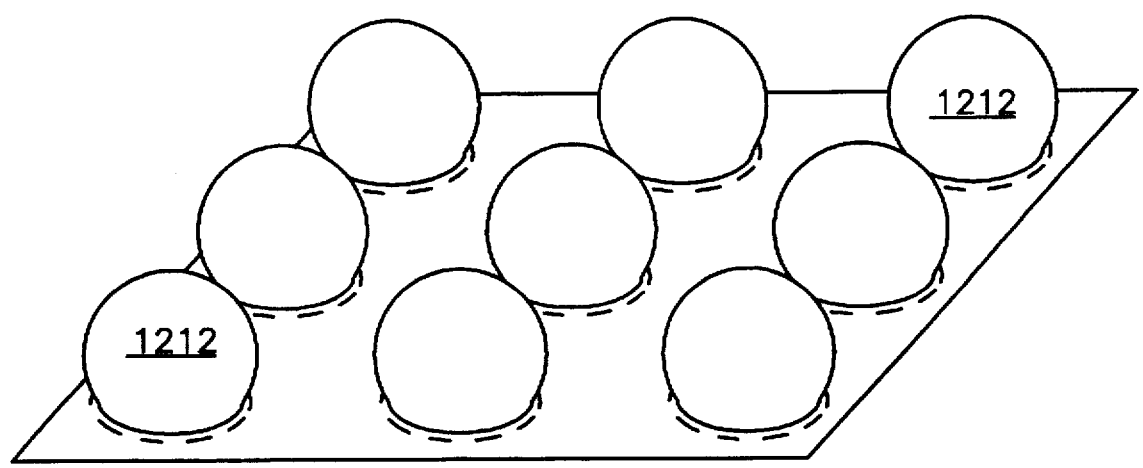
Figure 13:
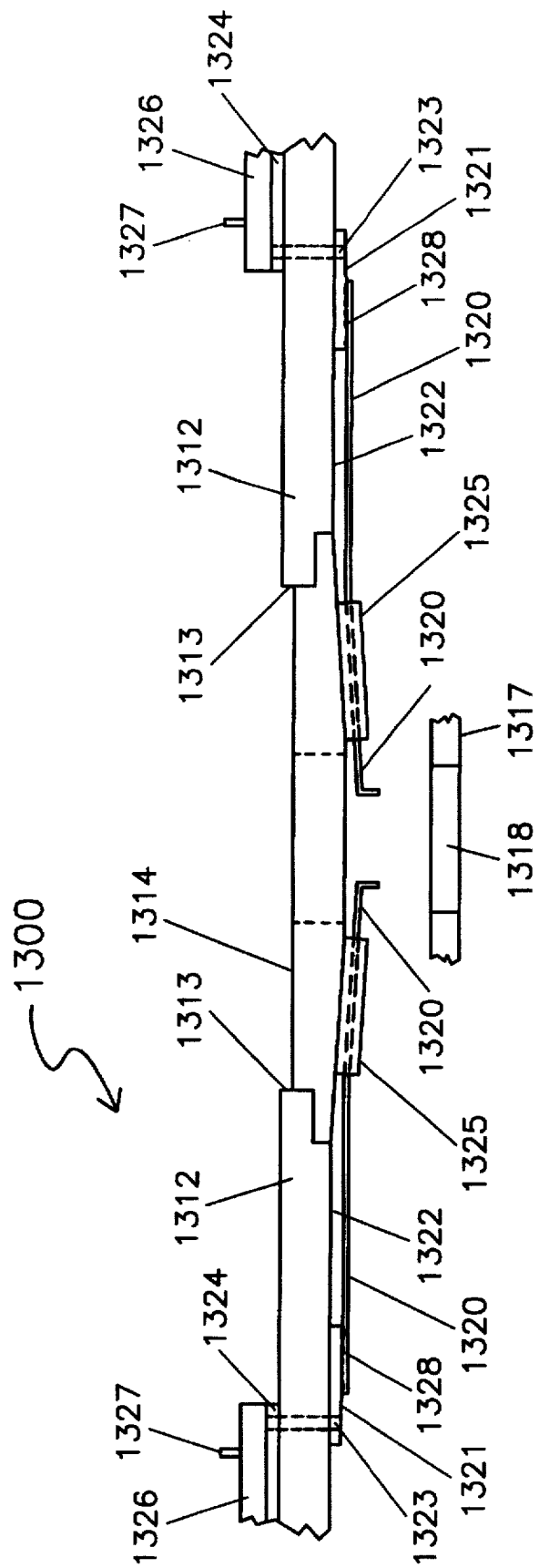
FIG. 13 is a cross-sectional view of an exemplary wafer probe card in accordance with the prior art.

The PSR restricts the solder wettable area to only the solder wettable surfaces directly under the holes 1208. An advantage of the present invention is that the chance of unwanted solder bridges forming between adjacent conductor leads is greatly reduced because these leads are generally no longer exposed to the possibility of wetting by molten solder. FIG. 12E illustrates the solder balls 1212 attached to the pads 1202 after solder reflow. Any remaining solder flux may be removed by aqueous cleaning methods well known to those skilled in the art.

WAFER PROBE CARD WITH A MULTI-LAYER FLEXIBLE SUBSTRATE

The above described techniques for breaking selected fine pitch conductive leads and bonding them to additional conductive layers also provide significant advantages in the context of wafer probe cards. Although the following description is directed to various preferred wafer probe card embodiments, it should be emphasized that the present invention can also be used with many other types of wafer probe cards. Testing using the wafer probe card techniques described may be performed on many different semiconductor devices. The devices need not have been formed on a wafer and may be separated from a wafer prior to testing. The term "wafer probe card" as used herein should therefore be understood to include any type of electrical testing apparatus which makes temporary contact with internal surfaces of a semiconductor device to facilitate testing.

Figure 14A:
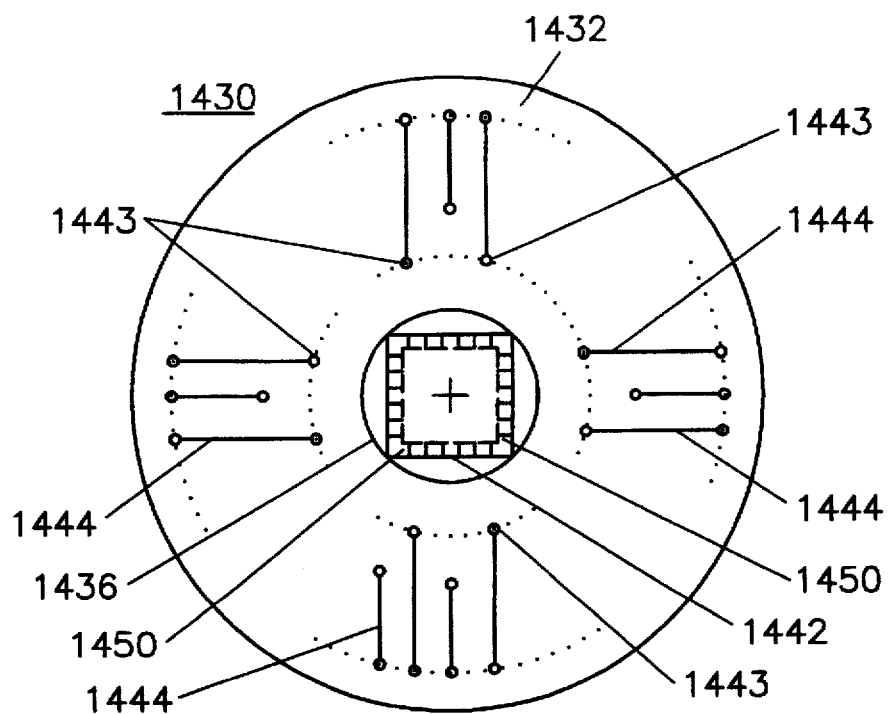
FIG. 14A is a plan view of the top side of one embodiment of a wafer probe card made in accordance with the system of the present invention.
Figure 14B:
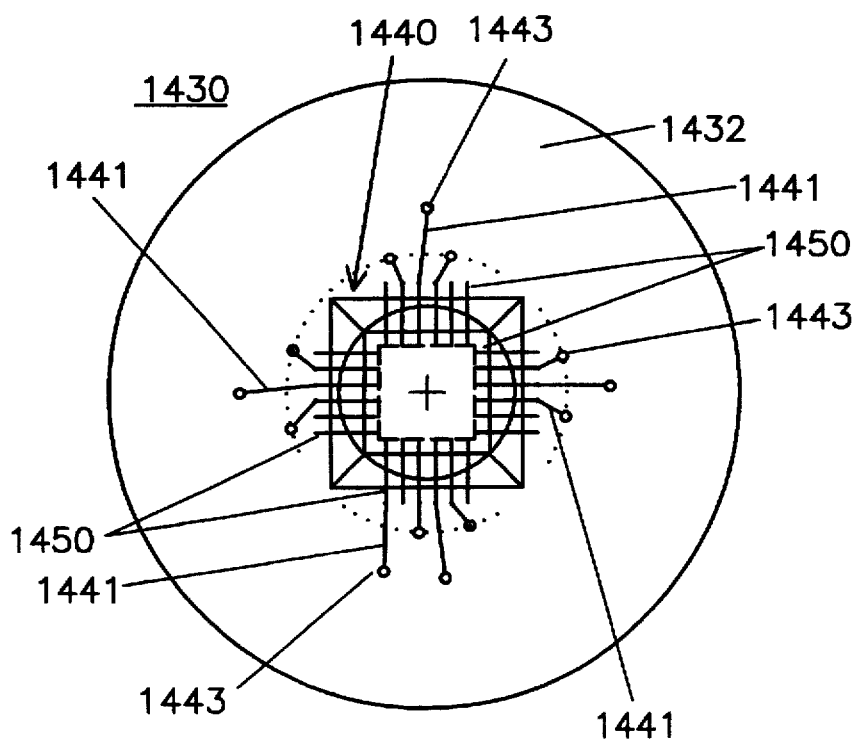
FIG. 14B is a plan view of the bottom side of the wafer probe card of FIG. 14A.

An example of one embodiment of a wafer probe card made in accordance with the system of the present invention is illustrated generally at 1430 in FIGS. 14A and 14B. The wafer probe card 1430 includes a printed circuit board 1432 with a central opening 1436 therein. A TAB tape illustrated generally at 1440 is attached to a lower surface of printed circuit board 1432 such that the TAB tape 1440 is arranged substantially around the central opening 1436 in board 1432. The TAB tape 1440 includes a number of fine pitch conductive leads 1450 formed on an insulating layer 1456. For purposes of clarity only a few exemplary leads 1450 are illustrated, although the TAB tape 1440 may include hundreds of leads. When the TAB tape is used in a wafer probe card the leads 1450 serve as probe leads. Each of the probe leads 1450 has an inner end which extends into an insulating layer central opening 1442 for making contact with bond sites on the integrated circuit die. The insulating layer central opening 1442 will typically coincide with or fall within an area defined by the printed circuit board central opening 1436. Each of the probe leads also has an outer end which is suitable for soldering or otherwise electrically connecting to lower surface traces 1441 etched or otherwise formed on the printed circuit board 1432.

The lower circuit board traces 1441 are formed in such a manner as to fan radially outward after a point of connection with the fine pitch conductive probe leads, such that via holes 1443 through printed circuit board 1432 may be used without encountering the problems noted in the above discussion of FIGS. 2A and 2B. The printed circuit board surface is large enough to permit a sufficient spread of traces such that the distance between adjacent traces on the printed circuit board may be several times the spacing between adjacent leads 1450 in the TAB tape. Since the trace spacing is significantly wider, via holes may be used to make interconnections between trace layers in the printed circuit board without restricting the density and pitch of the probe leads.

The upper surface of printed circuit board 1432 has a number of upper surface traces 1444 formed thereon. The via holes 1443 are plated through such that electrical connection is made between lower surface traces 1441 and upper surface traces 1444. The upper surface traces 1444 provide an interconnection to an external tester board at the outer periphery of the printed circuit board. For clarity only a few exemplary upper and lower traces 1444, 1441 and via holes 1443 are illustrated. The printed circuit board 1432 may include hundreds of traces in order to interconnect the numerous TAB tape leads to external test equipment.

Figure 14C:
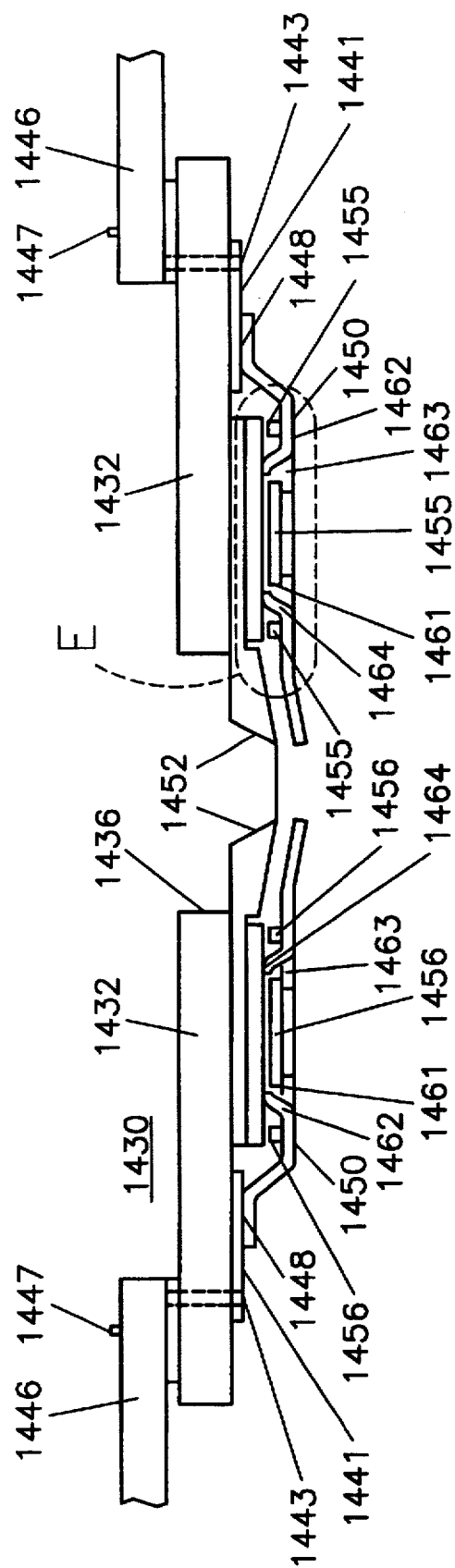
FIG. 14C is a cross-sectional view of the wafer probe card of FIGS. 14A and 14B taken along the line 14C—14C in FIG. 14B.
Figure 14D:
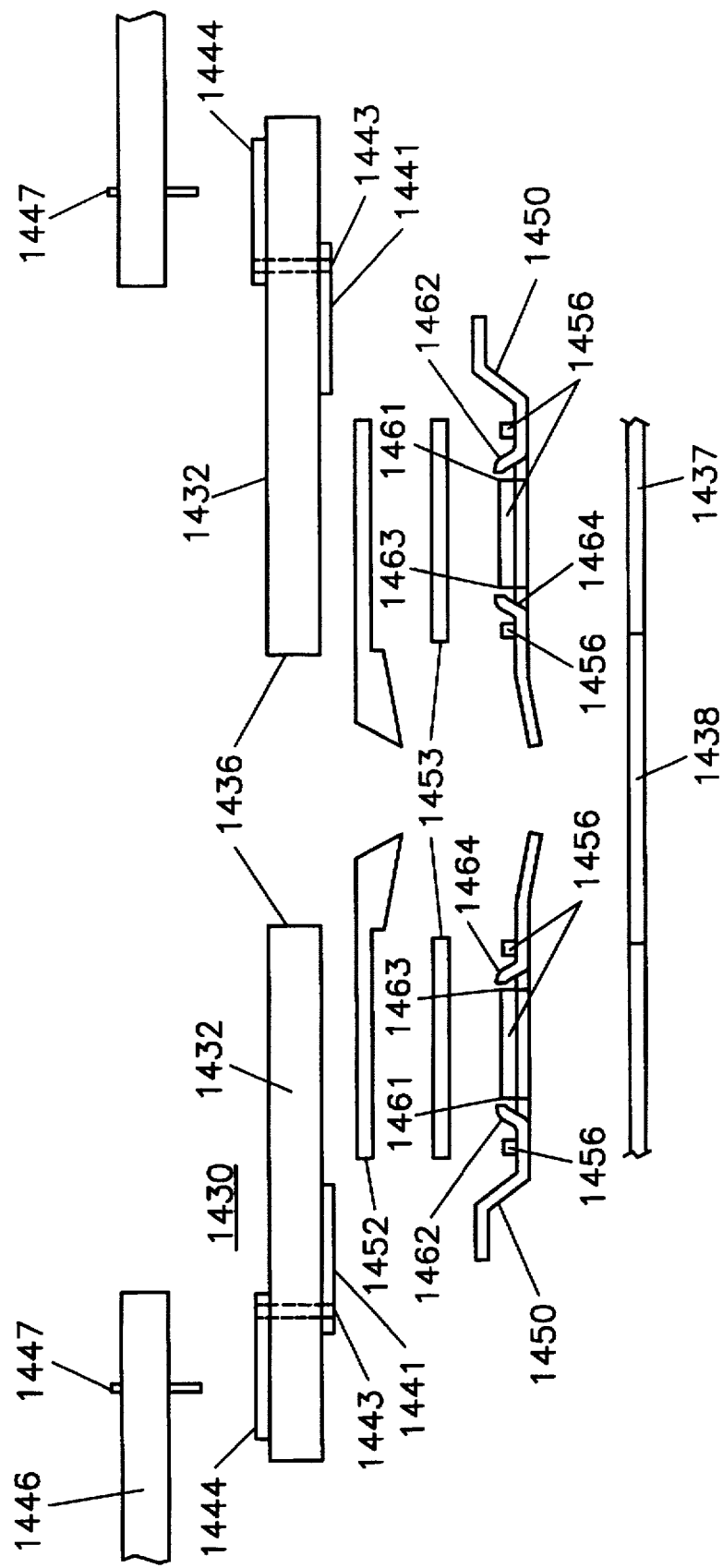
FIG. 14D is a cross-sectional exploded view of the wafer probe card of FIG. 14C.

Also for purposes of clarity, only the printed circuit board 1432 and TAB tape 1440 and elements thereof are illustrated in FIGS. 14A and 14B. The technique of breaking and bonding selected probe leads and connecting them to a second conductive layer and the manner of forming a downward bend in the inner ends of the probe leads to facilitate contact with bond sites on a die during testing are illustrated in the cross-sectional views of FIGS. 14C, 14D and 14E. FIGS. 14C, 14D and 14F include additional structural detail that more particularly illustrates the probe lead interconnection aspects of the present invention.

An exemplary wafer probe card such as that illustrated in FIGS. 14A and 14B is illustrated in greater detail in FIGS. 14C and 14D. FIG. 14D is an exploded view of FIG. C. The outer periphery of printed circuit board 1432 is connected with an external tester board 1446. Pins 1447 in the tester board 1446 make contact with suitable openings in upper surface traces 1444. Tester board 1446 supplies desired test signals and potentials to IC die 1438 for the purpose of electrically testing the IC.

Probe leads 1450 may be bent or otherwise formed into the shape illustrated. The probe leads are shaped so as to include an upward bend at the outer end of the probe lead to facilitate connection with printed circuit board lower traces 1441 as well as a downward bend at the inner end of the probe lead to facilitate probing of a die 1438 on wafer 1437. It should be noted that the probe lead shape illustrated here is exemplary only and designed for use in the embodiment of the wafer probe card illustrated. In other embodiments of wafer probe cards or probe applications the leads may be either bent or formed into any suitable shape or left in their original etched shape.

The wafer probe card 1430 also includes an insulating support plate 1452 which is bonded to the second conductive layer 1453 and also bonded to the lower surface of printed circuit board 1432. Epoxy or any other suitable adhesive may be used. The insulating support plate 1452 has an inner portion which is appropriately shaped to maintain the desired downward bend in the inner end of leads 1450. The downward sloping lower surface of the inner portion of the insulating support plate 1452 may contact the leads to urge them downward or may be slightly offset from the leads to provide downward pressure in the event the inner ends of the leads are urged upward by contact with die 1438 during probing. The die 1438 is brought into contact with the inner ends of the probe leads 1450 during testing by either lowering the wafer probe card toward the wafer or raising the wafer until the die contacts the probe leads. Other die contact techniques may also be used. The techniques are generally well-known in the art and therefore need not be discussed further herein.

The TAB tape illustrated generally at 1440 in FIGS. 14A and 14B can now be seen to include a distinct insulating layer 1456 to which leads 1450 are attached. The TAB tape insulating layer is typically formed of polyimide or other flexible plastic insulating and supporting material and the leads 1450 are formed thereon or otherwise attached thereto during the TAB tape manufacturing process. The probe leads can be considered a first conductive layer or "signal layer" as described in greater detail above. A second conductive layer or plane 1453 is also bonded to the insulating layer 1456 using epoxy or other adhesives. The second conductive layer is typically not patterned but is instead a continuous conductive plane. This second conductive layer generally serves as a reference plane for supplying ground or power potentials from the wafer probe card printed circuit board to appropriate bond sites on the IC die. In order to provide that function, selected probe leads corresponding to power or ground bond sites on the die should be bonded or otherwise attached to the second conductive layer in a manner discussed in greater detail below.

In order to provide the needed interconnections between the first conductive layer of probe leads and the second conductive layer, the insulating layer 1456 preferably includes both an outer peripheral opening and an inner peripheral opening through which outer and inner edge portions, respectively, of the second conductive layer are exposed. Each of the inner and outer peripheral openings include an inner edge and an outer edge. The outer peripheral opening is near the outer periphery of the insulating layer 1456 and the inner peripheral opening is near the inner periphery of the insulating layer 1456. In the preferred embodiment illustrated in FIGS. 14C and 14D the outer peripheral opening is a window-like outer elongated slot 361 and the inner peripheral opening is a window-like inner elongated slot 363. The probe leads 1450 pass over the slots 361, 363 in a direction transverse to the slot elongation. The outer elongated slot 1461 is similar to the slot 326 illustrated in FIGS. 3A and 3B. An outer end portion of the lead 1450 which passes over outer elongated slot 1461 is broken at an inner edge of the elongated slot 1461 in order to create an outer free end 1462 in a manner similar to that discussed above in connection with FIG. 3A. The outer free end 1462 is then bonded or otherwise attached to the outer edge portion of the second conductive layer 1453 through outer elongated slot 1461 as described in greater detail above. As a result of this breaking and bonding operation, the outer ends of leads 1450 that are attached to lower surface traces 1441 are further electrically connected to the second conductive layer 1453.

An interconnection with an inner edge portion of second conductive layer 1453 is provided through the inner elongated slot 1463 at an inner end portion of the probe lead 1450. In the packaging application illustrated in FIGS. 3A and 3B this interconnection is provided without the need for an inner elongated slot because the inner ends 312a, 314a and 316a of the leads 312, 314 and 316 are attached directly to the bond sites 332 on the die 330. In wafer probe card applications, no permanent attachment to the bond sites is made, so the inner end portion of the bond leads must be supported in a different manner when the inner end portions of the probe leads are broken to create an inner free end. The inner elongated slot 1463 provides a window through which connection of an inner free end 1464 can be made to an inner edge portion of the second conductive layer 1453. When the inner end portion of the probe lead 1450 which overlies inner elongated slot 1463 is broken at an outer edge of slot 1463 to create free end 1464, this free end 1464 remains attached to the insulating layer 1456 at the portion of the insulating layer located between the inner elongated slot 1463 and the inner peripheral edge of the insulating layer. The inner free end 1464 is bonded to the second conductive layer 1453 through the inner elongated slot 1463. The inner edge of the second conductive layer 1453 therefore need not extend beyond the inner peripheral edge of the insulating layer 1456 as was the case in FIG. 3A.

The connection of the inner free end 1464 to the second conductive layer 1453 provides an electrical path for selected wafer probe card lower surface traces 1441 from an outer end of lead 1450 through second conductive layer 1450 to an inner end of lead 1450. Power and/or ground potentials carried by selected probe leads 1450 to IC die 1438 therefore travel through the second conductive layer for much of the distance between lower surface traces 1441 and the die bond sites. Electrical performance is thereby considerably improved in a manner similar to that discussed above in the packaging context. The attachment of the second conductive layer 1453 to the TAB tape 1440 also substantially rigidizes the flexible insulating layer to thereby provide the advantages of a more rigid mechanical support.

Figure 14E:
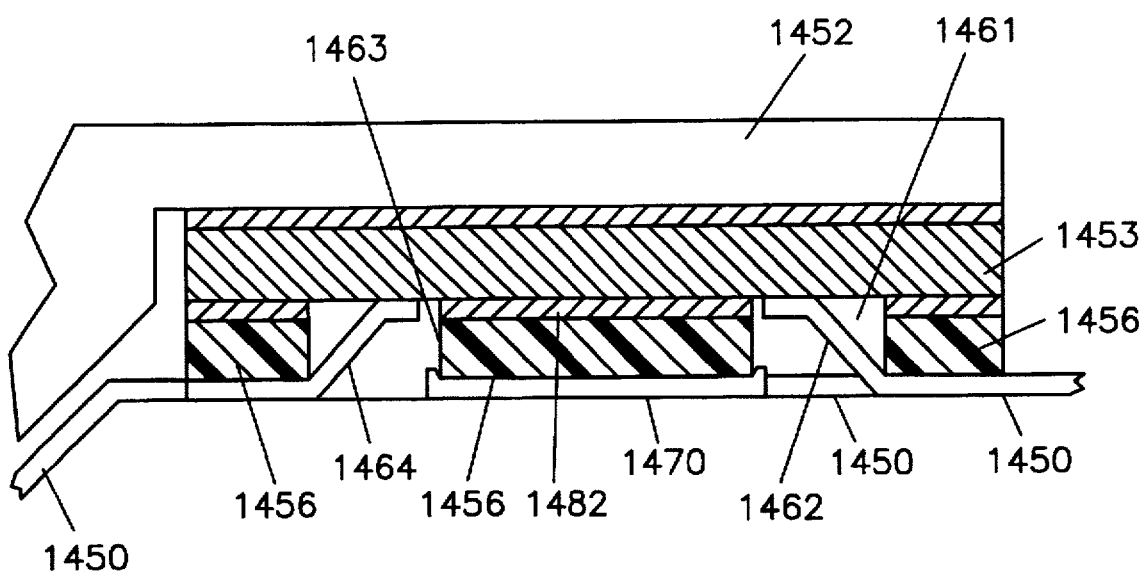
FIG. 14E is a cross-sectional view of a detail labeled 14E in FIG. 14C.
Figure 14F:
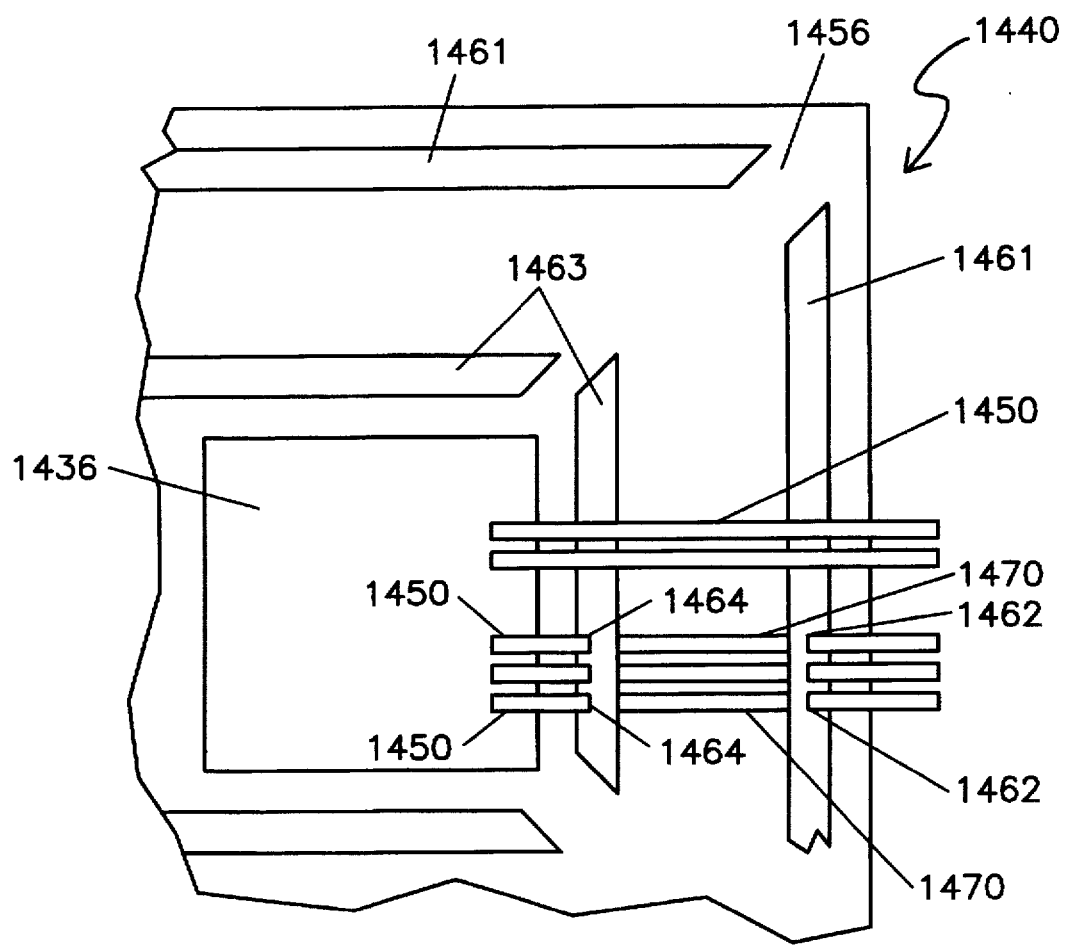
FIG. 14F is a partial plan view of a TAB tape package for use with a wafer probe card of FIGS. 14C and 14D.

FIG. 14E provides a more detailed view of the interconnections between the free ends 1462 and 1464 through respective insulating layer slots 1461 and 1463. The leads 1450 are broken at the locations illustrated to create inner and outer free ends in a manner similar to that discussed in connection with FIG. 3A. The attachment between the inner end of lead 1450 and the insulating layer 1456 supports free end 1464 when it is created by breaking the lead 1450 at an outer edge of slot 1463. The free end 1462 is formed in the same manner as free end 312g illustrated in FIG. 3A. An intermediate portion 1470 of the broken lead 1450 thus remains over an intermediate portion of the insulating layer 1456 after the free ends 1462, 1464 are created by breaking lead 1450 at the two locations illustrated.

FIG. 14E also illustrates in greater detail the interconnection of the various layers and the insulating support plate 1452. An upper surface of second conductive layer 1453 is bonded to insulating support plate 1452 via epoxy layer 1480. A lower surface of second conductive layer 1453 is bonded to insulating layer 1456 via epoxy layer 1482. The epoxy layer 1482 should be applied in such a manner as to avoid covering the lower surface of the second conductive layer in the area of the slots 1461 and 1463. As mentioned previously, other suitable adhesives may further be substituted for epoxy.

In order to achieve optimal electrical performance it is often desirable to make the interconnections between selected leads 1450 and second conductive layer 1453 as close as possible to the edge of the layer 1453 in order to maximize the distance the power or ground potentials travel in the second conductive layer while minimizing the distance traveled in the lead 1450. The outer end of lead 1450 is thus preferably as short as possible while the inner end is preferably no longer than necessary to extend from the inner edges of the insulating layer and second conductive layer to the die 1438. The outer and inner elongated slots 1461, 1463 should therefore be located as near as possible to the outer and inner peripheries of the insulating layer 1456, respectively.

A plan view of a preferred arrangement for the outer and inner elongated slots 1461, 1463 can be seen in FIG. 14F. The slots are formed such that they underlie the leads 1450 in a transverse direction near the inner and outer peripheries of the insulating layer 1456. The slots are preferably just wide enough to permit the selected leads 1450 to be easily broken and bonded to the second conductive layer. The width is preferably limited since it is undesirable for substantial portions of unbroken leads to be unsupported and exposed to the second conductive layer through the slots. The preferred inner and outer peripheral openings in the insulating layer in the form of elongated slots 361, 363 extend under all of the probe leads 1450 in order to provide maximum design flexibility. A single TAB tape design such as that illustrated generally at 1440 can therefore be used with many different wafer probe cards and ICs. It is not necessary to redesign the slots to accommodate a particular application since any of the probe leads 1450 can be broken and bonded to the second conductive layer through the slots. It should be noted that many other shapes may be used for peripheral openings 1461, 1463 and that the peripheral openings need not underlie all of the leads 1450. For example, in certain applications it may be that only a predetermined subset of leads will be used for carrying power, ground or other reference signals to the IC through the second conductive layer. In such a case the inner and outer peripheral openings may be designed such that they are located only under the subset of leads which are likely to be connected to a second conductive layer. It would also be possible to design a different TAB tape for each wafer probe card such that the inner and outer peripheral openings are only under the particular leads being connected to the second conductive layer in that application.

It should further be noted that only selected probe leads 1450 are broken and bonded to the second conductive layer 1453. This was also illustrated in FIG. 3A where leads 314 and 316 extended continuously and unbroken from die 330 to their outer ends 314e and 316e while only lead 312 was broken and bonded to second conductive layer 340. The majority of the probe leads 1450 will typically carry signals to and from die 1438 and will therefore remain unbroken and entirely within the first conductive layer or signal plane on insulating layer 1456. In the cross-sectional views of FIGS. 14C, 14D and 14E portions of a continuous unbroken lead which travels from lower surface trace 1441 to its inner end entirely in the signal plane can be seen behind the broken lead 1450. The inner and outer free ends 1462, 1464 which have been created by breaking and bending selected leads 1450 are thus seen in these FIGS. as extending above the signal plane which contains the probe leads 1450 which are continuous and unbroken. The leads 1450 illustrated in these cross-sectional views therefore include views of the inner end portion and outer end portion of the next unbroken lead after the broken lead. A similar view would result if FIG. 3A were viewed only in cross-section rather than in perspective, since the inner end portion 314b and outer end portion 314f of unbroken lead 314 would be visible at the points 312b and 312g where lead 312 is broken and bonded to second conductive layer 340.

It should be understood that the above discussed implementation of a wafer probe card including a TAB tape with a second conductive layer may be readily extended to include additional conductive planes or layers. The manner of providing such additional conductive layers is similar to that illustrated in FIG. 4A. The outer portion of insulating layer and second and third conductive layers may also be as illustrated in FIG. 4A. The outer free ends of a selected lead 1450 will be broken and bonded to the second and third conductive layers as illustrated. The inner portions of selected leads 1450 will not be bonded to the IC die but will instead be bonded through an inner slot in the insulating layer and past the inner edge of the second conductive layer. An inner spacer block would be provided to underlie the inner portion of the insulating layer supporting the inner portion of lead 1450. The inner spacer block would be similar to the outer spacer block 480 of FIG. 4A. Any inner free ends to be connected to the second conductive layer would be bonded to an inner edge portion of the second conductive layer which extended beyond an outer edge of the inner slot in the insulating layer. This would be similar to the manner in which the outer end portion 414f of lead 414 is connected to an outer edge portion 446 of second conductive layer 440 in FIG. 4A. Any inner free ends to be connected to the third conductive layer would be bonded to an inner edge portion of the third conductive layer through the slot and past an inner edge of the second conductive layer. This would be similar to the manner in which the outer end portion 412f of lead 412 is connected to the outer edge portion 466 of third conductive layer 460 in FIG. 4A. In the case of a wafer probe card the mirror image of the interconnections of the outer end portions of the leads illustrated in FIG. 4A would therefore be provided for the inner edge portions in place of interconnections to the IC die.

Figure 15:
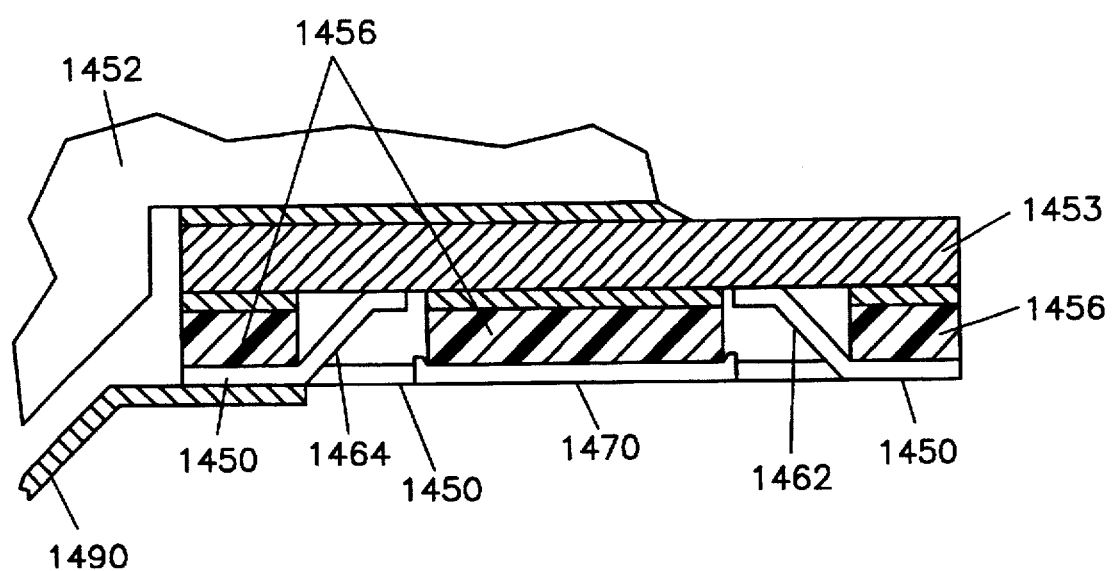
FIG. 15 is a cross-sectional view of the detail labeled 14E in FIG. 14C in accordance with an exemplary alternative embodiment of the system of the present invention.

FIG. 15A illustrates a second preferred embodiment of the wafer probe card of the present invention. In this embodiment the interconnection between the probe leads 1450 and the reference layer 1453 is the same as that discussed in conjunction with FIGS. 14A–14D above. In this variation the inner ends of probe leads 1450 do not serve as a probe tip which contacts the surface of the IC die. An attached probe tip 1490 is instead soldered or otherwise attached to the leads 1450. Manual soldering is not required since the leads 1450 are already aligned and fixed in place via their attachment to the insulating layer 1456. The individual probe tips 1490 can be temporarily held together by a leadframe and then reflow soldered to the probe leads 1450. The attached probe tip 1490 can be constructed of a material which has the optimal properties desired for repeated probing of the IC die bond sites. The attached probe tips 1490 are preferably constructed of a material such as beryllium-copper alloy which exhibits stiffness and hardness. Other suitable probe tip materials include tungsten. The etched probe leads 1450 attached thereto are typically formed from copper plated with gold, solder or tin and therefore may not have optimal probing properties in a given application.

The inner ends of the probe leads 1450 may be severed at the inner periphery of the insulating layer in order to facilitate attachment of probe tips 1490. Alternatively, the TAB tape itself may be designed such that the etched probe leads do not extend past the inner periphery of the insulating layer 1456. The probe tips 1490 are not limited to the shape illustrated in FIG. 10A. The probe tip 1490 are formed for use with the exemplary preferred wafer probe card discussed above. In other types of wafer probe cards the formed shape of the probe tips 1490 could be modified as desired. The probe tips could also be flat and unformed. Pressure applied to the probe tips would flex the tip such that contact could be made with the IC die.

Although the foregoing detailed description has been primarily directed to exemplary preferred embodiments of the present invention, it should be understood that this has been done by way of example only and not by way of limitation. For example, the present invention can be applied to a wide variety of wafer probe cards as well as to other types of IC test devices. Two or more additional conductive layers may be incorporated into the multi-layer flexible substrate disclosed herein to provide further improvements in electrical performance. The inner ends of the probe leads may be modified to include different sizes and shapes of attached probe tips. It will be readily apparent to those skilled in the art that these and many other modifications are possible without deviating from the claims of the present invention, and equivalents thereof.

Many other combinations of features, some of which have been expressly set forth hereinabove, are within the spirit and scope of this invention and may be advantageously utilized in SCM, MCM, and BLP systems as contemplated herein.

System level products may be designed and fabricated in various forms. A system level product may, for example, include a single chip modules ("SCM") having a single semiconductor die in a single package body, with or without other electrical components, such as capacitors. System level products may also include multi-chip modules ("MCM") having two or more semiconductor dies in the same or separate package bodies, with or without other electrical components. System level products may also include board level products ("BLP"), such as those having one or more semiconductor devices on one or more printed wiring boards. Box level products ("Boxes") are also system level products which may include a combination of SCMs, MCMs, BLPs, and/or other devices. One or more of such SCMs, MCMs, BLPs or Boxes may act as, or be integrated into, a functional system or subsystem or the like.

System level products can be employed to carry out numerous applications and in various environments. For example, system level products may include:

(a) computer systems comprising personal computers, work stations, servers, embedded logic controllers, digital data storage, minicomputers, mainframe computers and super computers;

(b) information and entertainment transmission systems comprising telecommunications, satellite, cable, cellular telephones, private branch exchange, telephone switching, and video picture telephones wherein the information may be digitally compressed and forward error corrected;

(c) entertainment systems comprising digital video and audio systems, such as digital analog tape and high definition television, playback devices, display and reproduction means, for example, televisions, cameras, recorders, compact disc players/recorders, digital tape players/recorders and the like;

(d) security and surveillance systems comprising home and business security intrusion, flood and fire systems; vehicle alarms;

(e) information, data acquisition and control systems comprising industrial plant sensors and control means, and control systems utilizing information from the sensors to actuate the control means; and (f) transportation systems comprising airplanes, trains, automobiles, helicopters, rockets, missiles, boats and submarines, and the like, as well as subsystems utilized in the transportation systems, which include positioning systems (for example, global positioning systems), navigational displays and controllers, hazard avoidance systems (such as radar and sonar), fly by wire control systems and engine controlling and monitoring systems.

The above mentioned systems may also be combined to comprise larger and more complex systems that can be utilized to facilitate the infrastructure of a home, business, municipality, government entity, city wide community, state governance, world wide communications, information distribution and security.

In an SCM, a single semiconductor die is packaged and adapted for connection to external systems. This usually involves mounting the die to some sort of substrate, lead frame or carrier, connecting the bond pads on the die to some sort of conductive leads or traces and forming a package body around the die. The conductive leads or traces exit the package body, and usually terminate in external leads, pins or solder balls.

Figure 16:
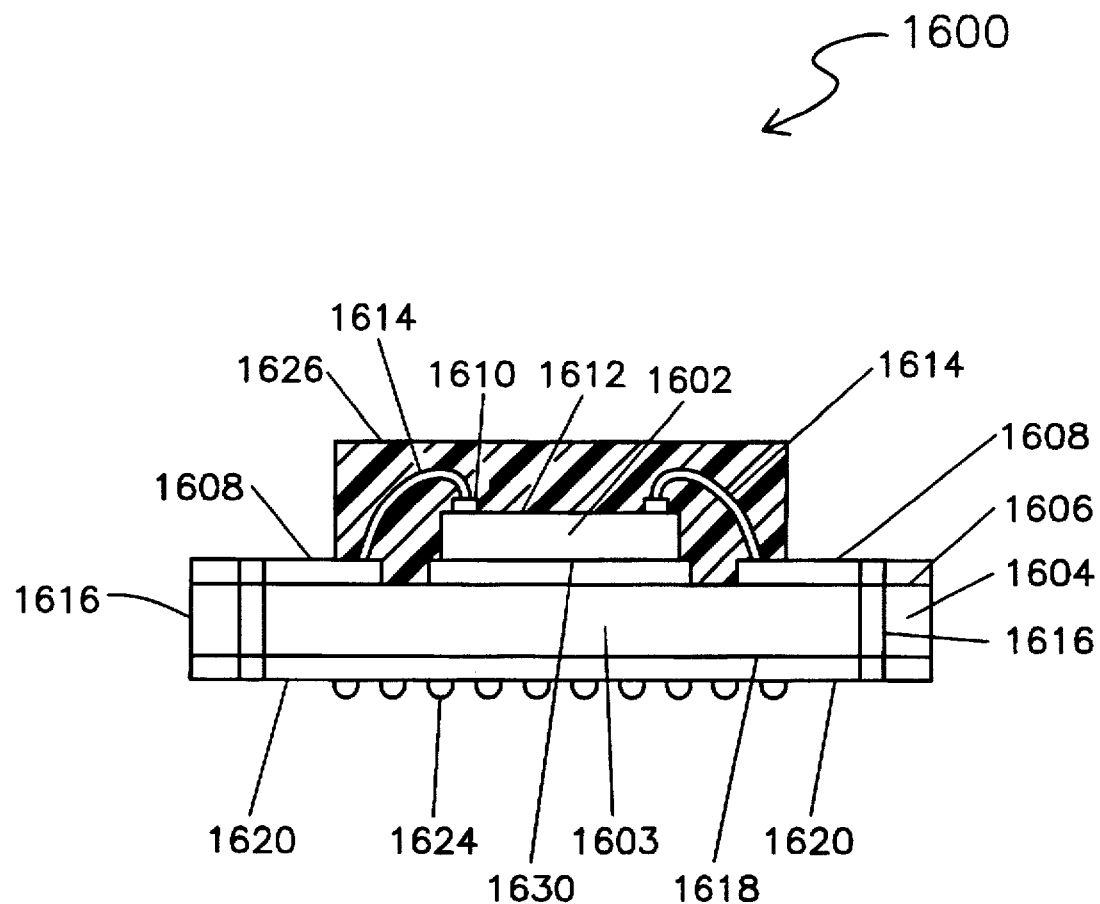
FIG. 16 is a schematic elevational view of a single chip module illustrated in cross section.

Referring to FIG. 16, a schematic elevational view of a SCM is illustrated in cross section. The SCM 1600, as illustrated, is a ball bump grid array semiconductor package. A semiconductor die 1602 is mounted to the top surface of a central area 1603 of a substrate 1604. The semiconductor die has conductive lines 1612 formed thereon (not illustrated). The top surface 1606 of the substrate 1604 is provided with a number of conductive traces 1608 that extend from near the periphery of the substrate 1604 to the central area 1603. The die 1602 has bond pads 1610 thereon. Bond wires 1614 extend from the bond pads 1610 to inner ends of the traces 1608. Near the periphery of the substrate 1604, there are plated (conductive) through-holes (vias) 1616 extending from the bottom surface 1618 of the substrate 1604, through the substrate to a respective trace 1608. The bottom surface 1618 of the substrate is provided with a number of conductive traces 1620, each having an end connected with a respective via 1616. In this manner, signals (and power) to and from the die are connected through the bond wires 1614, through the top side traces 1608, through the vias 1616, to the bottom side traces 1620. Solder balls 1624 are attached to the traces 1620. A package body 1626 is formed over the die 1602, and partially covers the top surface of the substrate 1604.

Pin grid array semiconductor packages, chip carriers (leaded or leadless), flat packs (such as plastic quad gullwing flat packs), ceramic packages and small outline integrated circuits are also examples of SCMs. Numerous other examples, designs and types of SCMs are known to those of ordinary skill in the art of semiconductor integrated circuit packages.

When two or more semiconductor dies are mounted in the same or separate package body, with or without other electrical components, the resulting assembly is typically referred to as a multi-chip module (MCM).

In order to connect to one of the two or more semiconductor dies of a MCM, a substrate having conductive traces (like substrate 1604 of FIG. 16) is often used. Additional components such as capacitors, resistors and inductors may be mounted to the substrate. Often, the interconnections between the various components mounted to the substrate necessitate a large number of conductive traces which need to cross one another. In such cases, it is known to provide a substrate, having alternating layers of insulating material (such as fiberglass, teflon, FR4, BT resin, and the like) and conductive trace patterns (typically formed of metal foils, such as copper). The conductive traces from one layer are typically connected to the conductive traces of another layer by plated through-holes or vias.

Figure 17:
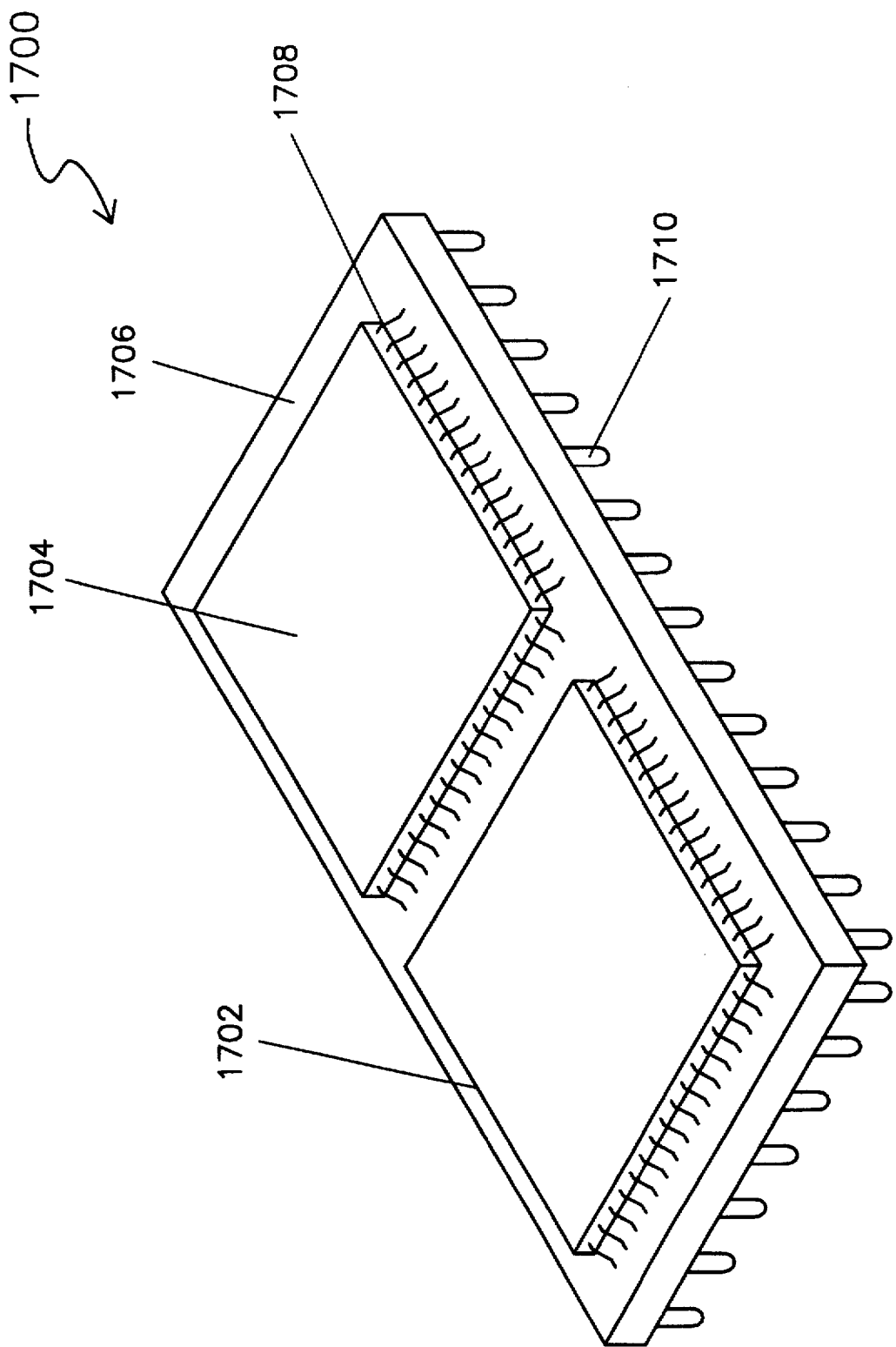
FIG. 17 is a schematic perspective view of a multi-chip module.

FIG. 17 illustrates a schematic perspective view of a MCM. MCM 1700 comprises a substrate 1706 having conductive lines formed thereon (not illustrated), at least two semiconductor dies 1702 and 1704 disposed on the substrate 1706 and electrically connected to conductive lines (not illustrated) of the substrate 1706 by the outer tips of lead frame leads 1708. The dies 1702 and 1704 may be physically mounted to the substrate 1706. The two semiconductor dies 1702 and 1704 are illustrated encapsulated, however, non-encapsulated flip-chip ball bump dies are also contemplated. One or more layers of conductive traces and plated through-holes (not illustrated) may be disposed within substrate 1706 and are used to connect the semiconductor dies 1702 and 1704 to one another and to external connections 1710, such as the solder ball bump structures as described above. Additional electrical components, such as capacitors, resistors and inductors (not illustrated) may also be disposed on and connected to the substrate 1706. Numerous other examples, designs and types of MCMs are known to those of skill in the art of semiconductor packages.

A BLP typically includes one or more semiconductor devices (such as a single chip module and/or a multi-chip module), in addition to other components, on one or more printed wiring boards.

Figure 18:
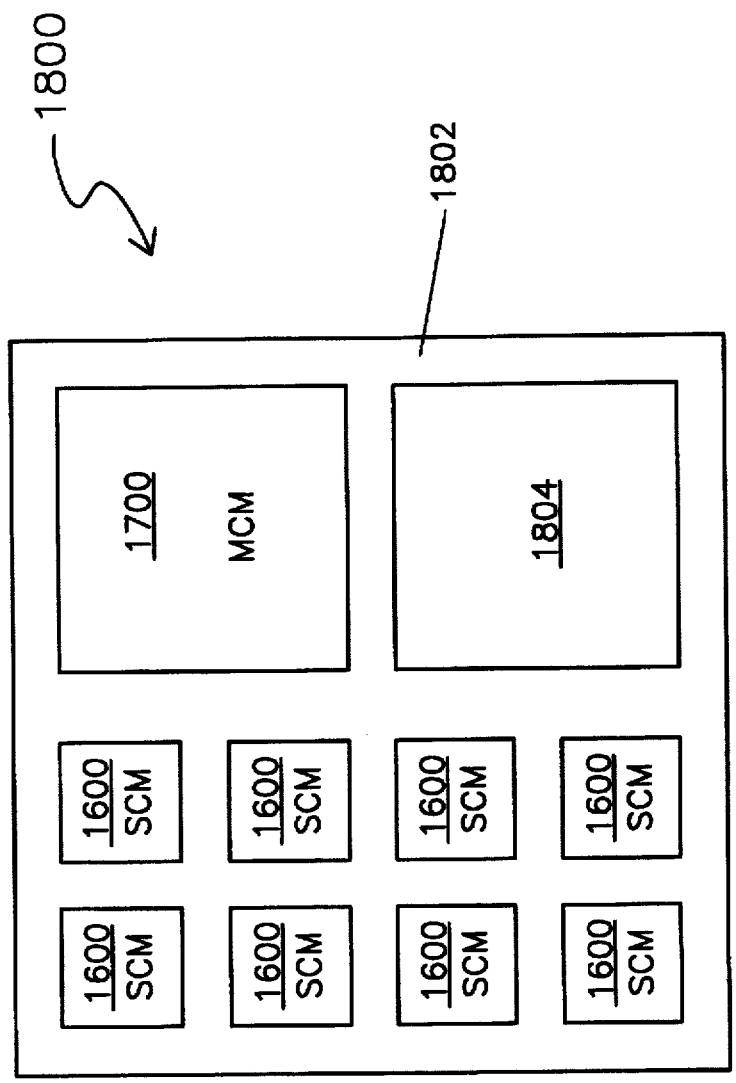
FIG. 18 is a schematic top view of a board level product.

FIG. 18 illustrates a schematic top view of a board level product (BLP). The BLP 1800 comprises an array of SCMs 1600, a MCM 1700, and a memory component 1704. The SCMs 1600, the MCM 1700, and memory 1804 are each disposed on and connected to a printed wiring board 1802. The printed wiring board 1802 provides for all connections between those components. Examples of BLPs include central processing unit boards, memory boards, and interface boards (as are routinely utilized in computer systems).

Boxes are also system level products which may include a combination of SCMs, MCMs, BLPs, and/or other devices. For example, multiple board level products may be connected in parallel with one another by a bus (such as a back plane bus, which is also referred to as a mother board), which communicates signals therebetween. Numerous other examples, designs and types of Boxes are readily apparent to one of ordinary skill in the art. The conductive leads wires exit the boxes, and are usually terminated at external leads or pins.

Figure 19:
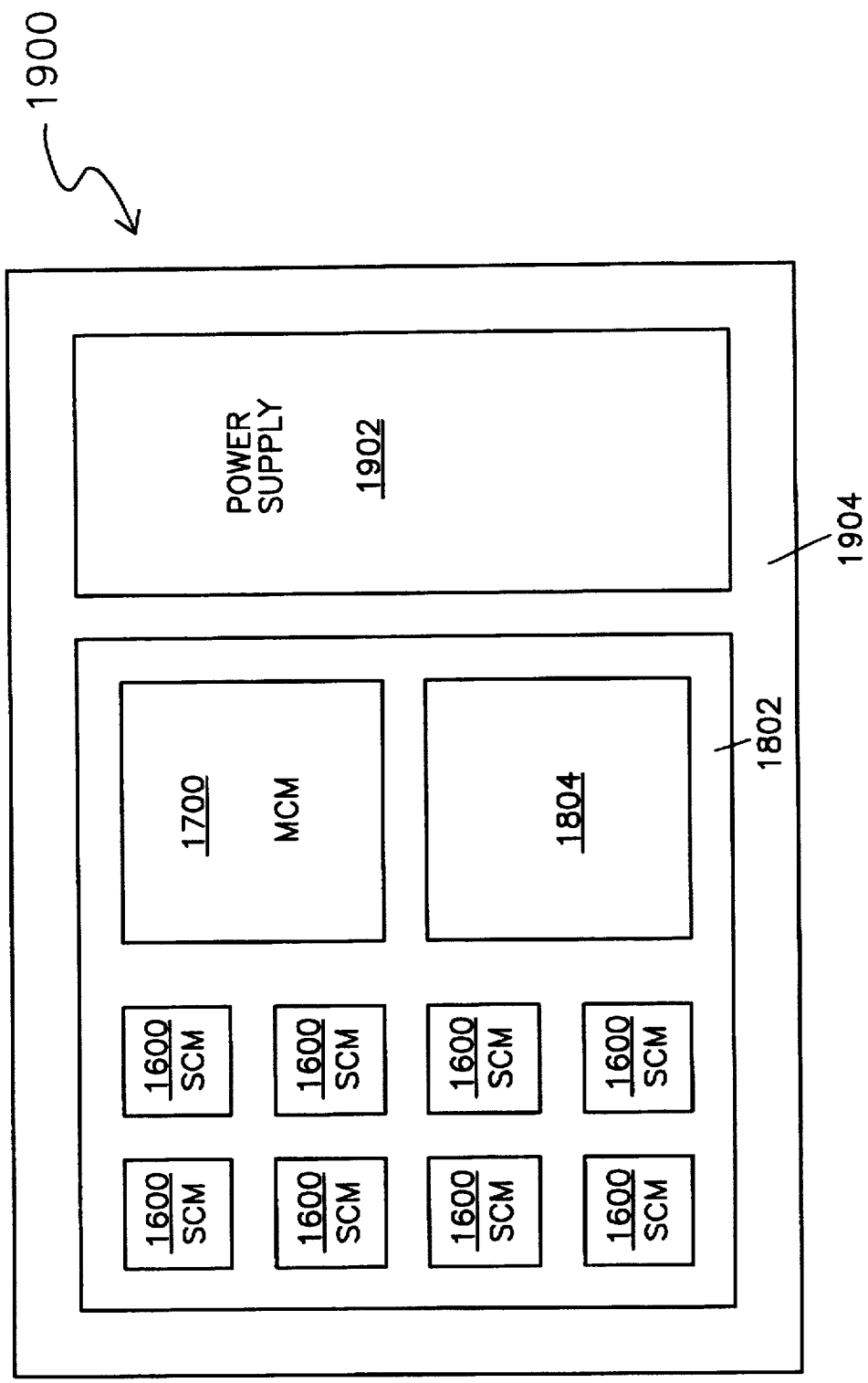
FIG. 19 is a schematic top view of a box level product.

FIG. 19 illustrates a schematic top view of a box level product. The box level product 1900 comprises at least one printed wiring board 1802 as described above, a power supply 1902 and an enclosure or box 1904 containing the at least one board 1802 and the power supply 1902. One or more box level products may be used to create more complex systems according to the present invention.

Figure 20:
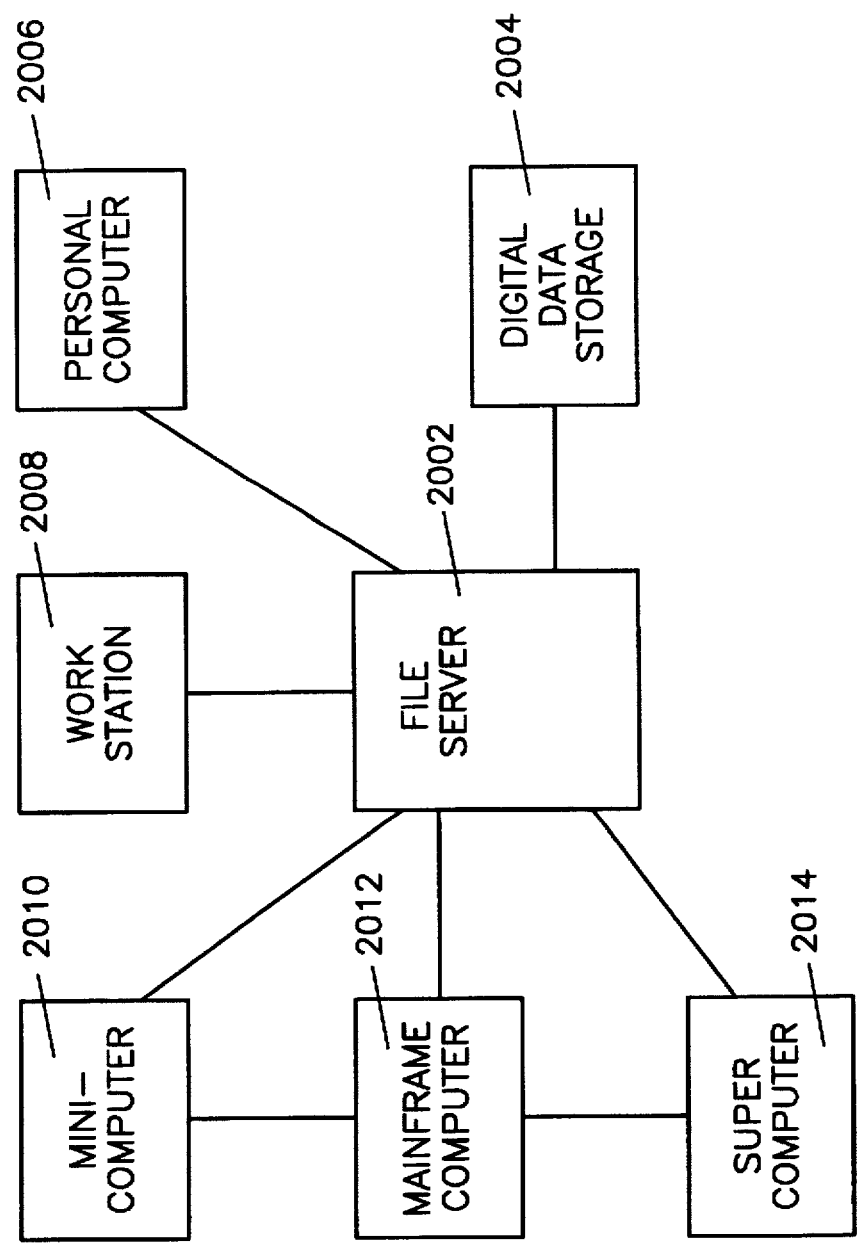
FIG. 20 a schematic block diagram of a computer system.

FIG. 20 illustrates a schematic block diagram of various computer systems interconnected together via various digital data transmission systems. A file server 2002 is connected to a digital data storage device 2004 such as, for example, magnetic hard disk, tape, optical disk, flash memory, core memory, semiconductor memory and the like. The server 2002 may be connected to at least one personal computer 2006, a work station 2008, a minicomputer 2010, a mainframe computer 2012, and a super computer 2014 through a number of digital data transmission system networks such as token ring, star, coaxial, fiber-optic and the like. These networks may utilize data protocols such as Scaleable Coherent Interface ("SCI"), ANSI/IEEE Std 1596-1992 SCI, Asynchronous Transfer Mode ("ATM"), FiberChannel, SerialBus, SCSI, SSA, QuickRing, HIPPI, FDDI, Ethernet and the like.

Figure 21:
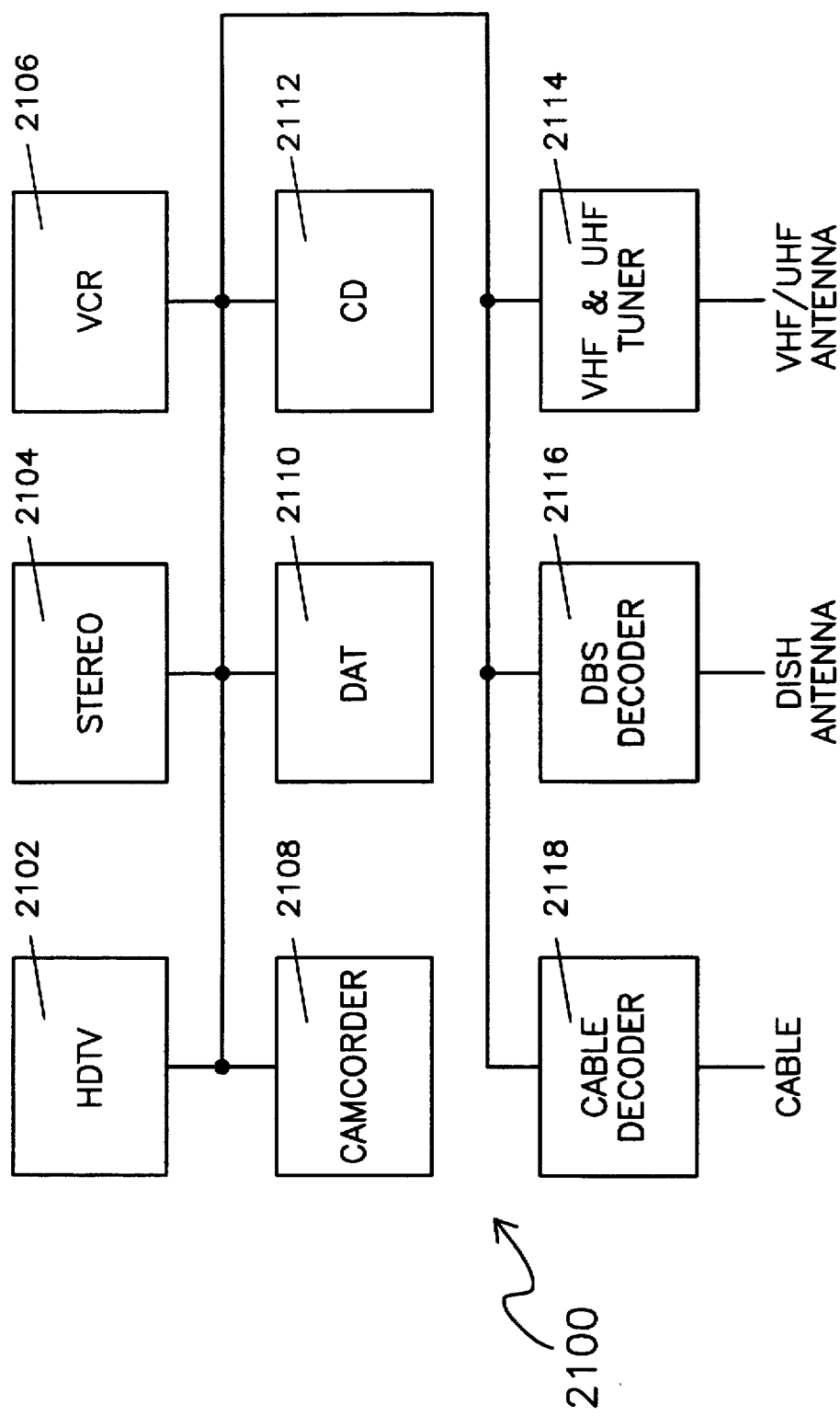
FIG. 21 a schematic block diagram of an entertainment system.

FIG. 21 is a schematic block diagram of an entertainment system according to the present invention. The entertainment system 2100 may be comprised of the following component subsystems: a high definition television (HDTV) 2102, a stereo 2104, a video cassette recorder (VCR) 2106, a television camera/recorder (Camcorder) 2108, a digital audio tape unit (DAT) 2110, a compact disk player (CD) 2112, a VHF/UHF tuner 2114, a direct broadcast satellite (DBS) decoder 2116, and a cable decoder 2118. These component subsystems are made up of SCM, MCM, BLP and boxes as disclosed above.

Figure 22:
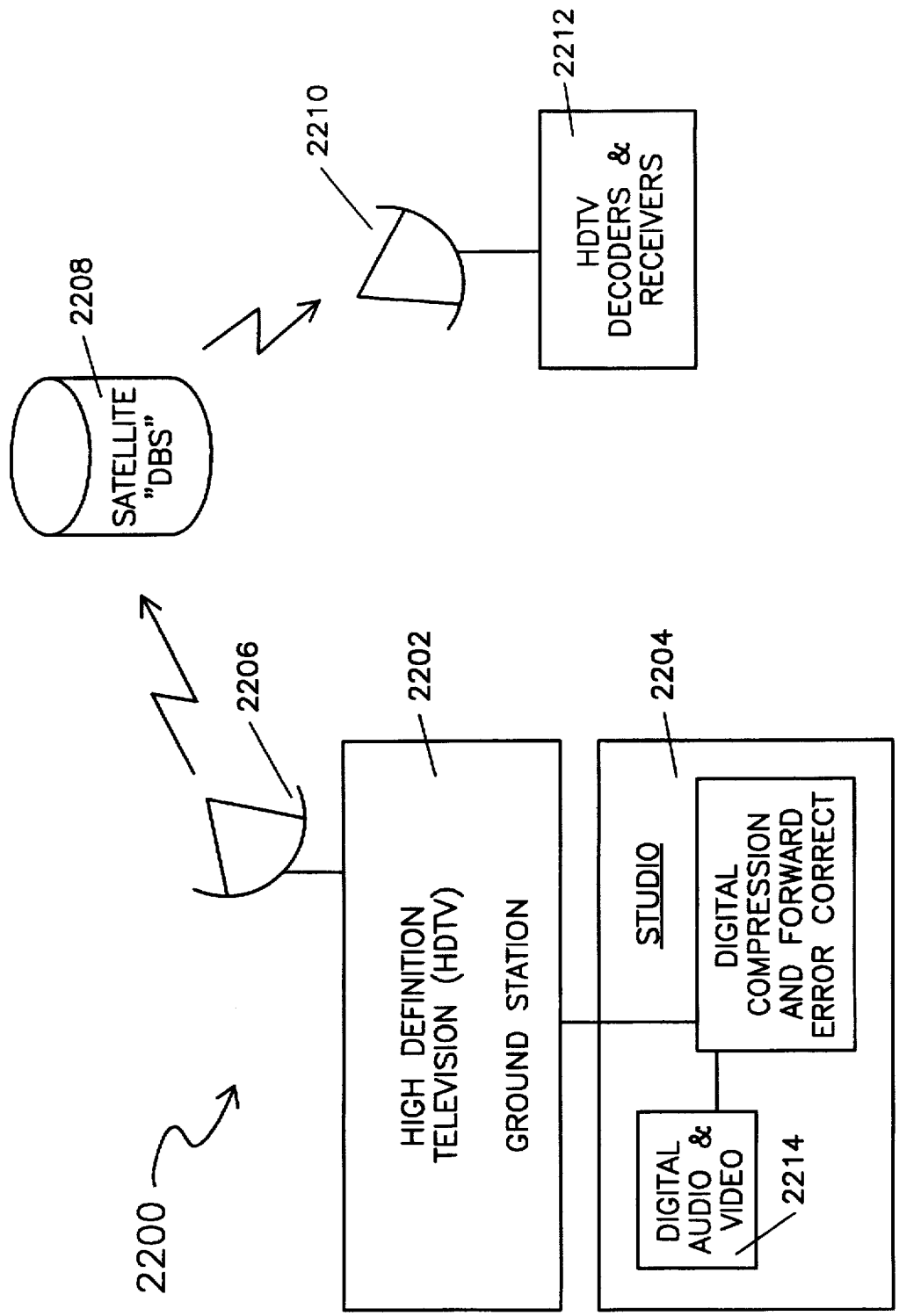
FIG. 22 is a schematic block diagram of an information and entertainment transmission system.

The DBS decoder 2116 receives a digitally encoded and forward error corrected signal from a dish antenna (not illustrated) which receives a DBS entertainment signal from a geosynchronous satellite (see FIG. 22). Hardwired cable is connected to the cable decoder 2118 which decodes and converts the cable entertainment channels to signals for viewing on the HDTV 2102 or a standard television (not illustrated). Standard broadcast television and stereo signals may be received by the VHF/UHF tuner 2114 and the base band signals made available to the HDTV 2102, stereo 2104 and the other recording devices (VCR 2106, DAT 2110). Similarly, recorded entertainment information may be played on the HDTV 2102 and stereo 2104 from the playback devices OAT 2110, Camcorder 2108, CD 2112, VCR 2106) for viewing and listening enjoyment by the user.

FIG. 22 is a schematic block diagram of an information and entertainment communications system according to the present invention. The information and entertainment communications system 2200 is comprised of the following systems: A HDTV ground station 2202 which transmits a digitally encoded and forward error corrected signal from the HDTV studio 2204 by microwave dish 2206 to a DBS satellite 2208. The satellite 2208 rebroadcasts the signal from the studio 2204 to a plurality of ground station dish antennas 2210 which are connected to corresponding HDTV receivers/decoders 2212 where the DBS satellite signal is processed and made available, for example, to the entertainment system 2100. The system 2200 is comprised of many SCM, MCM, BLP and box level subsystems which greatly benefit from the features, aspects and advantages of the present invention. Some of these subsystems are a digital audio and video formatting subsystem 2214 which convert the analog entertainment information into a digital format, and a digital compression and forward error connection subsystem 2216 which prepares the digitally encoded entertainment information for transmission by the ground station 2202 to the satellite 2208.

Figure 23:
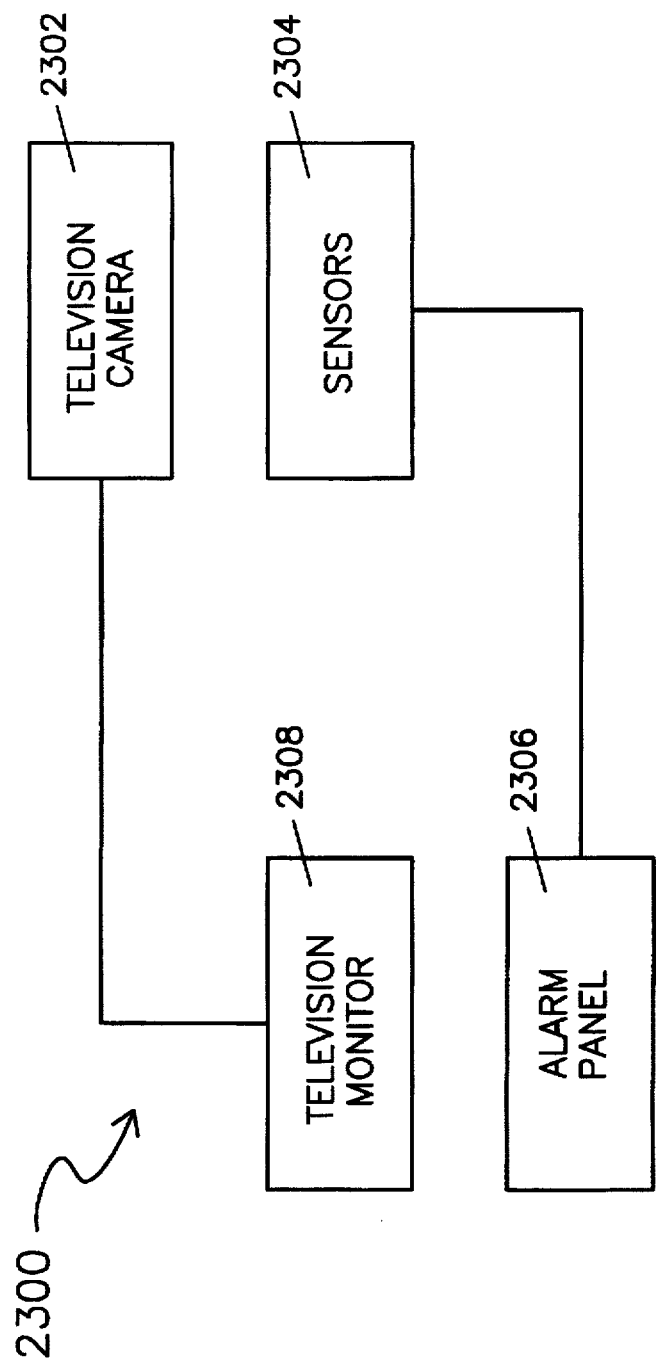
FIG. 23 is a schematic block diagram of a security and surveillance system.

FIG. 23 is a schematic block diagram of a security and surveillance system according to the present invention. The security and surveillance system 2300 is comprised of the following subsystems: A television camera 2302, intrusion detection sensors 2304, a sensor alarm panel 2306, and a television monitor 2308. The television monitor 2308 displays what the television camera(s) 2302 observe. The alarm panel 2306 displays the status of the sensors 2304 and will annunciate an alert upon a sensed alarm condition. The system 2300 may be utilized in homes, businesses, government building, military bases, prisons and any area requiring security and surveillance.

In addition, another embodiment of the security and surveillance system 2300 may be utilized to monitor operating conditions of transportation systems such as engine status, hull integrity, operating temperatures, maintenance evaluation and other parameters deemed necessary for the safe and efficient operation of the transportation systems (see FIG. 25). In a further embodiment of subsystems for the transportation systems, positioning and navigational (GPS) systems may be utilized for hazard avoidance, as well as radar and sonar (see FIG. 25). Further, operation of the transportation systems may be implemented by digital control, such as "fly-by-wire," along with the monitoring thereof. The system 2300 and its subsystems may be utilized with the other system embodiments disclosed herein and will greatly benefit from the features, aspects and advantages of invention as disclosed hereinabove.

Figure 24:
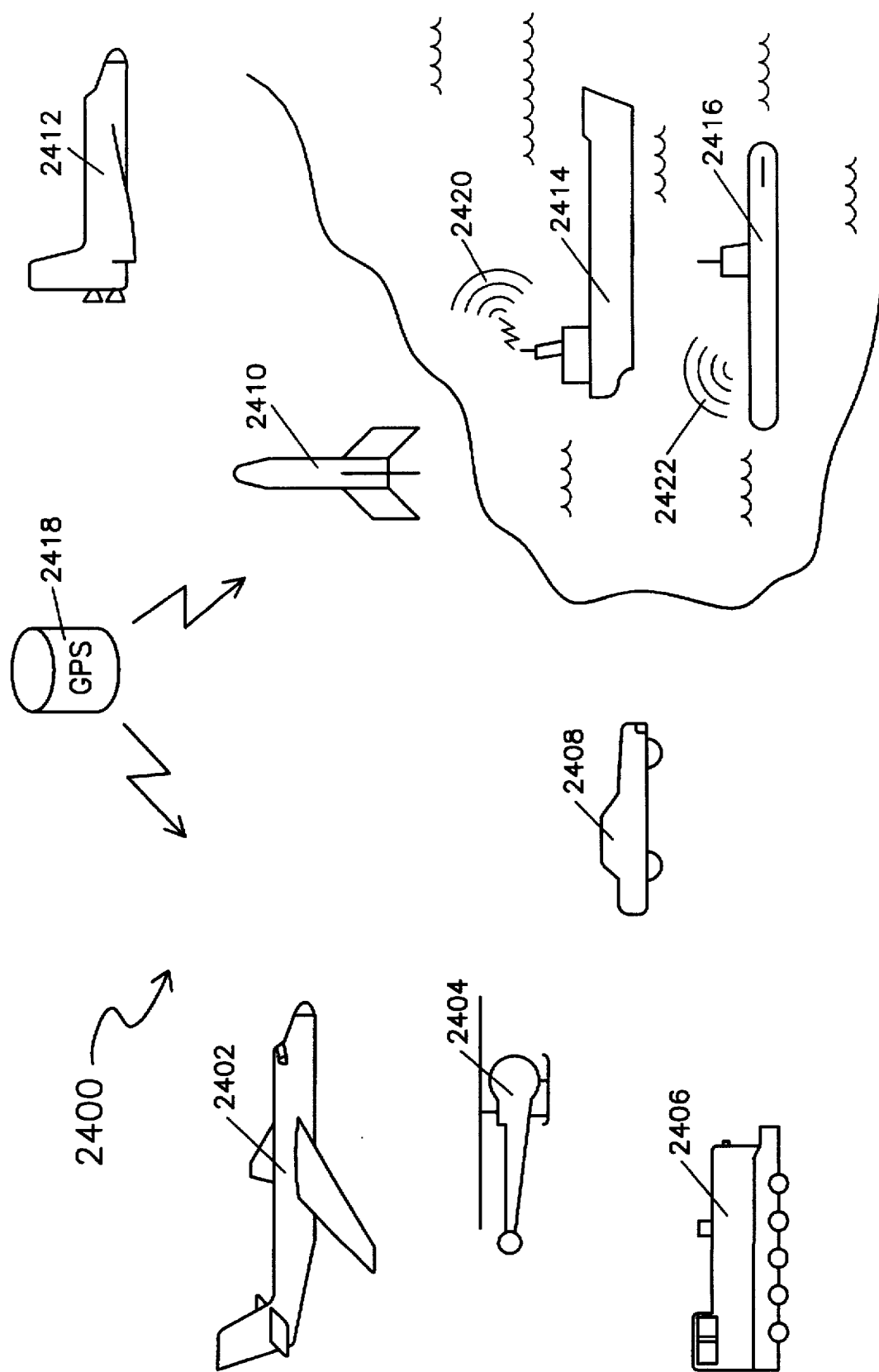
FIG. 24 is a schematic block diagram of a plurality of transportation systems.

FIG. 24 is a schematic block diagram of a plurality of transportation systems according to the present invention. The transportation systems, generally referenced to by the numeral 2400, may utilize, individually or in combination, the aforementioned systems to great advantage. Embodiments of the transportation system 2400 is as follows: An airplane 2402, a helicopter 2404, a train 2406, a vehicle 2408 such as an automobile or truck, a rocket 2410, a space shuttle 2412, a ship 2414, a submarine 2416, and the like. Each of the embodiments of the transportation systems 2400 contemplated herein may greatly benefit from the communications, navigation and control systems disclosed herein along with he features, aspects and advantages of the present invention.

Each of the embodiments of the transportation systems 2400 may utilize a positioning and navigation system which derives its position information from a global positioning satellite system (GPS) 2418. The positioning and navigation system is comprised of SCM, MCM, BLP and box level systems as discussed hereinabove. Radar 2420 and/or sonar 2422 systems may be utilized for collusion avoidance and location and may be incorporated with any of the transportation systems 2400.

FIG. 25 is a schematic block diagram of a plurality of communications and information transmission systems according to the present invention. The communications and information transmission systems 2500 may comprise, individually or in combination, a telephone exchange 2502, a PBX 2504, a voice mail system 2506, telephones 2508, a video teleconferencing system 2510, a video picture telephone 2512 and the like. The systems 2500 may also comprise a cellular telephone 2514, and a plurality of cell sites 2516 which may be connected with the telephone system 2502. Further, systems 2500 may be computers 2518 connected together through the internet system 2520. Both analog and digital communications are contemplated herein with the various features, advantages and aspects of the present invention.

Other MCM, SCM, mini-board, micro-board, board level and other system sub-assemblies are contemplated using the multi-layer substrate of the present invention. Additionally, such sub-assemblies or packages using such multi-layer substrate circuits may be used in traditional circuit boards or sub-assemblies for a system level product. Examples of electronic systems that may benefit from the system and method of the present invention have been mentioned above. The spirit and intent of the present invention is to utilize multi-layer conductive planes on a substrate for all electronic systems from a single semiconductor integrated circuit die to a complex multiple box electronic system.

The present invention, therefore, is well adapted to carry out the objects and attain the ends and advantages mentioned, as well as others inherent therein. While presently preferred embodiments of the invention and various aspects thereto have been given for purposes of disclosure, numerous changes in the details of construction, interconnection and arrangement of parts will readily suggest themselves to those skilled in the art and which are encompassed within the spirit of the invention and the scope of the appended claims.

While the present invention has been depicted, described, and is defined by reference to particularly preferred embodiments of the invention, such references do not imply a limitation on the invention, and no such limitation is to be inferred. The invention is capable of considerable modification, alternation, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

The present invention, therefore, is well adapted to carry out the objects and attain the ends and advantages mentioned, as well as others inherent therein. While presently preferred embodiments of the invention and various aspects thereto have been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. An electronic system, comprising:
   at least one semiconductor device assembly comprising;
      a first insulating layer having first and second substantially parallel surfaces, a first central opening adapted to receive a semiconductor die, a first outside perimeter, and at least one first intermediate opening between the first central opening and the first outside perimeter;
      a first conductive layer having a plurality of conductive traces disposed on the first surface of said first insulating layer, across the at least one first intermediate opening, extending within the first central opening and extending from the first outside perimeter of said first insulating layer,
      wherein each of the plurality of conductive traces of said first conductive layer has a proximate end in the first central opening and a distal end extending from the first outside perimeter of said first insulating layer;
      a second conductive layer disposed on the second surface of said first insulating layer and extending within the first central opening of said first insulating layer, said second conductive layer having portions covering the at least one first intermediate opening of said first insulating layer and having a plurality of second intermediate openings between the portions and substantially aligned with the at least one first intermediate opening;
      a second insulating layer having third and fourth substantially parallel surfaces, a second central opening adapted to receive the semiconductor die and smaller than the first central opening of said first insulating layer, a plurality of third intermediate openings substantially aligned with the plurality of second intermediate openings of said second conductive layer, and a second outside perimeter, said second insulating layer disposed on an opposite side of said second conductive layer from the first insulating layer;
      a third conductive layer disposed on a side of said second insulating layer opposite the second conductive layer, across the plurality of third intermediate openings and extending within the second central opening of said second insulating layer;
      a semiconductor die having a plurality of contact pads connected to electronic circuits within said die, the proximate ends of the plurality of conductive traces are connected to the contact pads of the semiconductor die within the first central opening of said first insulating layer;
      selected ones of the plurality of conductive traces connected to the contact pads of the semiconductor die are cut within the first central opening and are connected to said second conductive layer;
      said selected ones of the plurality of conductive traces connected to the distal ends of the plurality of conductive traces of said first conductive layer are cut within the at least one first intermediate opening and are connected to said second conductive layer;
      selected other ones of the plurality of conductive traces connected to the contact pads of the semiconductor die are cut within the second central opening and are connected to said third conductive layer; and
      said selected other ones of the plurality of conductive traces connected to the distal ends of the plurality of conductive traces of said first conductive layer are cut within the plurality of third intermediate openings and are connected to said third conductive layer,
      wherein said second and third conductive layers connect together all of the proximate and distal ends of said selected ones and said selected other ones, respectively, of the plurality of conductive traces of said first conductive layer.

2. An electronic system, comprising:
   at least one semiconductor device assembly comprising;
      a first insulating layer having first and second substantially parallel surfaces, a first central opening adapted to receive a semiconductor die, a first outside perimeter, at least one first intermediate opening biased toward the first outside perimeter, and at least one second intermediate opening biased toward the first central opening;
      a first conductive layer having a plurality of conductive traces disposed on the first surface of said first insulating layer, across the at least one first and second intermediate openings, extending within the first central opening and extending from the first outside perimeter of said first insulating layer,
      wherein each of the plurality of conductive traces of said first conductive layer has a proximate end in the first central opening and a distal end extending from the first outside perimeter of said first insulating layer;
      a second conductive layer disposed on the second surface of said first insulating layer, said second conductive layer covering the at least one second intermediate opening and having portions covering the at least one first intermediate opening of said first insulating layer, and said second conductive layer having a plurality of third intermediate openings between the portions and substantially aligned with the at least one first intermediate opening;
      a second insulating layer having third and fourth substantially parallel surfaces, a second central opening adapted to receive the semiconductor die and substantially aligned with the first central opening of said first insulating layer, a plurality of fourth intermediate openings substantially aligned with the plurality of third intermediate openings of said second conductive layer, and a second outside perimeter substantially aligned with the first outside perimeter, said second insulating layer disposed on an opposite side of said second conductive layer from the first insulating layer;

a third conductive layer disposed on a side of said second insulating layer opposite the second conductive layer, across the plurality of fourth intermediate openings and extending within the second central opening of said second insulating layer;

a semiconductor die having a plurality of contact pads connected to electronic circuits within said die, the proximate ends of the plurality of conductive traces are connected to the contact pads of the semiconductor die within the first central opening of said first insulating layer;

selected ones of the plurality of conductive traces connected to the contact pads of the semiconductor die are cut within the at least one second intermediate opening and are connected to said second conductive layer;

said selected ones of the plurality of conductive traces connected to the distal ends of the plurality of conductive traces of said first conductive layer are cut within the at least one first intermediate opening and are connected to said second conductive layer;

selected other ones of the plurality of conductive traces connected to the contact pads of the semiconductor die are cut within the second central opening and are connected to said third conductive layer; and said selected other ones of the plurality of conductive traces connected to the distal ends of the plurality of conductive traces of said first conductive layer are cut within the plurality of fourth intermediate openings and are connected to said third conductive layer, wherein said second and third conductive layers connect together all of the proximate and distal ends of said selected ones and said selected other ones, respectively, of the plurality of conductive traces of said first conductive layer.

3. The system of claim 2, wherein the selected ones and selected other ones of the plurality of conductive traces are connected to and terminate at unselected traces so that there are no selected ones and selected other ones of the plurality of conductive traces on the first surface of said first insulating layer substantially between the first central opening and the at least one intermediate opening.

4. The system of claim 2, further comprising:
the selected ones and selected other ones of the plurality of conductive traces are cut and both cut ends are urged into the at least one intermediate opening; and
encapsulant is placed into the at least one intermediate opening and substantially covers both cut ends.

5. The system of claim 2, wherein the at least one first intermediate opening is an elongated slot having a length greater than its width.

6. The system of claim 2, wherein the at least one second intermediate opening is an elongated slot having a length greater than its width.

7. An electronic system, comprising:
at least one semiconductor device assembly comprising;
a first insulating layer having first and second substantially parallel surfaces, a first central opening adapted to receive a semiconductor die, a first outside perimeter, at least one first intermediate opening biased toward the first outside perimeter, and at least one second intermediate opening biased toward the first central opening;

a first conductive layer having a plurality of conductive traces disposed on the first surface of said first insulating layer, across the at least one first and second intermediate openings, extending within the first central opening and extending from the first outside perimeter of said first insulating layer, wherein each of the plurality of conductive traces of said first conductive layer has a proximate end in the first central opening and a distal end extending from the first outside perimeter of said first insulating layer;

a second conductive layer disposed on the second surface of said first insulating layer, said second conductive layer covering the at least one second intermediate opening and having portions covering the at least one first intermediate opening of said first insulating layer, and said second conductive layer having a plurality of third intermediate openings between the portions and substantially aligned with the at least one first intermediate opening;

a third conductive layer substantially aligned with and attached to said second conductive layer by an insulating adhesive disposed therebetween, said third conductive layer covering the plurality of third intermediate openings and extending within the second central opening of said second insulating layer;

a semiconductor die having a plurality of contact pads connected to electronic circuits within said die, the proximate ends of the plurality of conductive traces are connected to the contact pads of the semiconductor die within the first central opening of said first insulating layer;

selected ones of the plurality of conductive traces connected to the contact pads of the semiconductor die are cut within the at least one second intermediate opening and are connected to said second conductive layer;

said selected ones of the plurality of conductive traces connected to the distal ends of the plurality of conductive traces of said first conductive layer are cut within the at least one first intermediate opening and are connected to said second conductive layer;

selected other ones of the plurality of conductive traces connected to the contact pads of the semiconductor die are cut within the second central opening and are connected to said third conductive layer; and said selected other ones of the plurality of conductive traces connected to the distal ends of the plurality of conductive traces of said first conductive layer are cut within the plurality of third intermediate openings and are connected to said third conductive layer, wherein said second and third conductive layers connect together all of the proximate and distal ends of said selected ones and said selected other ones, respectively, of the plurality of conductive traces of said first conductive layer.

8. An electronic system, comprising:
at least one semiconductor device mounted on a multi-layered tape automated bonding assembly, comprising;
a first insulating layer having first and second substantially parallel surfaces, a first central opening adapted to receive a semiconductor die, a first outside perimeter, at least one first intermediate opening biased toward the first outside perimeter, and at least one second intermediate opening biased toward the first central opening;

a first conductive layer having a plurality of conductive traces disposed on the first surface of said first insulating layer, across the at least one first and second intermediate openings, extending within the first central opening and extending from the first outside perimeter of said first insulating layer, wherein each of the plurality of conductive traces of said first conductive layer has a proximate end adapted for connection to a contact pad of a semiconductor die in the first central opening, and a distal end adapted for connection to external circuits proximate the first outside perimeter of said first insulating layer;

a second conductive layer disposed on the second surface of said first insulating layer, said second conductive layer covering the at least one second intermediate opening and having portions covering the at least one first intermediate opening of said first insulating layer, and said second conductive layer having a plurality of third intermediate openings between the portions and substantially aligned with the at least one first intermediate opening;

a second insulating layer having third and fourth substantially parallel surfaces, a second central opening adapted to receive the semiconductor die and substantially aligned with the first central opening of said first insulating layer, a plurality of fourth intermediate openings substantially aligned with the plurality of third intermediate openings of said second conductive layer, and a second outside perimeter substantially aligned with the first outside perimeter, said second insulating layer disposed on an opposite side of said second conductive layer from the first insulating layer;

a third conductive layer disposed on a side of said second insulating layer opposite the second conductive layer, across the plurality of fourth intermediate openings and extending within the second central opening of said second insulating layer;

selected ones connected to the proximate ends of the plurality of conductive traces of said first conductive layer are adapted to be cut and urged within the at least one second intermediate opening and connected to said second conductive layer;

said selected ones connected to the distal ends of the plurality of conductive traces of said first conductive layer are adapted to be cut and urged into the at least one intermediate opening and connected to said second conductive layer;

selected other ones connected to the proximate ends of the plurality of conductive traces of said first conductive layer are adapted to be cut and urged into the second central opening and connected to said third conductive layer; and said selected other ones connected to the distal ends of the plurality of conductive traces of said first conductive layer are adapted to be cut and urged into the plurality of fourth intermediate openings for connection to said third conductive layer.

9. An electronic system, comprising:

at least one semiconductor device assembly, comprising;

a first insulating layer having first and second substantially parallel surfaces, a first central opening adapted to receive a semiconductor die, a first outside perimeter, at least one first intermediate opening biased toward the first outside perimeter, and at least one second intermediate opening biased toward the first central opening, the at least one first intermediate opening having a first side proximate the first outside perimeter and a second side having alternating portions that are first and second distances from the first side, wherein the second distance being greater than the first distance;

a first conductive layer having a plurality of conductive traces disposed on the first surface of said first insulating layer, across the at least one first and second intermediate openings, extending within the first central opening and from the first outside perimeter of said first insulating layer, wherein each of the plurality of conductive traces of said first conductive layer has a proximate end in the first central opening and a distal end extending from the first outside perimeter of said first insulating layer;

a second conductive layer disposed on the second surface of said first insulating layer, said second conductive layer covering the at least one second intermediate opening, said second conductive layer having at least one third intermediate opening substantially aligned with the first side and the first distance second side of the at least one first intermediate opening, wherein portions of said second conductive layer are exposed in the second distance second side of the at least one first intermediate opening;

a second insulating layer having third and fourth substantially parallel surfaces, a second central opening adapted to receive the semiconductor die and substantially aligned with the first central opening of said first insulating layer, at least one fourth intermediate opening substantially aligned with the at least one third intermediate opening of said second conductive layer, and a second outside perimeter, said second insulating layer disposed on an opposite side of said second conductive layer from the first insulating layer;

a third conductive layer disposed on a side of said second insulating layer opposite the second conductive layer, across the at least one fourth intermediate opening of the second insulating layer and extending within the second central opening of said second insulating layer;

a semiconductor die having a plurality of contact pads connected to electronic circuits within said die, the proximate ends of the plurality of conductive traces are connected to the contact pads of the semiconductor die within the first central opening of said first insulating layer;

selected ones of the plurality of conductive traces connected to the contact pads of the semiconductor die are cut within the at least one second intermediate opening and are connected to said second conductive layer;

said selected ones of the plurality of conductive traces connected to the distal ends of the plurality of conductive traces of said first conductive layer are cut within the at least one first intermediate opening and are connected to said second conductive layer;

selected other ones of the plurality of conductive traces connected to the contact pads of the semiconductor die are cut within the second central opening and are connected to said third conductive layer; and said selected other ones of the plurality of conductive traces connected to the distal ends of the plurality of conductive traces of said first conductive layer are cut within the at least one fourth intermediate opening and are connected to said third conductive layer, wherein said second and third conductive layers connect together all of the proximate and distal ends of said selected ones and said selected other ones, respectively, of the plurality of conductive traces of said first conductive layer.

10. An electronic system, comprising:

at least one semiconductor device mounted on a multi-layered tape automated bonding assembly, comprising;

a first insulating layer having first and second substantially parallel surfaces, a first central opening adapted to receive a semiconductor die, a first outside perimeter, at least one first intermediate opening biased toward the first outside perimeter, and at least one second intermediate opening biased toward the first central opening, the at least one first intermediate opening having a first side proximate the first outside perimeter and a second side having alternating portions that are first and second distances from the first side, wherein the second distance being greater than the first distance;

a first conductive layer having a plurality of conductive traces disposed on the first surface of said first insulating layer, across the at least one first and second intermediate openings, extending within the first central opening and from the first outside perimeter of said first insulating layer, wherein each of the plurality of conductive traces of said first conductive layer has a proximate end adapted for connection to a contact pad of a semiconductor die in the first central opening and a distal end adapted for connection to external circuits proximate the first outside perimeter of said first insulating layer;

a second conductive layer disposed on the second surface of said first insulating layer, said second conductive layer covering the at least one second intermediate opening, said second conductive layer having at least one third intermediate opening substantially aligned with the first side and the first distance second side of the at least one first intermediate opening, wherein portions of said second conductive layer are exposed in the second distance second side of the at least one first intermediate opening;

a second insulating layer having third and fourth substantially parallel surfaces, a second central opening adapted to receive the semiconductor die and substantially aligned with the first central opening of said first insulating layer, at least one fourth intermediate opening substantially aligned with the at least one third intermediate opening of said second conductive layer, and a second outside perimeter, said second insulating layer disposed on an opposite side of said second conductive layer from the first insulating layer;

a third conductive layer disposed on a side of said second insulating layer opposite the second conductive layer, across the at least one fourth intermediate opening of the second insulating layer and extending within the second central opening of said second insulating layer;

selected ones connected to the proximate ends of the plurality of conductive traces are adapted to be cut and urged into the at least one second intermediate opening and connected to said second conductive layer;

said selected ones connected to the distal ends of the plurality of conductive traces of said first conductive layer are adapted to be cut and urged into the at least one first intermediate opening and connected to said second conductive layer;

selected other ones connected to the proximate ends of the plurality of conductive traces are adapted to be cut and urged into the second central opening and connected to said third conductive layer; and said selected other ones connected to the distal ends of the plurality of conductive traces of said first conductive layer are adapted to be cut and urged into the at least one fourth intermediate opening and connected to said third conductive layer.

11. An electronic system, comprising:

at least one tape ball grid array (TBGA) semiconductor device package assembly, comprising;

a multi-layered tape automated bonding (TAB) film having a central opening for a semiconductor device, conductive circuit traces on a first layer of the TAB film, a conductive plane on a second layer of the TAB film, solder ball pads connected to the circuit traces, and at least one elongated opening for downbonding selected conductive circuit traces to the conductive plane;

a semiconductor device in the central opening and connected to the circuit traces; and solder balls arranged in a grid array on the solder ball pads and adapted for connecting the semiconductor device to external circuits.

12. The system of claim 11, wherein the at least one elongated opening is between the central opening and the solder ball grid array.

13. The system of claim 11, wherein the at least one elongated opening is between rows of the solder ball grid array.

14. The semiconductor device package assembly of claim 11, wherein the at least one elongated opening replaces part of a row of the solder ball grid array.

15. An electronic system, comprising:

at least one tape ball grid array (TBGA) semiconductor device package assembly, comprising;

a tape automated bonding (TAB) film having a central opening for a semiconductor device and an outer perimeter, said TAB film having conductive circuit traces disposed on a first surface of an insulating layer, and solder ball pads disposed on the first surface of the insulating layer and connected to the circuit traces; and a conductive plane attached to a second surface of the insulating layer opposite the conductive circuit traces, said conductive plane extending past the outer perimeter of said TAB film for downbonding selected circuit traces thereto;

a semiconductor device in the central opening and connected to the circuit traces;

solder balls arranged in a grid array on the solder ball pads and adapted for connecting the semiconductor device to external circuits.

16. The system of claim 15, further comprising a raised rim around said conductive plane wherein a space is formed between the perimeter of said TAB film and the raised rim of said conductive plane so that encapsulant may be contained within the space after the selected circuit traces are downbonded to said conductive plane.

17. An electronic system, comprising:
   at least one tape ball grid array (TBGA) semiconductor device assembly, comprising;
      a tape automated bonding (TAB) tape having solder ball pads;
      a layer of patterned photoimageable solder resist over the solder ball pads, the solder resist having openings over the underlying pad, thereby exposing only a desired surface in the patterned resist openings;
      a layer of plating over the exposed surfaces of the solder ball pads; and
      solder balls electro-mechanically connected to the plated exposed surfaces of the solder pads.

18. The system of claim 2, wherein the electronic system is a single chip module.

19. The system of claim 2, wherein the electronic system is a multi-chip module having at least one semiconductor device.

20. The system of claim 2, wherein the electronic system is a board level product having a plurality of semiconductor devices on at least one printed wiring board.

21. The system of claim 2, wherein the electronic system is a box level system having a plurality of semiconductor devices on at least one printed wiring board mounted into a box with a power source.

22. The system of claim 2, wherein the electronic system is a computer system.

23. The system of claim 2, wherein the electronic system is an information and entertainment transmission system.

24. The system of claim 2, wherein the electronic system is an entertainment system.

25. The system of claim 2, wherein the electronic system is a security and surveillance system.

26. The system of claim 2, wherein the electronic system is an information, data acquisition and control system.

27. The system of claim 2, wherein the electronic system is utilized in a transportation system.

* * * * *